US012684872B2

(12) United States Patent
Matsuzaki et al.

(10) Patent No.: US 12,684,872 B2
(45) Date of Patent: Jul. 14, 2026

(54) SEMICONDUCTOR DEVICE

(71) Applicant: Semiconductor Energy Laboratory Co., Ltd., Atsugi (JP)

(72) Inventors: Takanori Matsuzaki, Atsugi (JP); Tatsuya Onuki, Atsugi (JP); Munehiro Kozuma, Atsugi (JP); Takeshi Aoki, Ebina (JP); Yuki Okamoto, Ebina (JP); Takayuki Ikeda, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 592 days.

(21) Appl. No.: 18/016,880

(22) PCT Filed: Jul. 26, 2021

(86) PCT No.: PCT/IB2021/056692
§ 371 (c)(1),
(2) Date: Jan. 19, 2023

(87) PCT Pub. No.: WO2022/029541
PCT Pub. Date: Feb. 10, 2022

(65) Prior Publication Data
US 2023/0352477 A1 Nov. 2, 2023

(30) Foreign Application Priority Data
Aug. 3, 2020 (JP) ................................. 2020-131673

(51) Int. Cl.
*H10D 88/00* (2025.01)
*G06F 7/544* (2006.01)
(Continued)

(52) U.S. Cl.
CPC ........... *H10D 88/00* (2025.01); *G06F 7/5443* (2013.01); *G06N 3/065* (2023.01);
(Continued)

(58) Field of Classification Search
CPC ........ G06F 7/5443; G06F 12/00; G06F 7/544; G06N 3/065; G06N 3/0464; G06N 3/063;
(Continued)

(56) References Cited

U.S. PATENT DOCUMENTS 5,165,009 A 11/1992 Watanabe et al.
5,426,757 A 6/1995 Watanabe et al.
(Continued)

FOREIGN PATENT DOCUMENTS

EP 0438800 A 7/1991
JP 03-250244 A 11/1991
(Continued)

OTHER PUBLICATIONS

International Search Report (Application No. PCT/IB2021/056692) Dated Sep. 21, 2021.
(Continued)

*Primary Examiner* — Britt Hanley
*Assistant Examiner* — Jason James Greaving
(74) *Attorney, Agent, or Firm* — Eric J. Robinson; Robinson Intellectual Property Law Office, P.C.

(57) ABSTRACT

A semiconductor device with a novel structure is provided. The semiconductor device includes a digital calculator, an analog calculator, a first memory circuit, and a second memory circuit. The analog calculator, the first memory circuit, and the second memory circuit each include a transistor including an oxide semiconductor in a channel formation region. The first memory circuit has a function of supplying first weight data to the digital calculator as digital data. The digital calculator has a function of performing product-sum operation using the first weight data. The second memory circuit has a function of supplying second weight data to the analog calculator as analog data. The analog calculator has a function of performing product-sum
(Continued)

100 operation using the second weight data. The amount of current flowing between a source and a drain of at least one of the transistors each including the oxide semiconductor in the channel formation region in the analog calculator and the second memory circuit is the amount of current flowing when the transistor operates in a subthreshold region.

7 Claims, 29 Drawing Sheets

(51) Int. Cl.
   *G06N 3/065*     (2023.01)
   *H10D 30/67*     (2025.01)
   *H10D 84/85*     (2025.01)

(52) U.S. Cl.
   CPC ..... *H10D 30/6713* (2025.01); *H10D 30/6755* (2025.01); *H10D 30/6757* (2025.01); *H10D 84/853* (2025.01)

(58) Field of Classification Search
   CPC . G06J 1/005; G06J 1/00; H10D 88/00; H10D 30/6755; H10D 30/6757; H10D 84/853; H10D 30/6733; H10B 12/00
   See application file for complete search history.

(56)              References Cited

U.S. PATENT DOCUMENTS

| 5,594,916 | A | 1/1997 | Watanabe et al. |
| 5,875,347 | A | 2/1999 | Watanabe et al. |
| 6,100,741 | A | 8/2000 | Ogawa et al. |
| 6,205,556 | B1 | 3/2001 | Watanabe et al. |
| 7,043,466 | B2 | 5/2006 | Watanabe et al. |
| 9,842,842 | B2 | 12/2017 | Kato |
| 10,332,594 | B2 | 6/2019 | Miyashita et al. |
| 11,195,866 | B2 | 12/2021 | Ikeda |
| 11,996,423 | B2 | 5/2024 | Ikeda |
| 2019/0088339 | A1 | 3/2019 | Miyashita et al. |
| 2020/0091214 | A1* | 3/2020 | Ikeda ..................... G06N 3/065 |
| 2022/0180158 | A1* | 6/2022 | Whatmough .......... G06N 3/065 |
| 2022/0237440 | A1* | 7/2022 | Kimura ............. H10D 30/6755 |
| 2023/0055062 | A1 | 2/2023 | Okamoto et al. |

FOREIGN PATENT DOCUMENTS

| JP | 11-025201 | A | 1/1999 |
| JP | 2015-195076 | A | 11/2015 |
| JP | 2018-129046 | A | 8/2018 |
| JP | 2018-133016 | A | 8/2018 |
| JP | 2019-036280 | A | 3/2019 |
| JP | 2019-057053 | A | 4/2019 |
| WO | WO-2018/224910 | | 12/2018 |
| WO | WO-2019/078924 | | 4/2019 |
| WO | WO-2021/165779 | | 8/2021 |

OTHER PUBLICATIONS

Written Opinion (Application No. PCT/IB2021/056692) Dated Sep. 21, 2021.

\* cited by examiner

$W_{SEL}$

8

$A_{IN}$   8    ⊗    16    ⊕ $17+\alpha$      $17+\alpha$ → MAC 24      25 reset_B

26

CLK

$W_{SEL}$

1

$A_{IN}$   1    ⊗    1    ⊕ $2+\alpha$      $2+\alpha$ → MAC 24      25 reset_B

26

CLK

FIG. 11A
21A
FIG. 11B
21B
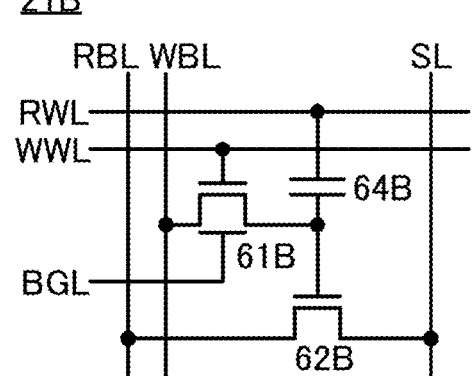
FIG. 11C
21C
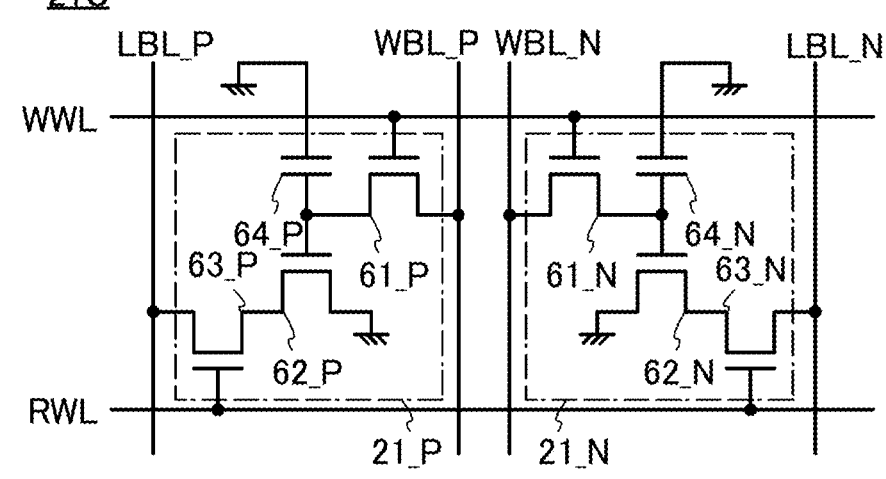

FIG. 26A
Intermediate state
New crystalline phase
| Amorphous | Crystalline | Crystal |
|---|---|---|
| • completely amorphous | • CAAC<br>• nc<br>• CAC<br><br>excluding single crystal and poly crystal | • single crystal<br>• poly crystal |
FIG. 26B
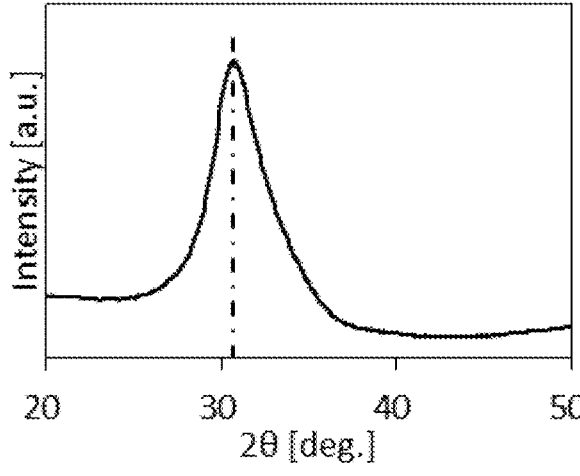
FIG. 26C
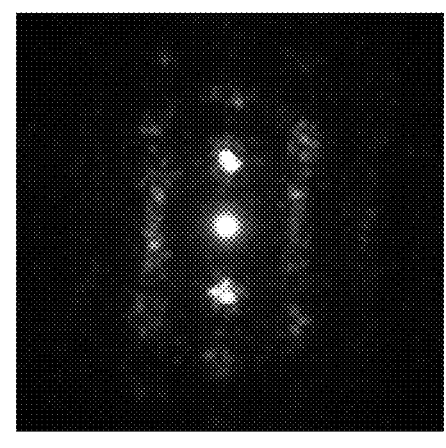
5nm⁻¹

FIG. 27A
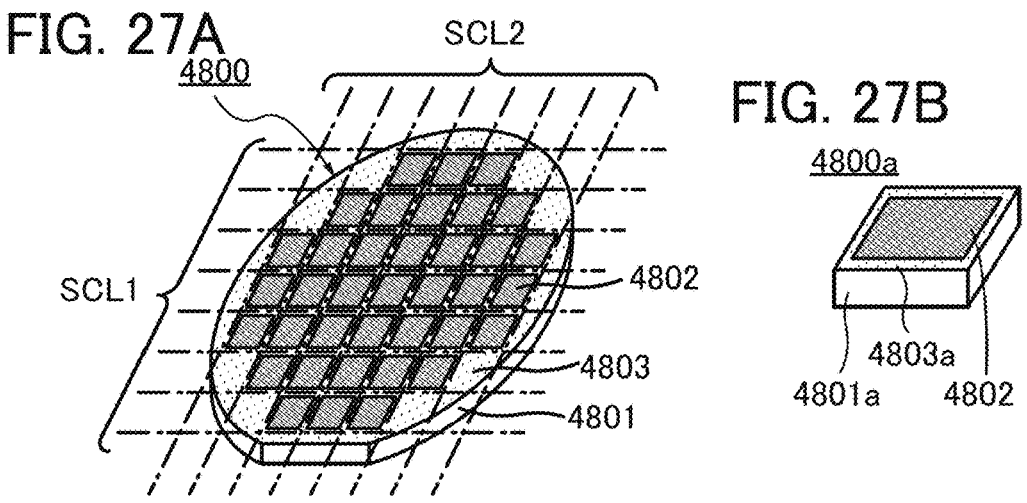
FIG. 27B
FIG. 27C
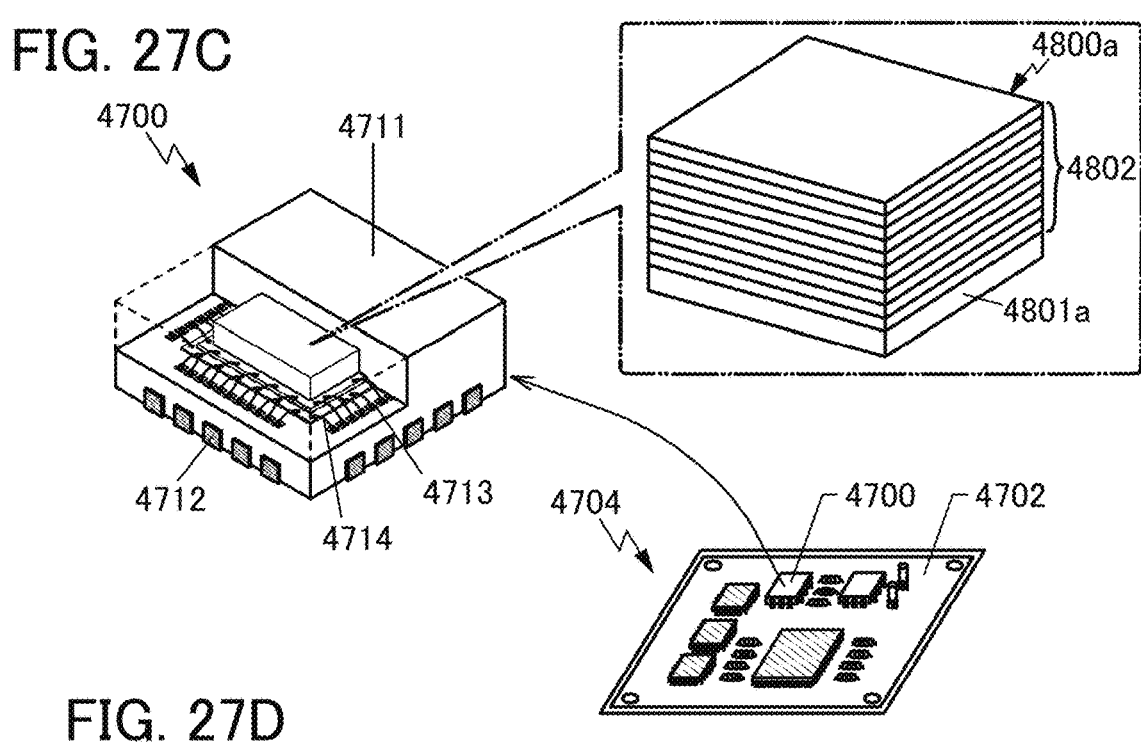
FIG. 27D
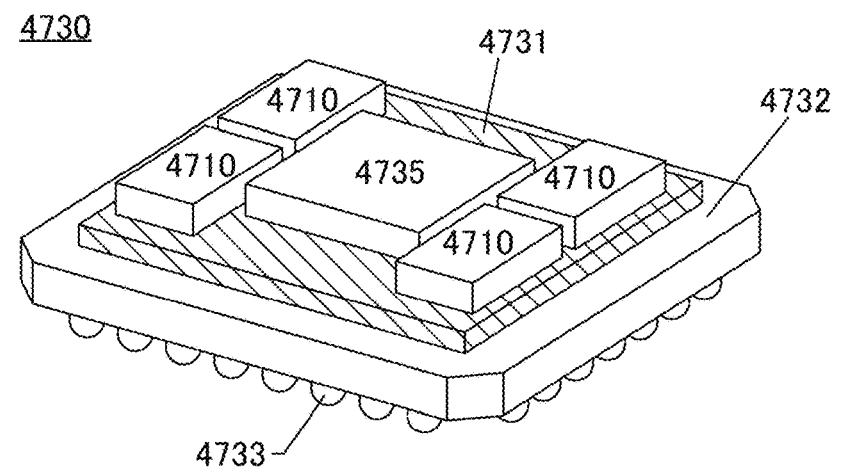

6100

6103   6106   6105
6104
6102   6101

5675A
5680
5675B
5670
5650   5600

6433
6435
6434
6432
6431

SEMICONDUCTOR DEVICE

TECHNICAL FIELD

In this specification, a semiconductor device and the like will be described.

Note that one embodiment of the present invention is not limited to the above technical field. Examples of the technical field of one embodiment of the present invention disclosed in this specification and the like include a semiconductor device, an imaging device, a display device, a light-emitting device, a power storage device, a storage device, a display system, an electronic device, a lighting device, an input device, an input/output device, a driving method thereof, and a manufacturing method thereof.

BACKGROUND ART

Electronic devices each including a semiconductor device including a CPU (Central Processing Unit) or the like have been widely used. In such electronic devices, techniques for improving the performance of the semiconductor devices have been actively developed to process a large volume of data at high speed. As a technique for achieving high performance, what is called an SoC (System on Chip) is given in which an accelerator such as a GPU (Graphics Processing Unit) and a CPU are tightly coupled. In the semiconductor device having higher performance by adopting an SoC, heat generation and an increase in power consumption become problems.

AI (Artificial Intelligence) technology requires a large amount of calculation and a large number of parameters and thus the amount of arithmetic operation is increased. An increase in the amount of arithmetic operation causes heat generation and an increase in power consumption. Thus, architectures for reducing the amount of arithmetic operation have been actively proposed. Typical architectures are Binary Neural Network (BNN) and Ternary Neural Network (TNN), which are effective especially in reducing circuit scale and power consumption (see Patent Document 1, for example).

REFERENCE

Patent Document

[Patent Document 1] PCT International Publication No. 2019/078924

SUMMARY OF THE INVENTION

Problems to be Solved by the Invention

In arithmetic operation in AI technology, product-sum operation using weight data and input data is repeated an enormous number of times; therefore, arithmetic processing needs to be performed at higher speed. Larger amounts of weight data and intermediate data need to be retained in a memory cell array. From the memory cell array retaining large amounts of weight data and intermediate data, the weight data and the intermediate data are read out to an arithmetic circuit through a bit line. Since the weight data and the intermediate data are read out at high frequency, a band width between the memory cell array and the arithmetic circuit might limit the operation speed.

When the number of parallel wirings between the memory cell array and the arithmetic circuit is increased, the memory cell array and the arithmetic circuit can be connected with a high band width, which is advantageous to increase the arithmetic processing speed. However, this results in an increase in the number of wirings between the arithmetic circuit and the memory cell array; therefore, the area of a peripheral circuit might be increased greatly.

In the arithmetic operation in the AI technology, how to reduce charge and discharge energy of bit lines is important to reduce power consumption.

To reduce charge and discharge energy of a bit line, it is effective to shorten the bit line. However, arithmetic circuits and memory cell arrays are alternately arranged, and thus the area of the peripheral circuits might increase greatly. There is a technology of integrating transistors in the vertical direction with the use of a bonding technology or the like, which is for the purpose of shortening bit lines. However, intervals between connection portions for electrical connection are large in the case of a bonding technology; therefore, there is a possibility that the parasitic capacitance and the like increase conversely, and charge and discharge energy is not reduced.

An object of one embodiment of the present invention is to provide a semiconductor device with low power consumption. Another object of one embodiment of the present invention is to provide a semiconductor device with improved arithmetic processing speed. An object of one embodiment of the present invention is to provide a semiconductor device with improved calculation accuracy. Another object of one embodiment of the present invention is to provide a small semiconductor device. Another object is to provide a semiconductor device with a novel structure.

One embodiment of the present invention does not necessarily achieve all the above objects and only needs to achieve at least one of the objects. The descriptions of the above objects do not preclude the existence of other objects. Objects other than these objects will be apparent from the descriptions of the specification, the claims, the drawings, and the like, and objects other than these objects can be derived from the descriptions of the specification, the claims, the drawings, and the like.

Means for Solving the Problems

One embodiment of the present invention is a semiconductor device including a digital calculator, an analog calculator, a first memory circuit, and a second memory circuit. The analog calculator, the first memory circuit, and the second memory circuit each include a transistor including an oxide semiconductor in a channel formation region. The first memory circuit has a function of supplying first weight data as digital data to the digital calculator. The digital calculator has a function of performing product-sum operation using the first weight data. The second memory circuit has a function of supplying second weight data as analog data to the analog calculator. The analog calculator has a function of performing product-sum operation using the second weight data. The amount of current flowing between a source and a drain of at least one of the transistors each including the oxide semiconductor in the channel formation region in the analog calculator and the second memory circuit is the amount of current flowing when the transistor operates in a subthreshold region.

In the above, a structure may be employed in which the digital calculator is brought into a non-operation state during operation of the analog calculator, and the analog calculator is brought into a non-operation state during operation of the digital calculator.

In the above, the digital calculator preferably performs convolutional operation. In the above, the analog calculator preferably performs fully connected operation.

In the above, the digital calculator preferably includes a transistor containing silicon in a channel formation region. In the above, the digital calculator is preferably provided in a first layer, the analog calculator, the first memory circuit, and the second memory circuit are preferably provided in a second layer, and the second layer is preferably provided over the first layer. In the above, the first memory circuit is preferably provided to overlap with the digital calculator.

Note that other embodiments of the present invention will be shown in the description of the following embodiments and the drawings.

Effect of the Invention

One embodiment of the present invention can provide a semiconductor device with low power consumption. Another embodiment of the present invention can provide a semiconductor device with improved arithmetic processing speed. Another embodiment of the present invention can provide a semiconductor device with improved calculation accuracy. Another object of one embodiment of the present invention can provide a small semiconductor device. A semiconductor device with a novel structure can be provided.

The description of a plurality of effects does not disturb the existence of other effects. In addition, one embodiment of the present invention does not necessarily achieve all the effects described as examples. In one embodiment of the present invention, other objects, effects, and novel features are apparent from the description of this specification and the drawings.

BRIEF DESCRIPTION OF THE DRAWINGS

FIG. 5A and FIG. 5B are diagrams illustrating a structure example of a semiconductor device.

FIG. 9A and FIG. 9B are diagrams illustrating a structure example of a semiconductor device.

FIG. 11A, FIG. 11B, and FIG. 11C are diagrams illustrating structure examples of semiconductor devices.

FIG. 26A is a diagram showing classification of crystal structures of IGZO, FIG. 26B is a diagram showing an XRD spectrum of crystalline IGZO, and FIG. 26C is a diagram showing a nanobeam electron diffraction pattern of the crystalline IGZO.

FIG. 27A is a perspective view illustrating an example of a semiconductor wafer, FIG. 27B is a perspective view illustrating an example of a chip, and FIG. 27C and FIG. 27D are perspective views illustrating examples of electronic components.

MODE FOR CARRYING OUT THE INVENTION

Figure 1A:
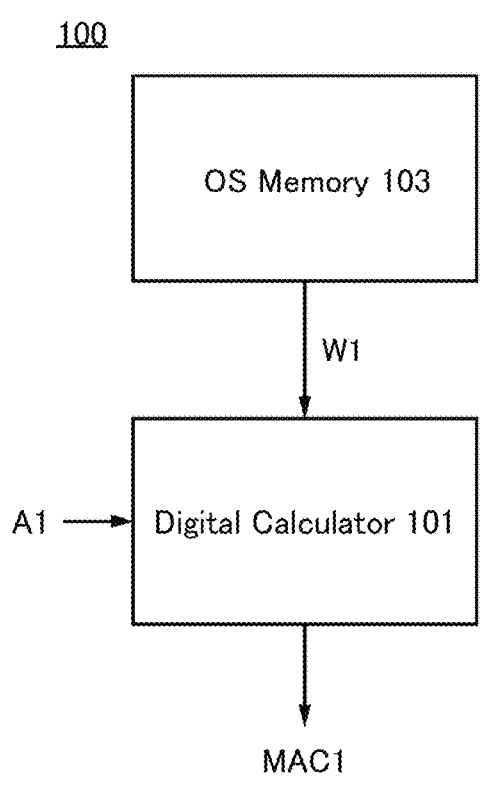
FIG. 1A and FIG. 1B are diagrams illustrating a structure example of a semiconductor device.
Figure 1A:
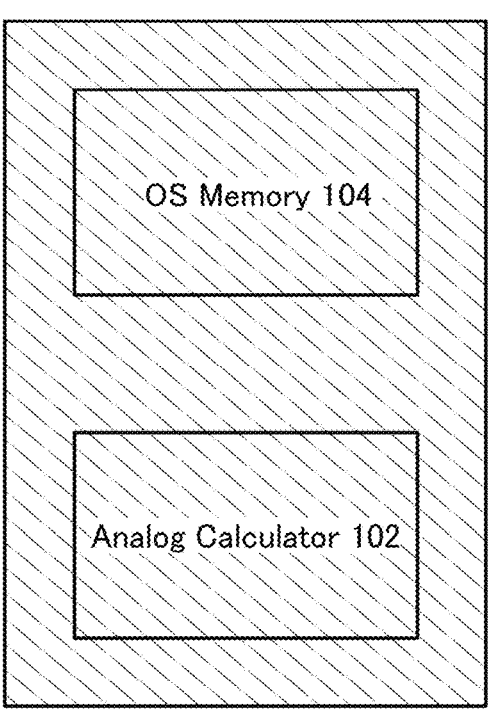

Embodiments of the present invention will be described below. Note that one embodiment of the present invention is not limited to the following description, and it will be readily understood by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first", "second", and "third" in this specification and the like are used in order to avoid confusion among components. Thus, the terms do not limit the number of components. Furthermore, the terms do not limit the order of components. In this specification and the like, for example, a "first" component in one embodiment can be referred to as a "second" component in other embodiments or claims. For another example, a "first" component in one embodiment in this specification and the like can be omitted in other embodiments or claims.

The same components, components having similar functions, components made of the same material, components formed at the same time, and the like in the drawings are denoted by the same reference numerals, and repeated description thereof is skipped in some cases.

In this specification, for example, a power supply potential VDD may be abbreviated to a potential VDD, VDD, or the like. The same applies to other components (e.g., a signal, a voltage, a circuit, an element, an electrode, and a wiring).

In the case where a plurality of components are denoted by the same reference numerals, and, particularly when they need to be distinguished from each other, an identification sign such as "_1", "_2", "[n]", or "[m,n]" is sometimes added to the reference numerals. For example, a second wiring GL is referred to as a wiring GL[2].

Embodiment 1

The structure, operation, and the like of a semiconductor device of one embodiment of the present invention will be described.

In this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. It can be sometimes said that a display device (a liquid crystal display device, a light-emitting display device, and the like), a projection device, a lighting device, an electro-optical device, a power storage device, a storage device, a semiconductor circuit, an imaging device, an electronic device, and the like include a semiconductor device.

Figure 1B:
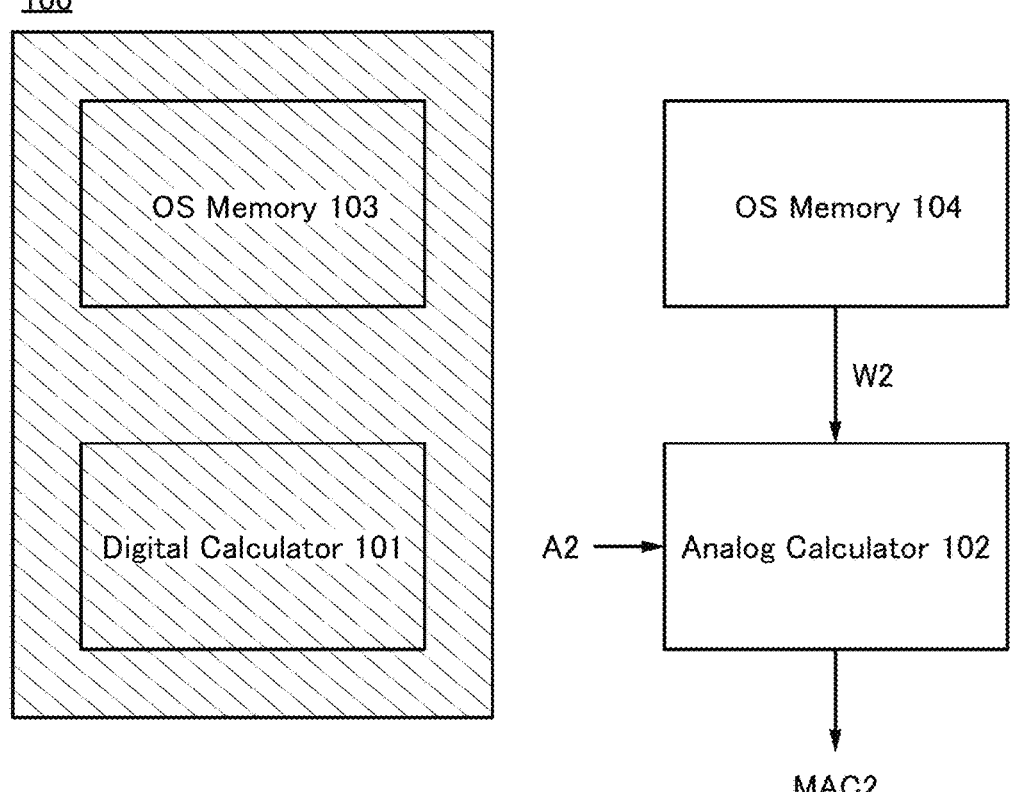

FIG. 1A and FIG. 1B are diagrams illustrating a semiconductor device 100 of one embodiment of the present invention.

The semiconductor device 100 includes a digital calculator 101, an analog calculator 102, an oxide semiconductor memory (OS Memory) 103, and an oxide semiconductor memory (OS Memory) 104. The digital calculator 101 preferably includes transistors containing silicon in their channel formation regions (Si transistors). The analog calculator 102 preferably includes transistors including an oxide semiconductor in their channel formation regions (OS transistors). The oxide semiconductor memory 103 and the oxide semiconductor memory 104 include OS transistors.

The semiconductor device 100 functions as an accelerator capable of performing product-sum operation and can select the digital calculator 101 and the analog calculator 102 depending on the kind of arithmetic operation. FIG. 1A illustrates a state where the digital calculator 101 is operated, and FIG. 1B illustrates a state where the analog calculator 102 is operated. Note that as illustrated in FIG. 1A, the analog calculator 102 is in a non-operation state during the operation of the digital calculator 101. As illustrated in FIG. 1B, the digital calculator 101 is in a non-operation state during the operation of the analog calculator 102.

As illustrated in FIG. 1A, the digital calculator 101 performs product-sum operation using weight data W1 input from the oxide semiconductor memory 103 and input data A1, and outputs the result as output data MAC1. The weight data W1 output from the oxide semiconductor memory 103 is output as digital data.

Here, the OS transistor provided in the oxide semiconductor memory 103 has an extremely low current that flows between its source and drain in an off state, that is, leakage current. The oxide semiconductor memory 103 can be used as a nonvolatile memory by retaining electric charge corresponding to data in its memory circuit, using characteristics of an extremely low leakage current.

Moreover, it is preferable to provide a memory circuit capable of reading out retained data without destruction (non-destructive reading) in the oxide semiconductor memory 103. Thus, processing using the same weight data can be performed repeatedly at a high arithmetic processing speed. Accordingly, parallel processing speed of product-sum operation of a neural network in which data reading operation is repeated many times can be increased.

In the digital calculator 101, the input data A1 and the weight data W1 are preferably digital data highly resistant to noise. Thus, arithmetic processing with high accuracy can be performed in the digital calculator 101.

With the use of the oxide semiconductor memory 103 and the digital calculator 101 described above, arithmetic processing with high accuracy and high performance can be performed in the semiconductor device 100. Thus, the semiconductor device 100 can efficiently perform processing using the same weight data, as in the case of a convolutional neural network. Note that detailed structures and specific examples of the oxide semiconductor memory 103 and the digital calculator 101 will be described in the following embodiments.

As illustrated in FIG. 1B, the analog calculator 102 performs product-sum operation using weight data W2 input from the oxide semiconductor memory 104 and input data A2, and outputs the result as output data MAC2. Here, the weight data W2 output from the oxide semiconductor memory 104 is output as analog data.

The analog calculator 102 can execute multiplication with the use of the translinear principle utilizing a subthreshold region. Here, the OS transistors used in the analog calculator 102 and the oxide semiconductor memory 104 each have a lower off-state current than a Si transistor, and can have a wide range of the gate voltage where the transistors operate in a subthreshold region. Thus, in the analog calculator 102 and the oxide semiconductor memory 104, the OS transistors can be driven relatively easily in the subthreshold region with a small current value.

The OS transistors are driven in the subthreshold region with a small current value, whereby power consumption of the analog calculator 102 and the oxide semiconductor memory 104 can be reduced. In arithmetic operation in AI technology, product-sum operation using weight data and input data is repeated an enormous number of times; thus, the power consumption is also significantly increased. In particular, in fully connected operation in which weight data is frequently rewritten, power consumption is significantly increased. As a countermeasure to this, the analog calculator 102 and the oxide semiconductor memory 104 are driven in the subthreshold region so that the power consumption can be reduced effectively.

With the use of the oxide semiconductor memory 104 and the analog calculator 102 described above, arithmetic processing can be performed with low power consumption in the semiconductor device 100. Thus, the semiconductor device 100 can perform, with high power efficiently, arithmetic processing in which weight data is frequently rewritten, such as the fully connected operation. Note that detailed structures and specific examples of the oxide semiconductor memory 104 and the analog calculator 102 will be described in the following embodiments.

As described above, the semiconductor device 100 described in this embodiment can operate the digital calculator 101 when performing arithmetic processing repeatedly using the same weight data and can operate the analog calculator 102 when rewriting weight data frequently. With the use of the digital calculator 101 and the analog calculator 102 differentially in this manner, arithmetic processing with high accuracy, high performance, and low power consumption as a whole can be performed.

Note that the semiconductor device 100 described in this embodiment can perform a plurality of kinds of arithmetic operation in parallel. In the case where the plurality of kinds of arithmetic operation include repeated arithmetic operation using the same weight data and arithmetic operation in which weight data is frequently rewritten, the digital calculator 101 and the analog calculator 102 may be operated in parallel. That is, while the repeated arithmetic operation using the same weight data is performed in the digital calculator 101, the arithmetic operation in which weight data is frequently rewritten can be performed in the analog calculator 102 in parallel. For example, when arithmetic operation is performed using a CNN (Convolutional Neural Network) model, while fully connected operation is performed in the analog calculator 102, subsequent convolutional operation can be performed in the digital calculator 101 in parallel.

Next, arrangement of the digital calculator 101, the analog calculator 102, the oxide semiconductor memory 103, and the oxide semiconductor memory 104 in the semiconductor device 100 is described with reference to FIG. 2A and FIG. 2B.

Figure 2A:
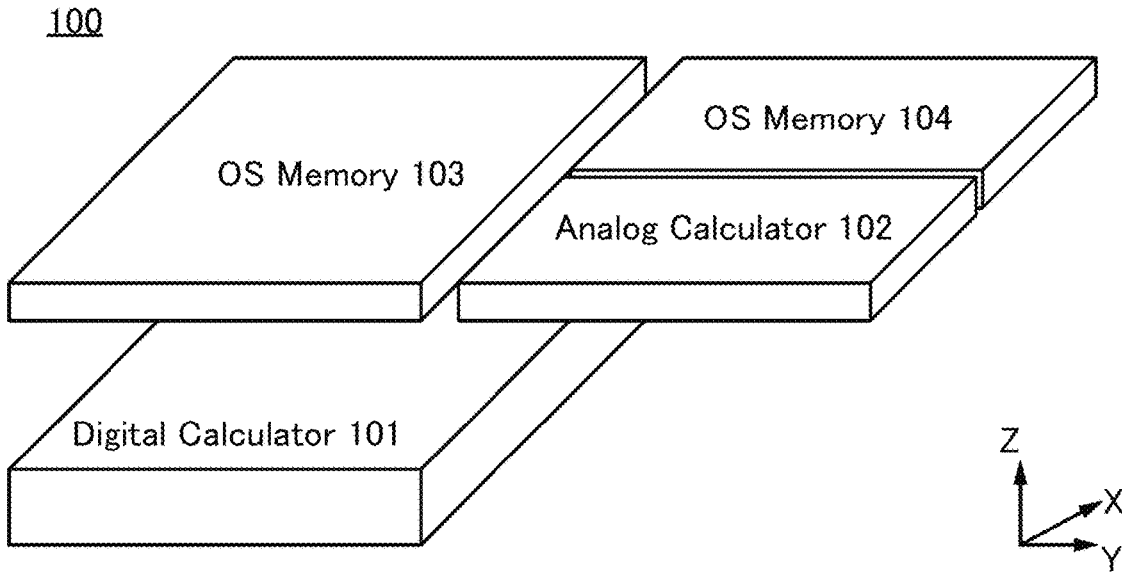
FIG. 2A and FIG. 2B are diagrams illustrating structure examples of a semiconductor device.

FIG. 2A illustrates an example in which the digital calculator 101 is formed over a silicon substrate, and the analog calculator 102, the oxide semiconductor memory 103, and the oxide semiconductor memory 104 are arranged over the digital calculator 101. In FIG. 2A, an xy plane is set substantially parallel to a top surface of the silicon substrate, and an element layer including the analog calculator 102, the oxide semiconductor memory 103, and the oxide semiconductor memory 104 is provided in an upper part in the z-axis direction. With such a structure, the degree of integration of the semiconductor device 100 functioning as an accelerator can be increased, and arithmetic processing speed per unit area can be increased. Thus, the size of the semiconductor device 100 can also be reduced.

As illustrated in FIG. 2A, the oxide semiconductor memory 103 is preferably provided to overlap with the digital calculator 101. With such a structure, the length of wirings electrically connecting the oxide semiconductor memory 103 and the digital calculator 101 can be shortened. Accordingly, the processing speed at which weight data of the digital calculator 101 is rewritten can be increased, and the power consumption in this processing can be reduced.

The arrangement of the components of the semiconductor device 100 described in this embodiment is not limited to the arrangement illustrated in FIG. 2A. For example, as illustrated in FIG. 2B, an element layer including the analog calculator 102 and the oxide semiconductor memory 104 may be stacked over an element layer including the oxide semiconductor memory 103. With such a structure, the semiconductor device 100 can be further reduced in size.

Although the structure in which Si transistors are used in the digital calculator 101 is described above, this embodiment is not limited thereto; a structure in which Si transistors are used in the analog calculator 102 can be employed.

Although the structure in which Si transistors are used in the digital calculator 101 and OS transistors are used in the analog calculator 102 is described above, this embodiment is not limited thereto. For example, a structure in which OS transistors are used in both of the digital calculator 101 and the analog calculator 102 may be employed.

Figures 3A, 3B:
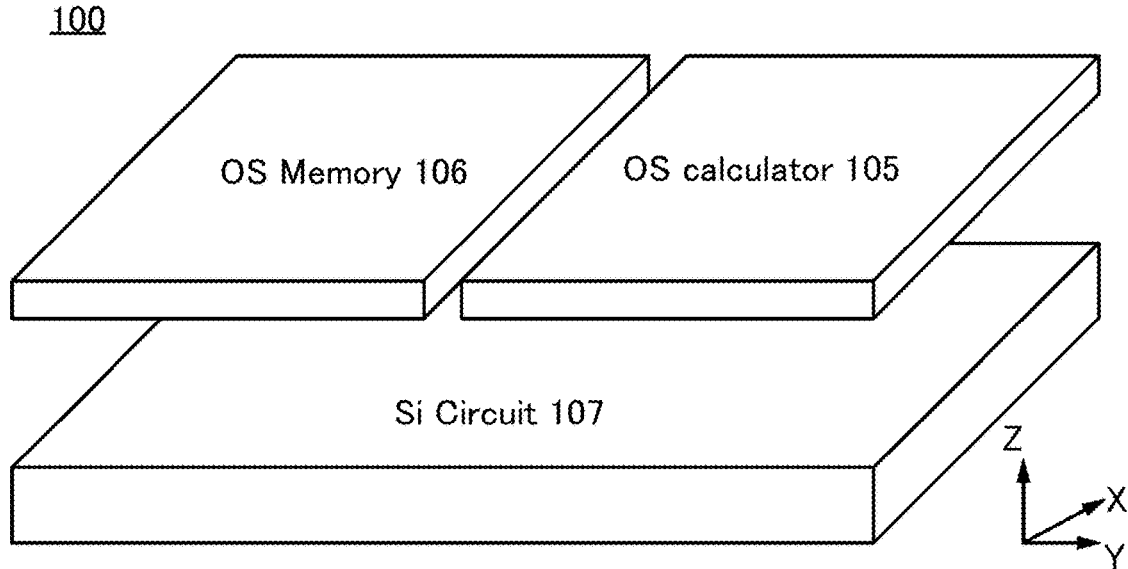
FIG. 3A and FIG. 3B are diagrams illustrating structure examples of a semiconductor device.

In this case, as illustrated in FIG. 3A, an oxide semiconductor calculator (OS Calculator) 105 and an oxide semiconductor memory (OS Memory) 106 can be arranged over a silicon circuit (Si Circuit) 107. Here, the oxide semiconductor calculator 105 is a calculator including OS transistors where both a digital calculator and an analog calculator are mounted. The oxide semiconductor memory 106 has a function of supplying weight data to the oxide semiconductor calculator 105. The silicon circuit 107 may have any function; for example, the silicon circuit 107 may function as a driver circuit, a read circuit, a memory circuit, an arithmetic circuit, or the like.

As illustrated in FIG. 3A, an element layer including the oxide semiconductor calculator 105 and the oxide semiconductor memory 106 is provided over a silicon substrate.

The arrangement of the components of the semiconductor device 100 described in this embodiment is not limited to the arrangement illustrated in FIG. 3A. For example, as illustrated in FIG. 3B, an element layer including the oxide semiconductor memory 106 may be stacked over an element layer including the oxide semiconductor calculator 105. With such a structure, the degree of integration of the semiconductor device 100 functioning as an accelerator can be increased, and arithmetic processing speed per unit area can be increased. Thus, the size of the semiconductor device 100 can also be reduced.

Figure 4:
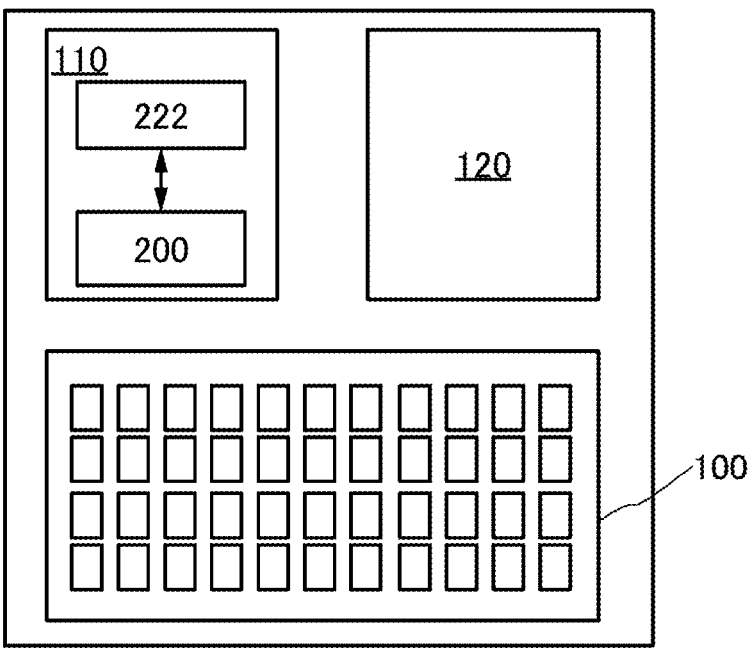
FIG. 4 is a diagram illustrating a structure example of a semiconductor device.

Note that the semiconductor device 100 can be included in a semiconductor device including a CPU 110 and a bus 120 as illustrated in FIG. 4. With such a structure, the semiconductor device 100 functioning as an accelerator can execute part of arithmetic operation of a program executed by the CPU 110.

The CPU 110 has a function of performing at least one general-purpose processing such as execution of an operating system, control of data, and execution of various kinds of arithmetic operation and programs. Here, the CPU 110 includes a CPU core 200 and a backup circuit 222. The CPU core 200 corresponds to one or a plurality of CPU cores.

By the backup circuit 222, the CPU 110 can retain data stored in the CPU core 200 even when the supply of power supply voltage is stopped. The supply of power supply voltage can be controlled by electric isolation by a power switch or the like from a power domain. As the backup circuit 222, for example, an OS memory including OS transistors is suitable.

The bus 120 electrically connects the CPU 110 and the semiconductor device 100 functioning as an accelerator. That is, data transmission can be performed between the CPU 110 and the semiconductor device 100 functioning as an accelerator through the bus 120.

Note that detailed structures of the CPU 110, the CPU core 200, the backup circuit 222, and the bus 120 are described in the following embodiments.

As described above, one embodiment of the present invention can provide a semiconductor device with low power consumption. Another embodiment of the present invention can provide a semiconductor device with improved arithmetic processing speed. Another embodiment of the present invention can provide a semiconductor device with improved calculation accuracy. Another embodiment of the present invention can provide a small semiconductor device.

Note that this embodiment can be combined with any of the other embodiments in this specification as appropriate.

Embodiment 2

In this embodiment, part of a structure, operation, and the like of the semiconductor device 100 described in the above embodiment will be described.

Figures 5A, 5B:
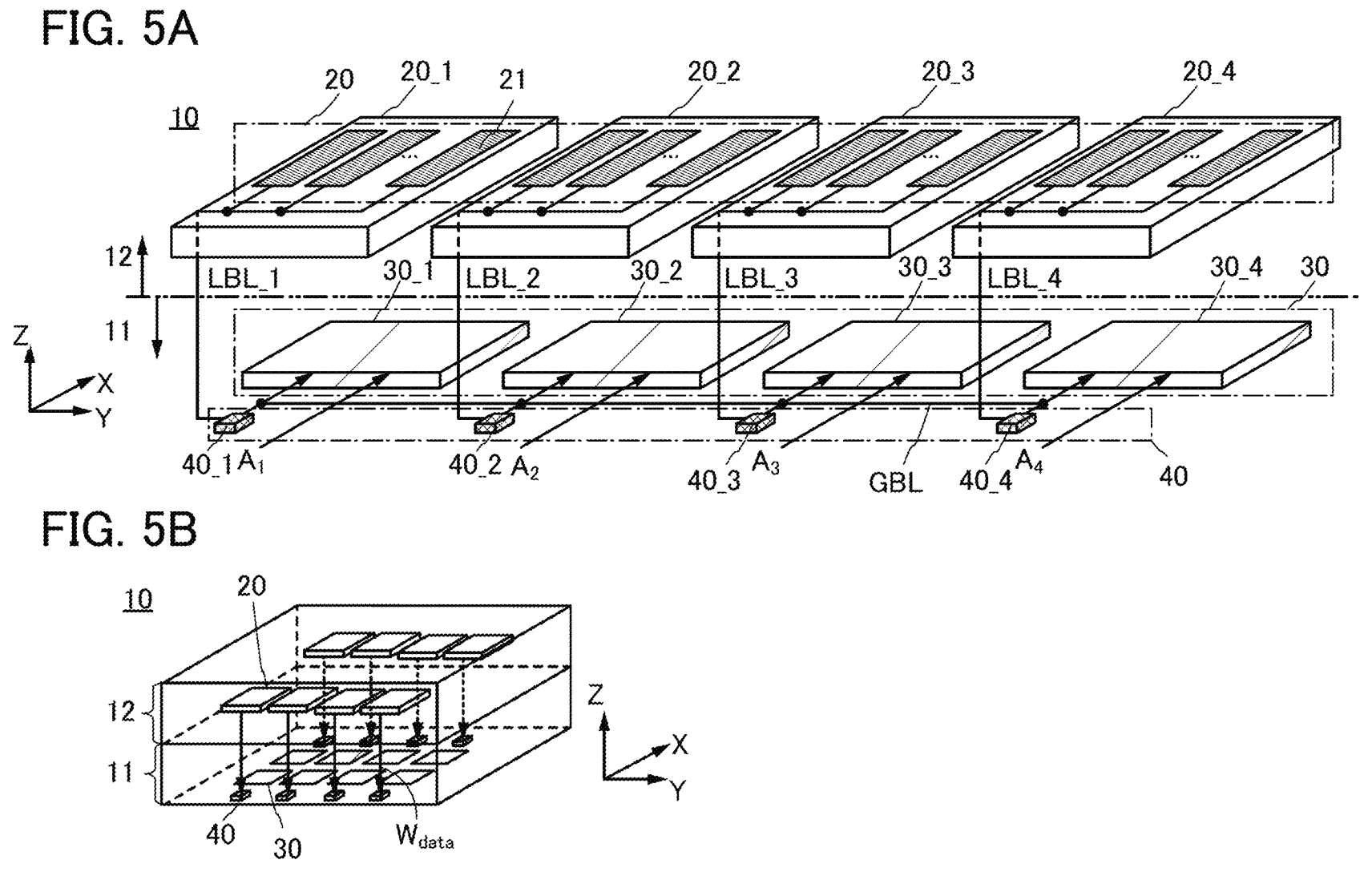

FIG. 5A is a diagram illustrating a semiconductor device 10 of one embodiment of the present invention. Here, the semiconductor device 10 is part of the semiconductor device 100 and includes the digital calculator 101 and the oxide semiconductor memory 103 described in the above embodiment.

The semiconductor device 10 has a function of an accelerator that executes a program (also referred to as kernel or a kernel program) called from a host program. The semiconductor device 10 can perform parallel processing of matrix operation in graphics processing, parallel processing of product-sum operation of a neural network, and parallel processing of floating-point operation in a scientific computation, for example.

The semiconductor device 10 includes a memory circuit portion 20 (also referred to as a memory cell array), an arithmetic circuit 30, and a switching circuit 40. Here, the arithmetic circuit 30 corresponds to the digital calculator 101 described in the above embodiment, and the memory circuit portion 20 corresponds to the oxide semiconductor memory 103 described in the above embodiment. The arithmetic circuit 30 and the switching circuit 40 are provided in a layer 11 that includes transistors on an xy plane in the diagram. The memory circuit portion 20 is provided in a layer 12 that includes transistors on the xy plane in the diagram.

The layer 11 includes transistors containing silicon in their channel formation regions (Si transistors). The layer 12 includes transistors including an oxide semiconductor in their channel formation regions (OS transistors). The layer 11 and the layer 12 are provided in different layers in a direction substantially perpendicular to the xy plane (in the z direction in FIG. 5A). Thus, the semiconductor device 10 illustrated in FIG. 5B has a stacked-layer structure similar to that of the digital calculator 101 and the oxide semiconductor memory 103 illustrated in FIG. 2A or FIG. 2B.

The memory circuit portion 20 formed using OS transistors can be provided to be stacked over the arithmetic circuit 30 and the switching circuit 40 that can be formed using Si transistors. That is, the memory circuit portion 20 is provided over a substrate provided with the arithmetic circuit 30 and the switching circuit 40. Accordingly, the memory circuit portion 20 can be provided without an increase in the circuit area. When the region provided with the memory circuit portion 20 is over the substrate provided with the arithmetic circuit 30 and the switching circuit 40, storage capacity, which is necessary for arithmetic processing in the semiconductor device 10 functioning as an accelerator, can be increased as compared with that in the case where the memory circuit portion 20 is provided in the same layer as the arithmetic circuit 30 and the switching circuit 40. With increased memory capacity, the number of times of data transfer from an external memory device to the semiconductor device, which is necessary for arithmetic processing, can be reduced, whereby the power consumption can be reduced.

As for the memory circuit portion 20, a plurality of memory circuit portions 20_1 to 20_4 are illustrated as an example. Each memory circuit portion includes a plurality of memory circuits 21. The plurality of memory circuits 21 in the memory circuit portions 20_1 to 20_4 are connected to the switching circuit 40 through wirings LBL_1 to LBL_4 (also referred to as local bit lines or read bit lines), as illustrated in FIG. 5A.

The memory circuit 21 can have a circuit structure of a NOSRAM. "NOSRAM (registered trademark)" is an abbreviation for "Nonvolatile Oxide Semiconductor RAM". A NOSRAM is a memory in which its memory cell is a 2-transistor (2T) or 3-transistor (3T) gain cell, and its access transistor is an OS transistor. The memory circuit 21 is a memory formed using an OS transistor. The layer 12 including the memory circuits 21 can be stacked over the layer 11 including the arithmetic circuit 30 and the switching circuit 40. Since the memory circuit portion 20 including the memory circuits 21 is provided over the layer 11 including the arithmetic circuit 30 and the switching circuit 40, area overhead due to the memory circuit portion 20 can be reduced.

An OS transistor has an extremely low current that flows between a source and a drain in an off state, that is, leakage current. The NOSRAM can be used as a nonvolatile memory by retaining electric charge corresponding to data in the memory circuit, using characteristics of an extremely low leakage current. In particular, an NOSRAM is capable of reading out retained data without destruction (non-destructive reading), and thus is suitable for parallel processing of product-sum operation of a neural network in which data reading operation is repeated many times.

The memory circuit 21 is preferably a memory including an OS transistor (hereinafter also referred to as an OS memory), such as a NOSRAM or a DOSRAM. A metal oxide functioning as an oxide semiconductor has a band gap of 2.5 eV or wider; thus, an OS transistor has an extremely low off-state current. For example, the off-state current per micrometer in channel width at a source-drain voltage of 3.5 V and room temperature (25° C.) can be lower than $1\times10^{-20}$ A, lower than $1\times10^{-22}$ A, or lower than $1\times10^{-24}$ A. Therefore, in an OS memory, the amount of electric charge that leaks from a retention node through the OS transistor is extremely small. Accordingly, the OS memory can function as a nonvolatile memory circuit; thus, power gating of the semiconductor device 10 is enabled.

A semiconductor device with transistors integrated at high density generates heat due to circuit drive in some cases. This heat makes the temperature of a transistor rise to change the characteristics of the transistor, and the field-effect mobility thereof might change or the operation frequency thereof might decrease, for example. Since an OS transistor has a higher heat resistance than a Si transistor, a change in field-effect mobility and a decrease in operating frequency due to a temperature change do not easily occur. Even when having a high temperature, an OS transistor is likely to keep a property of the drain current increasing exponentially with respect to the gate-source voltage. Thus, the use of an OS transistor enables stable operation in a high-temperature environment.

A metal oxide used for an OS transistor is a Zn oxide, a Zn—Sn oxide, a Ga—Sn oxide, an In—Ga oxide, an In—Zn oxide, an In-M-Zn oxide (M is Ti, Ga, Y, Zr, La, Ce, Nd, Sn, or Hf), or the like. The use of a metal oxide containing Ga as M for the OS transistor is particularly preferable because the electrical characteristics such as field-effect mobility of the transistor can be made excellent by adjusting a ratio of elements. In addition, an oxide containing indium and zinc may contain one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

In order to improve the reliability and electrical characteristics of the OS transistor, it is preferable that the metal oxide used in the semiconductor layer is a metal oxide having a crystal portion such as CAAC-OS, CAC-OS, or nc-OS. CAAC-OS is an abbreviation for c-axis-aligned crystalline oxide semiconductor. CAC-OS is an abbreviation for Cloud-Aligned Composite oxide semiconductor. In addition, nc-OS is an abbreviation for nanocrystalline oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The CAC-OS has a function of allowing electrons (or holes) serving as carriers to flow and a function of not allowing electrons serving as carriers to flow. The function of allowing electrons to flow and the function of not allowing electrons to flow are separated, whereby both functions can be heightened to the maximum. In other words, when CAC-OS is used for a channel formation region of an OS transistor, a high on-state current and an extremely low off-state current can be both achieved.

Avalanche breakdown or the like is less likely to occur in some cases in an OS transistor than in a general Si transistor because, for example, a metal oxide has a wide band gap and thus electrons are less likely to be excited, and the effective mass of a hole is large. Therefore, it may be, for example, possible to inhibit hot-carrier degradation or the like that is caused by avalanche breakdown. Since hot-carrier degradation can be inhibited, an OS transistor can be driven with a high drain voltage.

An OS transistor is an accumulation transistor in which electrons are majority carriers. Therefore, DIBL (Drain-Induced Barrier Lowering), which is one of short-channel effects, affects an OS transistor less than an inversion transistor having a pn junction (typically a Si transistor). In other words, an OS transistor has higher resistance against short channel effects than a Si transistor.

Owing to its high resistance against short channel effects, an OS transistor can have a reduced channel length without deterioration in reliability, which means that the use of an OS transistor can increase the degree of integration in a circuit. Although a reduction in channel length enhances a drain electric field, avalanche breakdown is less likely to occur in an OS transistor than in a Si transistor as described above.

Since an OS transistor has a high resistance against short-channel effects, a gate insulating film can be made thicker than that of a Si transistor. For example, even in a minute OS transistor whose channel length and channel width are less than or equal to 50 nm, a gate insulating film as thick as approximately 10 nm can be provided in some cases. When the gate insulating film is made thick, parasitic capacitance can be reduced and thus the operating speed of a circuit can be improved. In addition, when the gate insulating film is made thick, leakage current through the gate insulating film is reduced, resulting in a reduction in static current consumption.

As described above, the semiconductor device 10 can retain data owing to the memory circuits 21 that are OS memories even when supply of a power supply voltage is stopped. Thus, the power gating of the semiconductor device 10 is possible and power consumption can be reduced greatly.

Data stored in the memory circuit 21 is data (weight data) that corresponds to a weight parameter used for product-sum operation of a neural network. When the weight data is digital data, the semiconductor device can be highly resistant to noise and is capable of performing arithmetic operation at high speed. Alternatively, the weight data may be analog data. Since a NOSRAM can retain an analog potential, the data can be converted into digital data as appropriate and used. In the case of handling weight data with a large number of bits, the memory circuit 21 capable of retaining analog data can retain the data without an increase in the number of memory circuits.

Switching circuits 40_1 to 40_4 illustrated as an example of the switching circuit 40 have a function of selecting the potentials of the wirings LBL_1 to LBL_4 that extend from the plurality of memory circuit portions 20_1 to 20_4, respectively, and transmitting the potentials to a wiring GBL (also referred to as a global bit line). Output terminals of the switching circuits 40_1 to 40_4 are connected to the wiring GBL. As for the switching circuits 40, it is necessary to prevent shoot-through current that is caused when an output potential of a selected switching circuit 40 and an output potential of an unselected switching circuit 40 are concurrently supplied. The switching circuits 40 can be, for example, three-state buffers in which the state of the output potential is controlled by a control signal. In this structure example, the selected switching circuit buffer-outputs the input potential to the wiring GBL, and the output of the unselected switching circuit has a high impedance; whereby concurrent supply of the output potentials to the wiring GBL can be prevented. Note that the switching circuits 40 are preferably formed using Si transistors. Such a structure enables high-speed switching of the connection state.

Arithmetic circuits 30_1 to 30_4 illustrated as an example of the arithmetic circuit 30 have a function of repeatedly executing the same processing such as product-sum operation. Input data and weight data that are input for the product-sum operation in the arithmetic circuit 30 are preferably digital data. Digital data is unlikely to be affected by noise. Therefore, the arithmetic circuit 30 is suitable for performing arithmetic processing that requires an arithmetic operation result with high accuracy. Note that the arithmetic circuit 30 is preferably formed using a Si transistor. With this structure, an OS transistor can be stacked.

The weight data retained in the memory circuits 21 is supplied to the arithmetic circuits 30_1 to 30_4 through the wirings LBL_1 to LBL_4 and the wiring GBL. Input data $(A_1, A_2, A_3, \text{and } A_4)$ input from the outside is supplied to the arithmetic circuits 30_1 to 30_4. The arithmetic circuits 30_1 to 30_4 perform arithmetic processing of product-sum operation using the weight data retained in the memory circuits 21 and the input data input from the outside.

Weight data selected in the plurality of memory circuit portions 20_1 to 20_4 is switched by the switching circuits 40_1 to 40_4 and supplied to the arithmetic circuits 30_1 to 30_4 through the wiring GBL. That is, the arithmetic circuits 30_1 to 30_4 can perform arithmetic processing, e.g., product-sum operation, using the same weight data. Thus, the semiconductor device 10 in one embodiment of the present invention can perform processing efficiently with the use of the same weight data, as in the case of a convolutional neural network.

Since the weight data to be supplied to the arithmetic circuits 30_1 to 30_4 can be supplied to the wiring GBL after the data supplied to the wirings LBL_1 to LBL_4 in advance is switched with the switching circuits 40_1 to 40_4, the weight data supplied to the wiring GBL can be switched at a speed based on the electrical characteristics of Si transistors. Therefore, even in the case where a period for reading out the weight data from the memory circuit portions 20_1 to 20_4 to the wirings LBL_1 to LBL_4 is long, reading out the weight data to the wirings LBL_1 to LBL_4 in advance makes it possible to perform arithmetic processing with the weight data switched at high speed.

Note that wirings LBL extending from the memory circuit portion 20 toward the switching circuits 40 are wirings for transmitting weight data $W_{data}$ from the layer 12 to the layer 11 as illustrated in FIG. 5B. To read out the weight data $W_{data}$ from the memory circuits 21 to the wirings LBL at high speed, it is preferable to shorten the wirings LBL. Furthermore, to reduce energy consumption caused by charge and discharge, it is preferable to shorten the wirings LBL. In other words, the switching circuits 40 are preferably provided in a dispersed manner on the xy plane of the layer 11 so as to be close to the wirings LBL extending in the z direction (an arrow extending in the z direction in the diagram).

Note that the arithmetic circuits 30_1 to 30_4 are provided for the wirings LBL_1 to LBL_4 that are bit lines for reading of the memory circuits 21, respectively, that is, they can each be provided for one column (Column-Parallel Calculation). The structure makes it possible to perform arithmetic processing on data for the number of wirings LBL in parallel. As compared to product-sum operation using a CPU or a GPU, there is no limitation on the data bus size (e.g., 32 bits), and thus the parallelism of arithmetic operation can be greatly increased in Column-Parallel Calculation. Accordingly, an arithmetic efficiency regarding an enormous amount of arithmetic processing such as learning of a deep neural network (deep learning) or a scientific computation that performs floating-point arithmetic operation, which is the AI technology, can be improved. Additionally, data output from the arithmetic circuit 30 can be read out after completion of the arithmetic operation, whereby power required for memory access (e.g., data transfer between an arithmetic circuit and a memory) can be reduced and heat generation and an increase in power consumption can be inhibited. Furthermore, when the physical distance between the arithmetic circuit 30 and the memory circuit portion 20 is decreased, for example, a wiring distance can be shortened by stacking layers, parasitic capacitance generated in a signal line can be reduced and low power consumption can be achieved.

Next, a block diagram including the semiconductor device 10 functioning as an AI accelerator, the CPU 110, and the bus 120 is described with reference to FIG. 6A. Note that the CPU 110 and the bus 120 correspond to the components described in the above embodiment.

Figure 6A:
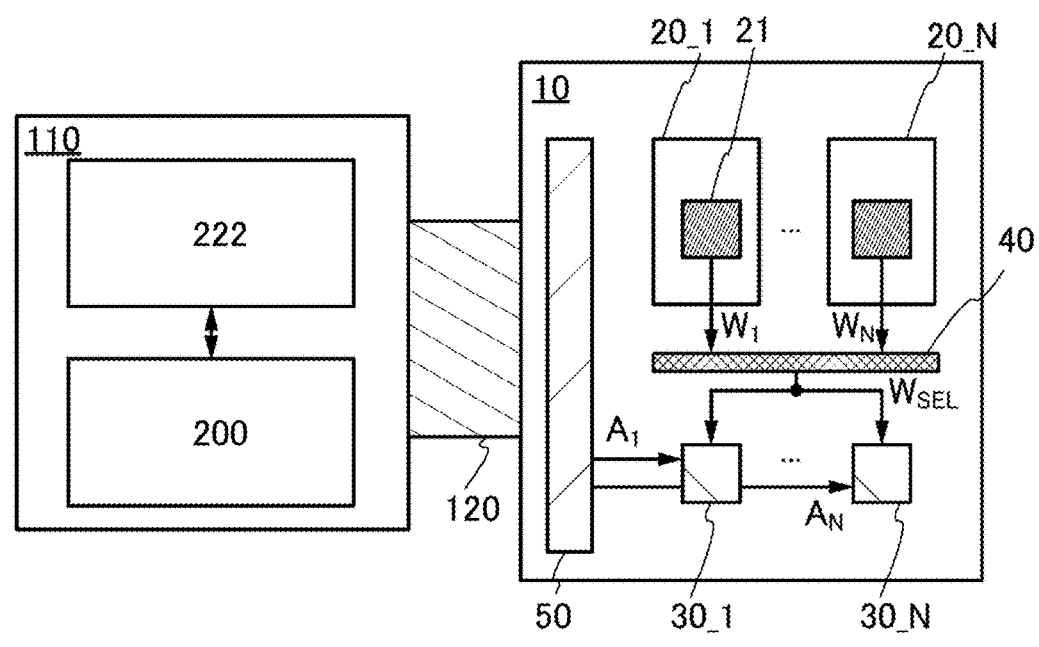
FIG. 6A and FIG. 6B are diagrams illustrating a structure example of a semiconductor device.

FIG. 6A illustrates a CPU 110 and a bus 120 as well as the semiconductor device 10 illustrated in FIG. 5A and FIG. 5B. The CPU 110 includes a CPU core 200 and a backup circuit 222. As for the semiconductor device 10 functioning as an accelerator, a driver circuit 50, memory circuit portions 20_1 to 20_N (N is a natural number of 2 or more), the memory circuits 21, the switching circuit 40, and arithmetic circuits 30_1 to 30_N are illustrated.

The CPU 110 has a function of performing general-purpose processing such as execution of an operating system, control of data, and execution of various kinds of arithmetic operation and programs. The CPU 110 includes the CPU core 200. The CPU core 200 corresponds to one or a plurality of CPU cores. The CPU 110 includes the backup circuit 222 that can retain data stored in the CPU core 200 even when the supply of power supply voltage is stopped. The supply of power supply voltage can be controlled by electric isolation by a power switch or the like from a power domain. Note that power supply voltage is referred to as driving voltage in some cases. As the backup circuit 222, for example, an OS memory including OS transistors is suitable.

The backup circuit 222 formed using OS transistors can be stacked over the CPU core 200 that can be formed using Si transistors. The area of the backup circuit 222 is smaller than that of the CPU core 200; thus, the circuit area is not increased when the backup circuit 222 is provided over the CPU core 200. The backup circuit 222 has a function of retaining data of a register included in the CPU core 200. The backup circuit 222 is also referred to as a data retention circuit. Note that a structure of the CPU core 200 provided with the backup circuit 222 including OS transistors will be described in details in Embodiment 5.

The memory circuit portions 20_1 to 20_N respectively output weight data $W_1$ to $W_N$ retained in the memory circuits 21 to the switching circuit 40 through the wirings LBL (not illustrated). The switching circuit 40 outputs selected weight data as weight data $W_{SEL}$ to each of the arithmetic circuits 30_1 to 30_N through the wiring GBL (not illustrated). The driver circuit 50 outputs pieces of input data $A_1$ to $A_N$ to the arithmetic circuits 30_1 to 30_N through an input data line.

The driver circuit 50 has a function of outputting signals for controlling writing and reading of weight data to/from the memory circuit portions 20_1 to 20_N. Furthermore, the driver circuit 50 has a function of a circuit for executing product-sum operation and the like of the neural network by supplying input data to the arithmetic circuits 30_1 to 30_N and a function of retaining output data obtained from the product-sum operation and the like of the neural network, for example.

The bus 120 electrically connects the CPU 110 and the semiconductor device 10. That is, data transmission can be performed between the CPU 110 and the semiconductor device 10 through the bus 120.

Figure 6B:
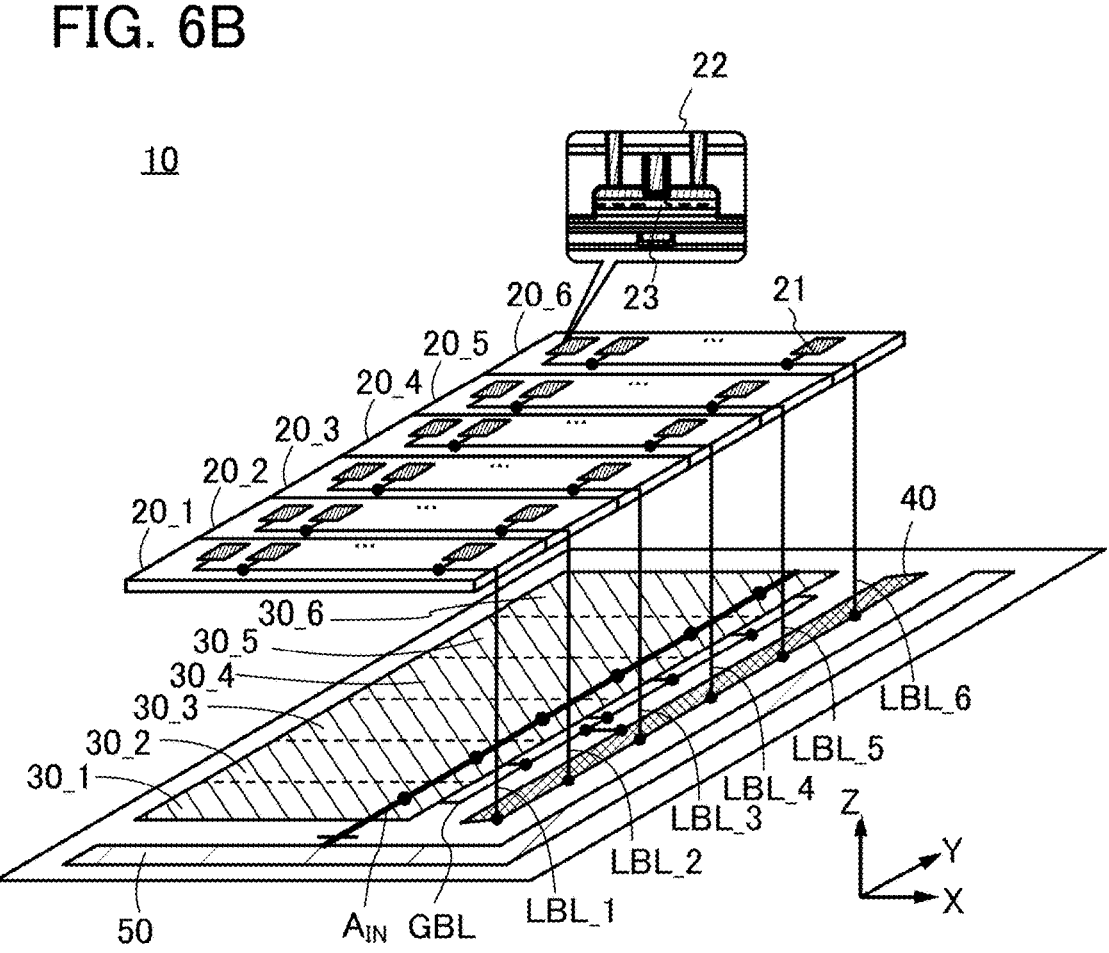

FIG. 6B is a diagram illustrating the positional relationship between components in the semiconductor device 10 illustrated in FIG. 6A in the case where Nis 6.

The memory circuit portions 20_1 to 20_6 formed using OS transistors and the arithmetic circuits 30_1 to 30_6 are electrically connected to each other through the wirings LBL_1 to LBL_6 provided to extend in the direction substantially perpendicular to the surface of the substrate provided with the driver circuit 50, the switching circuit 40, and the arithmetic circuits 30_1 to 30_6. Note that "substantially perpendicular" refers to a state where an arrangement angle is greater than or equal to 85° and less than or equal to 95°. Note that in this specification, the X direction, the Y direction, and the Z direction illustrated in FIG. 6B or the like are directions orthogonal to or intersecting with each other. In addition, the X direction and the Y direction are parallel or substantially parallel to the substrate surface and the Z direction is perpendicular or substantially perpendicular to the substrate surface.

Each of the memory circuit portions 20_1 to 20_6 includes the memory circuits 21. The memory circuit portions 20_1 to 20_6 are referred to as device memories or shared memories in some cases. The memory circuit 21 includes a transistor 22. When a semiconductor layer 23 included in the transistor 22 is an oxide semiconductor (metal oxide), the memory circuit 21 including the OS transistor can be obtained.

The plurality of memory circuits 21 included in the memory circuit portions 20_1 to 20_6 are connected to the wirings LBL_1 to LBL_6, respectively. The wirings LBL_1 to LBL_6 are connected to the switching circuit 40 via the wirings extending in the z-direction. The switching circuit 40 is configured to amplify the potential of any one of the wirings LBL_1 to LBL_6 and transfer the potential to the wiring GBL. With the structure, the weight data to be supplied to the wiring GBL can be switched at high speed by control of the switching circuit 40.

The arithmetic circuits 30_1 to 30_6 perform arithmetic operation on the basis of the weight data input through the wiring GBL and input data $A_{IN}$ supplied from the driver circuit 50 through the input data line. Since the memory circuit portions 20_1 to 20_6 retaining the weight data can be provided in the upper layer, the arithmetic circuits 30_1 to 30_6 can be arranged efficiently. Accordingly, the input data line extending from the driver circuit 50 can be shortened, enabling low power consumption and high speed operation of the semiconductor device 10.

Figure 7A:
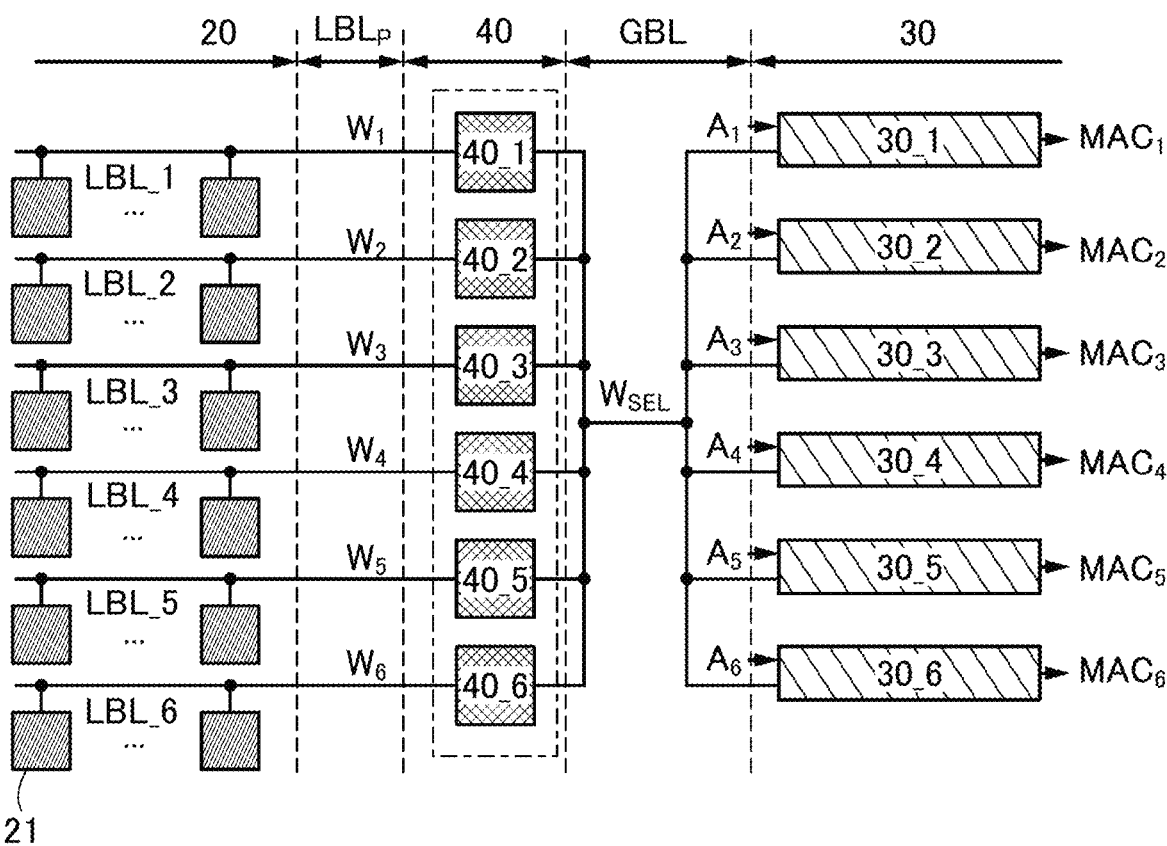
FIG. 7A and FIG. 7B are diagrams illustrating a structure example of a semiconductor device.

Next, advantages of the structure illustrated in FIG. 6B are described. FIG. 7A illustrates the components of FIG. 6B in a block diagram, for explanation. The description will be made on the assumption that pieces of weight data $W_1$ to $W_6$ are read out from the memory circuits 21 of the six memory circuit portions 20_1 to 20_6 to the wirings LBL_1 to LBL_6. Furthermore, switching circuit 40_1 to 40_6 connected to the wirings LBL_1 to LBL_6 are described as the switching circuit 40. In addition, weight data that is selected from the pieces of weight data $W_1$ to $W_6$ by the switching circuit 40 and supplied to the wiring GBL is referred to as the weight data $W_{SEL}$ in the following description. The description will be made on the assumption that pieces of input data $A_1$ to $A_6$ are supplied to the arithmetic circuits 30_1 to 30_6, respectively, to obtain pieces of output data $MAC_1$ to $MAC_6$.

Wirings LBL of the wirings LBL_1 to LBL_6, which connect the upper layer and the lower layer and extend in the vertical direction are shorter than wirings extending in the horizontal direction. Thus, the parasitic capacitance of the wirings LBL_1 to LBL_6 can be made small, so that electric charge needed for charge and discharge of the wirings can be reduced and a reduction in power consumption and an improvement in arithmetic efficiency can be achieved. Moreover, reading from the memory circuits 21 to the wirings LBL_1 to LBL_6 can be performed at high speed.

Arithmetic processing using the same weight data through the wiring GBL can be conducted in the arithmetic circuits 30_1 to 30_6. This structure is suitable for arithmetic processing of a convolutional neural network in which arithmetic processing is performed using the same weight data.

Figure 7B:
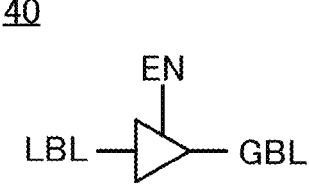

FIG. 7B is an example of a circuit structure applicable to the switching circuit 40 illustrated in FIG. 7A. A three-state buffer illustrated in FIG. 7B has a function of amplifying the potential of the wiring LBL and transferring it to the wiring GBL in response to a control signal EN. The switching circuit 40 can be regarded as a multiplexer. The switching circuit 40 has a function of selecting one of a plurality of input signals.

Figure 8:
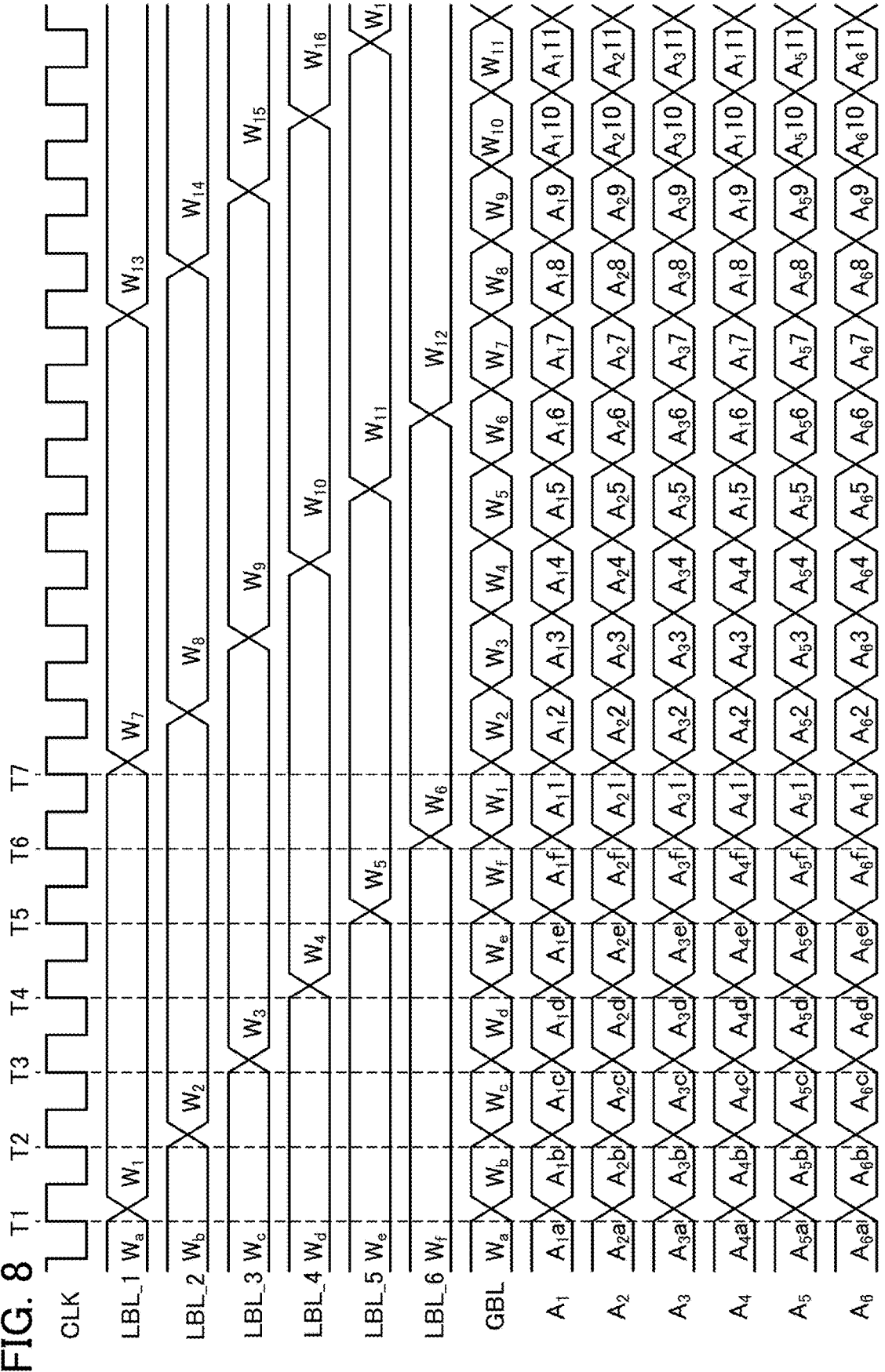
FIG. 8 is a diagram showing a structure example of a semiconductor device.

FIG. 8 is a timing chart showing the operation of the structure described with reference to FIG. 7A. In the semiconductor device 10, arithmetic processing is performed in accordance with toggle operation of a clock signal CLK (e.g., Time T1 to T7). Owing to a structure with increased frequency of the clock signal CLK, the arithmetic processing speed can be increased.

In the case where the pieces of input data $A_1$ to $A_6$ are switched to $A_1$a to $A_1$11, $A$ta to $A_2$11, $A_3$a to $A_3$11, $A_4$a to $A_4$11, $A_5$a to $A_5$11, and $A_6$a to $A_6$11, respectively, at high speed in response to the clock signal CLK as illustrated in the drawing, data of the wiring GBL supplied with the weight data needs to be switched at high speed.

In the structure of one embodiment of the present invention, the weight data selected from the wiring LBL to the wiring GBL by the switching circuit 40 is read out to the wirings LBL_1 to LBL_6 in advance, whereby the data of the wiring GBL supplied with the weight data can be switched at high speed. For example, the following structure can be employed: the weight data $W_1$ is read out to the wiring LBL_1 at Time T1, the weight data $W_1$ is output from the wiring LBL_1 to the wiring GBL by switching of the switching circuit 40 at Time T6. Also in a period from Time T2 to T7 and the subsequent period after Time T7, switching of the weight data in response to the clock signal CLK is performed when the time of reading out the weight data to the wiring LBL is different from the time of selecting the weight data in the wiring GBL.

Figures 9A, 9B:
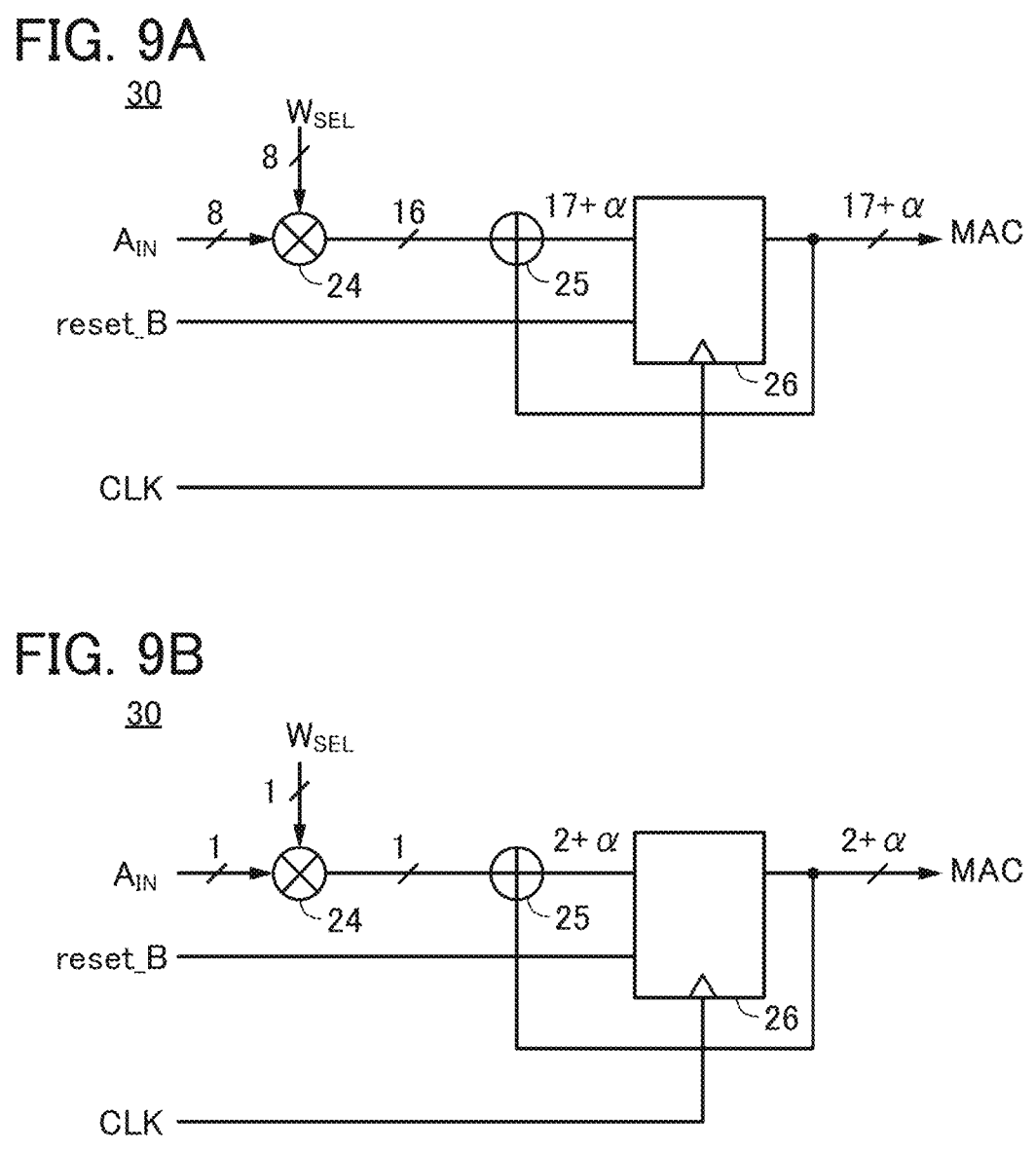

FIG. 9A illustrates a specific structural example of the arithmetic circuit. FIG. 9A illustrates a structure example of the arithmetic circuit 30 capable of performing product-sum operation of 8-bit weight data and input data. A multiplier circuit 24, an adder circuit 25, and a register 26 are illustrated in FIG. 9A. To the adder circuit 25, 16-bit data multiplied by the multiplier circuit 24 is input. The output of the adder circuit 25 is retained in the register 26, and the data multiplied by the multiplier circuit 24 is added together by the adder circuit 25; thus, product-sum operation is performed. The register is controlled with the clock signal CLK and a reset signal reset_B. Note that "a" of "17+α" in the diagram denotes a carry caused by addition of the multiplied data. With such a structure, output data MAC corresponding to the product-sum operation of the weight data $W_{SEL}$ and the input data $A_{IN}$ can be obtained.

Although the arithmetic processing using 8-bit data is performed in FIG. 9A, one embodiment of the present invention is also applicable to a structure using 1-bit data. Such a structure is illustrated in FIG. 9B in a manner similar to that in FIG. 9A. In the case of 1-bit data, arithmetic processing depending on the number of bits is performed as illustrated in FIG. 9B.

Figure 10A:
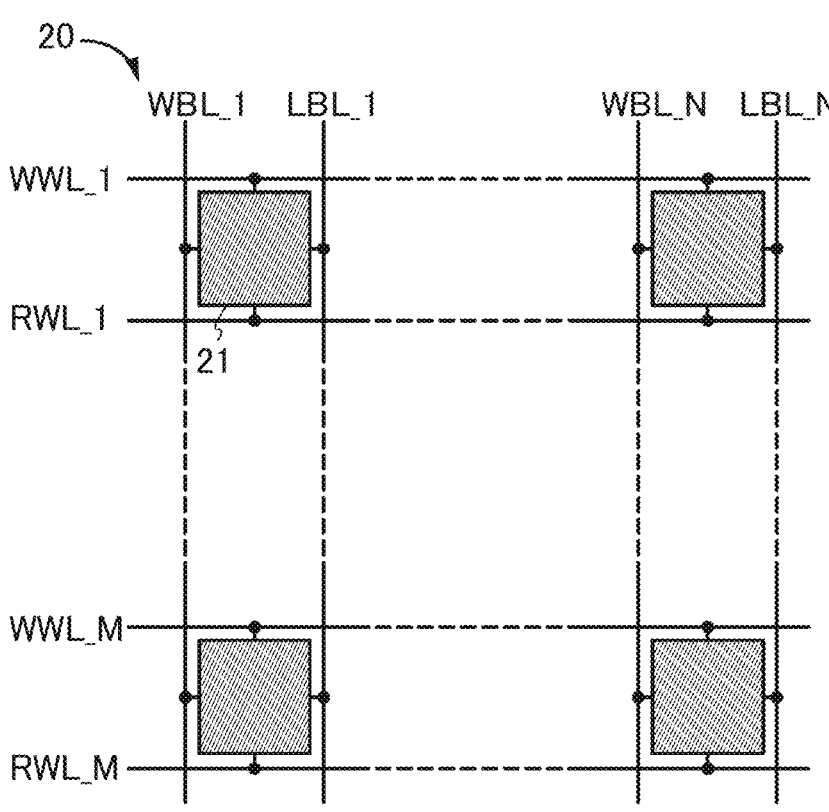
FIG. 10A and FIG. 10B are diagrams illustrating a structure example of a semiconductor device.

FIG. 10A is a diagram illustrating a circuit structure example applicable to the memory circuit portion 20 included in the semiconductor device 10 of the present invention. FIG. 10A illustrates write word lines WWL_1 to WWL_M, read word lines RWL_1 to RWL_M, write bit lines WBL_1 to WBL_N, and the wirings LBL_1 to LBL_N, which are arranged in a matrix of M rows and N columns (M and N are natural numbers greater than or equal to 2). The memory circuits 21 connected to the word lines and the bit lines are also illustrated.

Figure 10B:
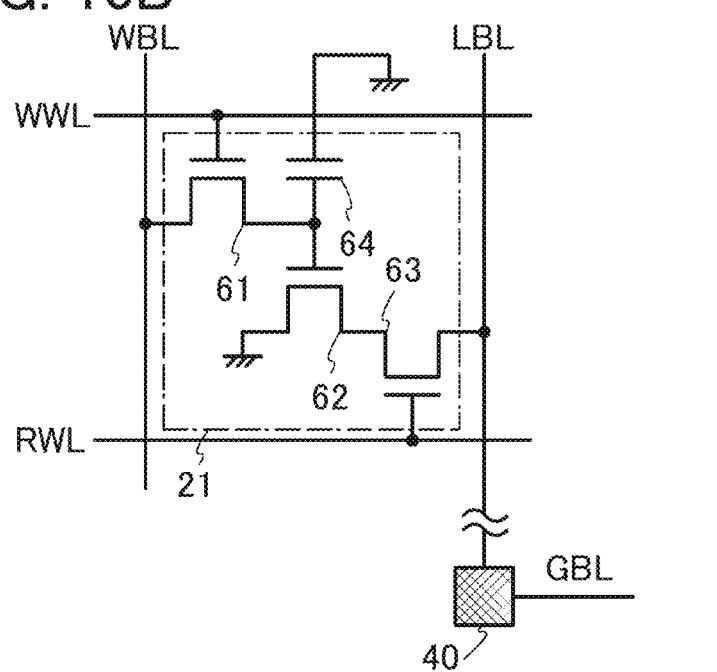

FIG. 10B is a diagram illustrating a circuit structure example applicable to the memory circuit 21. The memory circuit 21 includes a transistor 61, a transistor 62, a transistor 63, and a capacitor 64.

One of a source and a drain of the transistor 61 is connected to the write bit line WBL. A gate of the transistor 61 is connected to the write word line WWL. The other of the source and the drain of the transistor 61 is connected to one electrode of the capacitor 64 and a gate of the transistor 62. One of a source and a drain of the transistor 62 and the other electrode of the capacitor 64 are connected to a wiring supplying a fixed potential such as a ground potential. The other of the source and the drain of the transistor 62 is connected to one of a source and a drain of the transistor 63. A gate of the transistor 63 is connected to the read word line RWL. The other of the source and the drain of the transistor 63 is connected to the wiring LBL. The wiring LBL is connected to the wiring GBL through the switching circuit 40. As described above, the wiring LBL is connected to the switching circuit 40 through the wiring provided to extend in the direction substantially perpendicular to the surface of the substrate provided with the arithmetic circuit 30.

The circuit structure of the memory circuit 21 illustrated in FIG. 10B corresponds to a NOSRAM of a 3-transistor (3T) gain cell. The transistor 61 to the transistor 63 are OS transistors. An OS transistor has extremely low current that flows between a source and a drain in an off state, that is, leakage current. The NOSRAM can be used as a nonvolatile memory by retaining electric charge corresponding to data in the memory circuit, using characteristics of extremely low leakage current.

The circuit structure applicable to the memory circuit 21 in FIG. 10A is not limited to a 3T NOSRAM in FIG. 10B. For example, a circuit corresponding to a DOSRAM illustrated in FIG. 11A may be employed. FIG. 11A illustrates a memory circuit 21A including a transistor 61A and a capacitor 64A. The transistor 61A is an OS transistor. The memory circuit 21A is an example of a circuit connected to a bit line BL, a word line WL, and a back gate line BGL.

The circuit structure applicable to the memory circuit 21 in FIG. 10A may be a circuit corresponding to a 2T NOSRAM illustrated in FIG. 11B. FIG. 11B illustrates a memory circuit 21B including a transistor 61B, a transistor 62B, and a capacitor 64B. The transistor 61B and the transistor 62B are OS transistors. The transistor 61B and the transistor 62B may be OS transistors whose semiconductor layers are provided in different layers or may be OS transistors whose semiconductor layers are provided in the same layer. The memory circuit 21B is an example of a circuit connected to the write bit line WBL, a read bit line RBL, the write word line WWL, the read word line RWL, a source line SL, and the back gate line BGL.

The circuit structure applicable to the memory circuit 21 in FIG. 10A may be a circuit combined with a 3T NOSRAM illustrated in FIG. 11C. FIG. 11C illustrates a memory circuit 21C including a memory circuit 21_P and a memory circuit 21_N which can retain data with different logic. FIG. 11C illustrates the memory circuit 21_P including a transistor 61_P, a transistor 62_P, a transistor 63_P, and a capacitor 64_P and the memory circuit 21_N including a transistor 61_N, a transistor 62_N, a transistor 63_N, and a capacitor 64_N. The transistors included in the memory circuit 21_P and the memory circuit 21_N are OS transistors. The transistors included in the memory circuit 21_P and the memory circuit 21_N may be OS transistors whose semiconductor layers are provided in different layers or may be OS transistors whose semiconductor layers are provided in the same layer. The memory circuit 21C is an example of a circuit connected to a write bit line WBL_P, a wiring LBL_P, a write bit line WBL_N, a wiring LBL_N, the write word line WWL, and the read word line RWL. The memory circuit 21C can retain data with different logic, read out the data with different logic to the wiring LBL_P and the wiring LBL_N, and output it to the wiring GBL_P and the wiring GBL_N through the switching circuit 40, in a manner similar to that in FIG. 7 and the like.

Note that in the structure of FIG. 11C, an exclusive OR circuit (an XOR circuit) may be provided so that data corresponding to multiplication of data retained in the memory circuit 21_P and the memory circuit 21_N can be output to the wiring LBL. This structure makes it possible to omit arithmetic operation corresponding to multiplication in the arithmetic circuit 30, whereby a reduction in power consumption can be achieved.

Figure 12:
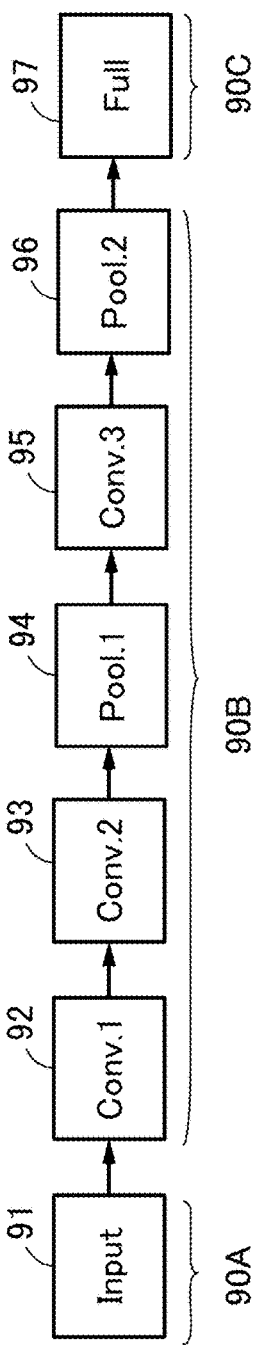
FIG. 12 is a diagram illustrating a structure example of a semiconductor device.

FIG. 12 illustrates the flow of arithmetic processing of a convolutional neural network. An input layer 90A, an intermediate layer 90B (also referred to as a hidden layer), and an output layer 90C are illustrated in FIG. 12. In the input layer 90A, an input process 91 (denoted by Input in the diagram) of input data is shown. In the intermediate layer 90B, convolutional operation processes 92, 93, and 95 (shown as Conv. in the diagram) and a plurality of pooling operation processes 94 and 96 (shown as Pool. in the diagram) are shown. In the output layer 90C, a fully connected operation process 97 (shown as Full in the diagram) is shown. The flow of the arithmetic processing in the input layer 90A, the intermediate layer 90B, and the output layer 90C is an example, and it is possible that another arithmetic processing such as softmax operation is performed in actual arithmetic processing of a convolutional neural network.

In the convolutional neural network illustrated in FIG. 12, a plurality of convolutional operation processes 92, 93, and 95 are performed as illustrated in FIG. 12. In the convolutional operation processing, arithmetic processing using the same weight data is performed. Therefore, with use of the structure of one embodiment of the present invention, in which arithmetic processing is performed using the same weight data, both a high operation speed and low power consumption can be achieved.

As described in the above embodiment, the fully connected operation process 97 preferably performs arithmetic operation using the analog calculator 102 and the oxide semiconductor memory 104. The analog calculator 102 and the oxide semiconductor memory 104 can be driven in the subthreshold region, whereby the power consumption can be reduced.

Figure 13:
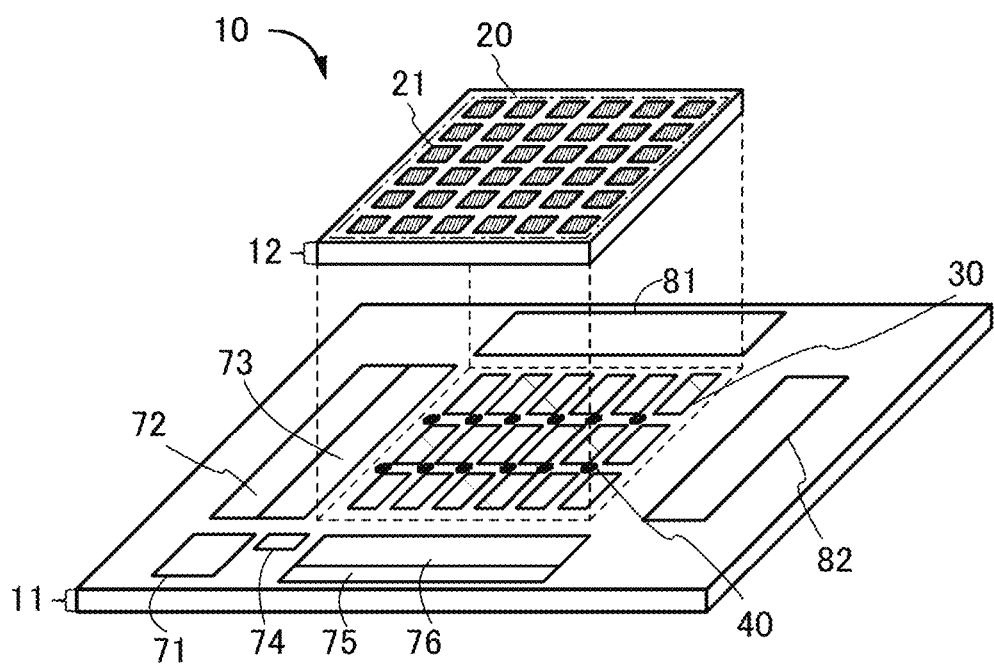
FIG. 13 is a diagram illustrating a structure example of a semiconductor device.

Next, FIG. 13 is a detailed block diagram of the semiconductor device 10.

FIG. 13 illustrates a structure example of the driver circuit 50 illustrated in FIG. 6A and FIG. 6B, as well as components corresponding to the memory circuit portion 20, the memory circuits 21, the arithmetic circuits 30, the switching circuits 40, the layer 11, and the layer 12, which are described with FIG. 5A, FIG. 5B, FIG. 6A, and FIG. 6B.

FIG. 13 illustrates, as components corresponding to the driver circuit 50 described with FIG. 6A and FIG. 6B, a controller 71, a row decoder 72, a word line driver 73, a column decoder 74, a write driver 75, a precharge circuit 76, an input/output buffer 81, and an arithmetic control circuit 82.

Figure 14A:
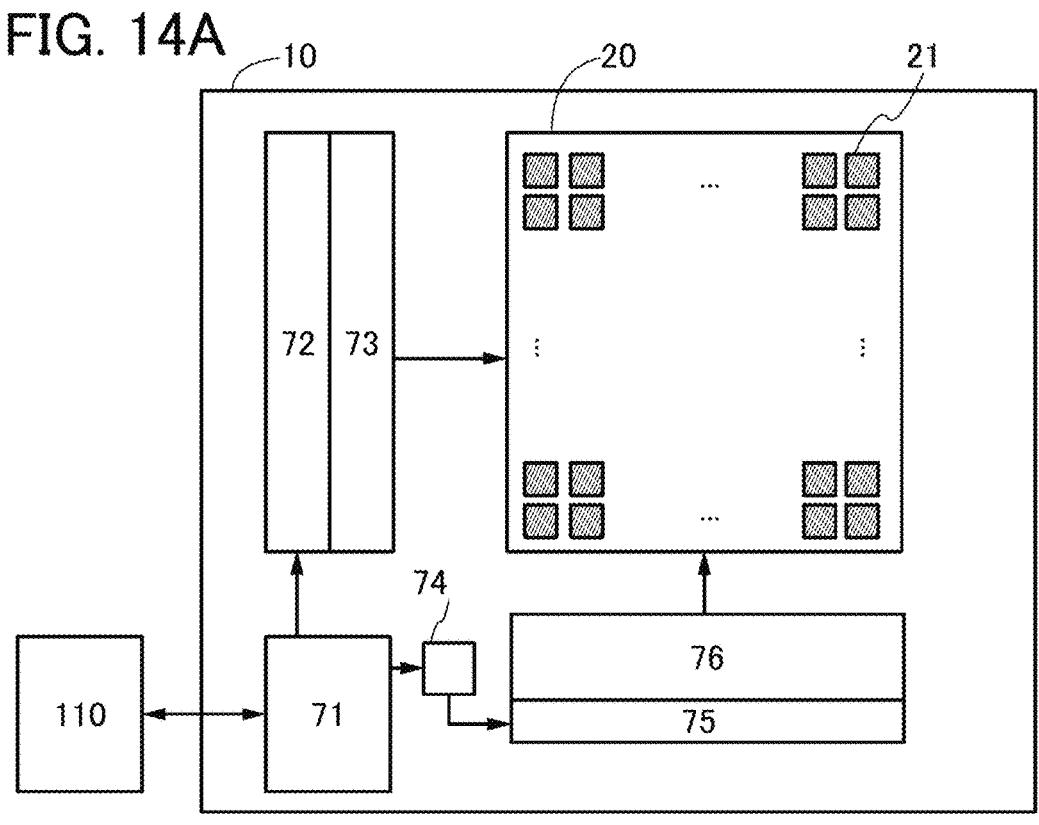
FIG. 14A and FIG. 14B are diagrams illustrating a structure example of a semiconductor device.

FIG. 14A is a diagram of blocks for controlling the memory circuit portion 20, which are extracted from the structure illustrated in FIG. 13. FIG. 14A illustrates the controller 71, the row decoder 72, the word line driver 73, the column decoder 74, the write driver 75, and the precharge circuit 76.

The controller 71 processes an input signal from the outside and generates control signals of the row decoder 72 and the column decoder 74. The input signal from the outside is a control signal for controlling the memory circuit portion 20, such as a write enable signal and a read enable signal. With the controller 71, input/output of data is performed between the CPU 110 and the semiconductor device 10 through the bus 120.

The row decoder 72 generates a signal for driving the word line driver 73. The word line driver 73 generates signals to be supplied to the write word line WWL and the read word line RWL. The column decoder 74 generates a signal for driving the write driver 75. The write driver 75 generates weight data to be supplied to the memory circuit 21. The precharge circuit 76 has a function of precharging the wiring LBL and the like. As described with FIG. 6A, FIG. 6B, and the like, a signal corresponding to the weight data read out from the memory circuit 21 of the memory circuit portion 20 is input to the switching circuit 40 through the wiring LBL.

Figure 14B:
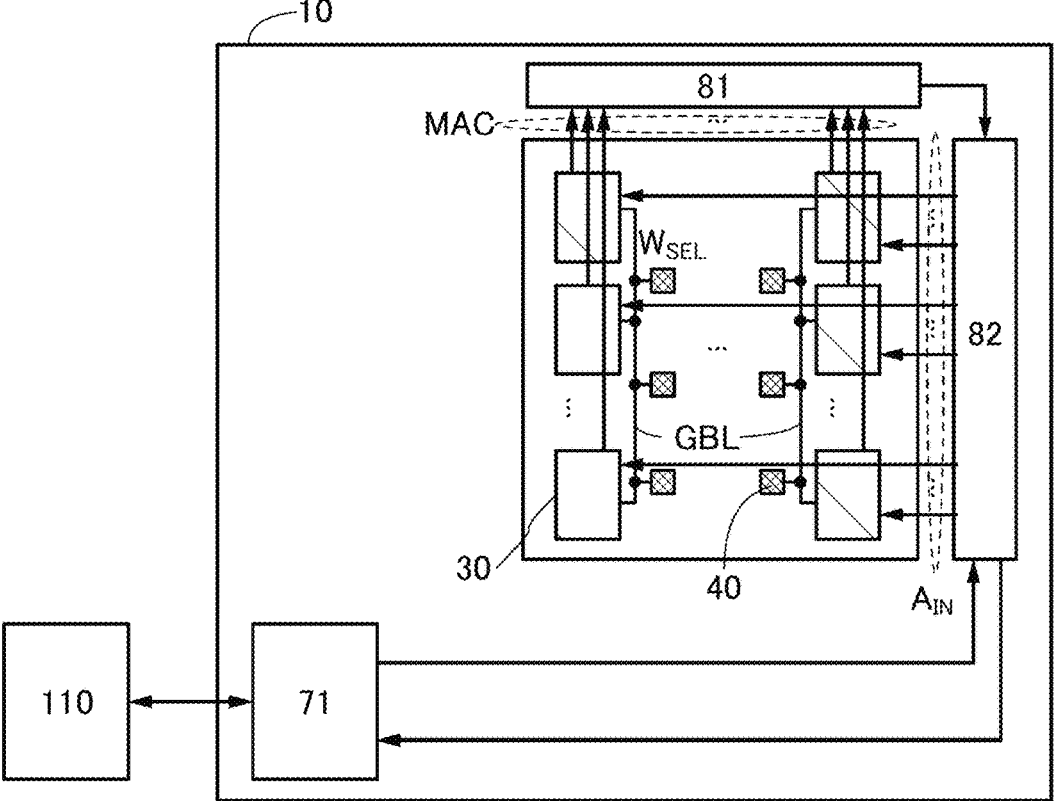

FIG. 14B illustrates blocks for controlling the arithmetic circuit 30 and the switching circuit 40, which are extracted from the structure illustrated in FIG. 13.

The controller 71 processes a signal input from the outside and generates a control signal of the arithmetic control circuit 82. Furthermore, the controller 71 generates various signals for controlling the arithmetic circuit 30, such as an address signal and a clock signal. The arithmetic control circuit 82 generates pieces of input data $A_1$ to $A_N$ to be supplied to the data input line in accordance with a control by the controller 71 and an output from the input/output buffer 81. The arithmetic control circuit 82 outputs a control signal for controlling the switching circuit 40. As described with FIG. 6A, FIG. 6B, and the like, the switching circuit 40 supplies any one of the pieces of weight data supplied from the plurality of wirings LBL, to the plurality of arithmetic circuits 30 through the wiring GBL. The arithmetic circuit 30 generates the output data MAC corresponding to the product-sum operation by switching the supplied weight data and the input data. The generated output data MAC is temporarily retained as intermediate data in a memory such as an SRAM or a register in the arithmetic control circuit 82 through the input/output buffer 81. The retained intermediate data is input to the arithmetic circuit 30 again.

Note that it is preferable to combine a plurality of semiconductor devices 10 in one embodiment of the present invention in order to enable parallel computation with an increased number of parallel processes. A structure example of this case will be described with reference to FIG. 15A and FIG. 15B.

Figure 15A:
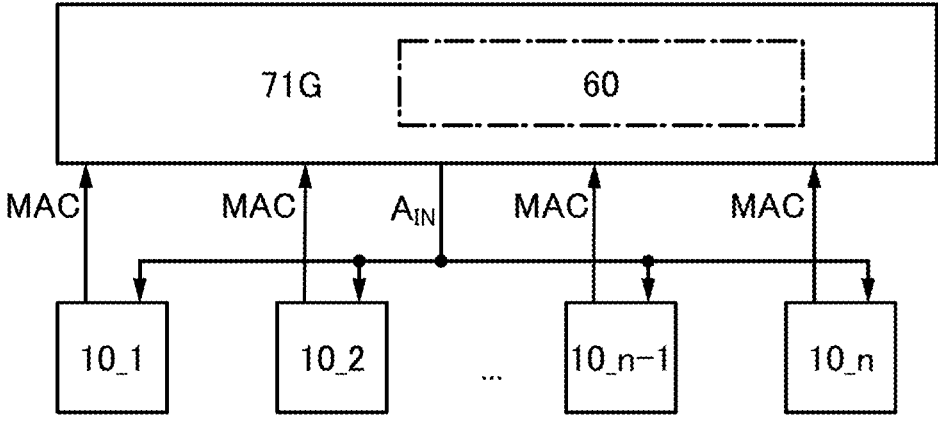
FIG. 15A and FIG. 15B are diagrams illustrating structure examples of a semiconductor device.

FIG. 15A illustrates semiconductor devices 10_1 to 10_n (n is a number greater than or equal to 2) as components corresponding to the semiconductor device 10 and a controller 71G that inputs/outputs and controls data among the semiconductor devices 10_1 to 10_n. The controller 71G includes a memory circuit 60 such as an SRAM. The controller 71G retains the output data MAC obtained with the plurality of semiconductor devices 10_1 to 10_n, in the memory circuit 60. Then, the output data MAC retained in the memory circuit 60 is output as the input data $A_{IN}$ of the plurality of semiconductor devices 10_1 to 10_n. With such a structure, it is possible to perform parallel computation with an increased number of parallel processes using the plurality of semiconductor devices.

Figure 15B:
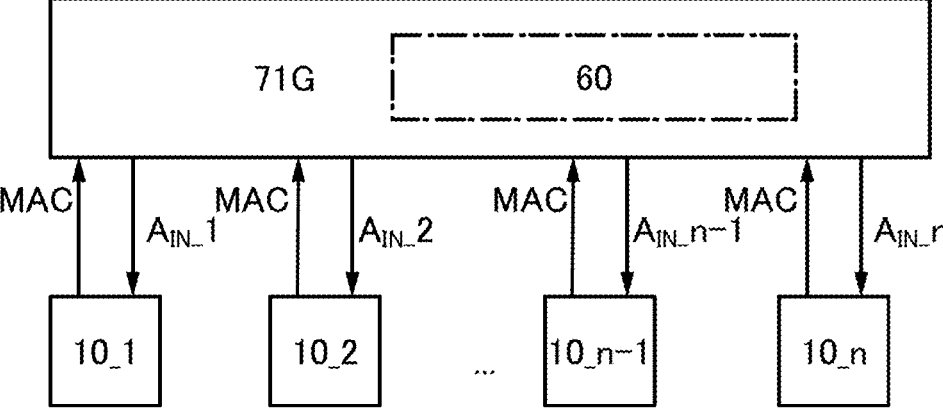

Furthermore, in FIG. 15B, which is a structure example different from that in FIG. 15A, output data retained in the memory circuit 60 is subjected to different arithmetic processing in the controller 71G to obtain input data, and the input data is output as pieces of input data $A_{IN}$_1 to $A_{IN}$_n to the plurality of semiconductor devices 10_1 to 10_n. In the case of this structure, for example, the controller 71G is configured to perform arithmetic processing based on activation functions, pooling processing, normalized arithmetic processing (normalization), and the like on the output data retained in the memory circuit 60. Such a structure makes it possible to efficiently perform arithmetic processing other than convolutional operation processing, in addition to parallel computation with an increased number of parallel processes using the plurality of semiconductor devices.

In the semiconductor device 10, the output data MAC corresponding to the arithmetic operation result of the arithmetic circuit 30 is input as intermediate data to the arithmetic control circuit 82 with the use of a buffer memory in the input/output buffer 81. The arithmetic control circuit 82 can output this intermediate data again as data to be input to the arithmetic circuit 30. Therefore, it is possible to execute arithmetic processing without reading out data in the middle of arithmetic operation to a main memory or the like outside the semiconductor device 10. Furthermore, in the semiconductor device 10, the memory circuit portion and the arithmetic circuit can be electrically connected to each other through a wiring in an opening portion provided in an insulating film or the like; therefore, the number of parallel processes can be increased with the increasing number of wirings. Thus, parallel computation for the number of bits greater than or equal to the data bus width of the CPU 110 is possible in the semiconductor device 10. Furthermore, the number of times of transferring an enormous number of pieces of weight data to/from the CPU 110 can be reduced, whereby power consumption can be reduced.

As described above, one embodiment of the present invention can provide a semiconductor device that is reduced in size and functions as an accelerator. Another embodiment of the present invention can provide a semiconductor device with improved arithmetic processing speed, which functions as an accelerator. Another embodiment of the present invention can provide a semiconductor device with improved calculation accuracy, which functions as an accelerator. Another embodiment of the present invention can provide a semiconductor device with reduced power consumption, which functions as an accelerator. Moreover, a semiconductor device with a novel structure, which functions as an accelerator, can be provided.

Note that this embodiment can be combined with any of the other embodiments in this specification as appropriate.

Embodiment 3

In this embodiment, part of structure, operation, and the like of the semiconductor device 100 described in the above embodiment is described. A semiconductor device described in this embodiment is part of the semiconductor device 100 and includes the analog calculator 102 and the oxide semiconductor memory 104 described in the above embodiment.

Structure Example

Figure 16A:
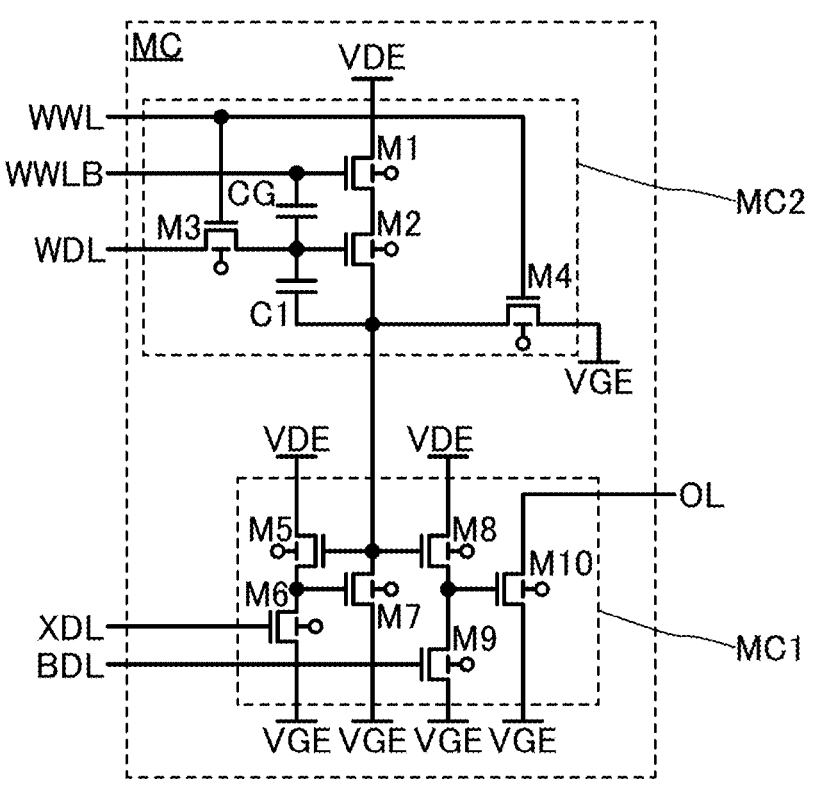
FIG. 16A and FIG. 16B are diagrams illustrating a structure example of a semiconductor device.
Figure 16B:
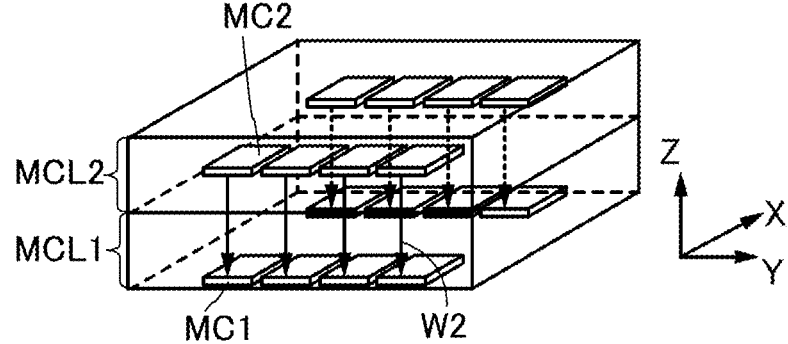

FIG. 16A and FIG. 16B illustrate a structure example of a multiplication cell that is a semiconductor device of one embodiment of the present invention. For example, the multiplication cell executes multiplication with the use of the translinear principle. In addition, the multiplication cell has a function of retaining first data and has a function of outputting the product of the first data and second data when the second data is input to the multiplication cell. Here, the first data corresponds to the weight data W2 illustrated in FIG. 1B, and the second data corresponds to the input data A2 illustrated in FIG. 1B.

A circuit MC illustrated in FIG. 16A includes a transistor M1 to a transistor M10, a capacitor C1, and a capacitor CG. The circuit MC can be functionally divided into a circuit MC1 including the transistor M5 to the transistor M10 and a circuit MC2 including the transistor M1 to the transistor M4 and the capacitor C1. Here, the circuit MC1 corresponds to the analog calculator 102 described in the above embodiments, and the circuit MC2 corresponds to the oxide semiconductor memory 104 described in the above embodiments.

Figure 2B:
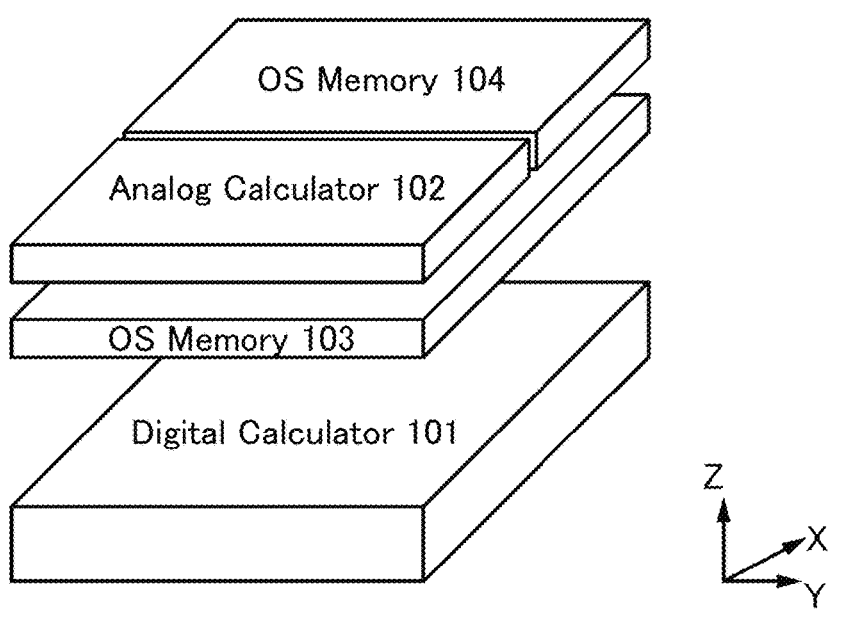

The circuit MC1 and the circuit MC2 can be provided in the same layer like the analog calculator 102 and the oxide semiconductor memory 104 illustrated in FIG. 2A and FIG. 2B. Although a region of the analog calculator 102 and a region of the oxide semiconductor memory 104 are separately illustrated in FIG. 2A and FIG. 2B, this embodiment is not limited thereto; the circuits MC each obtained by combining the circuit MC1 and the circuit MC2 may be arranged in an array.

In the case where the circuits MC are arranged in an array, as illustrated in FIG. 16B, the circuit MC1 may be provided in a layer MCL1 including transistors on the xy plane in the diagram, and the circuit MC2 may be provided in a layer MCL2 including transistors on the xy plane in the diagram. The layer MCL1 and the layer MCL2 each include transistors including an oxide semiconductor in their channel formation regions (OS transistors). The layer MCL1 and the layer MCL2 are provided in different layers in a direction substantially perpendicular to the xy plane (in the z direction in FIG. 16B). With such a structure, as illustrated in FIG. 16B, wirings transmitting the weight data W2 from the circuit MC2 to the circuit MC1 can be shortened. Accordingly, the weight data W2 can be read out at high speed, and power consumption for reading out can be reduced.

OS transistors can be used for example, as the transistor M1 to the transistor M10. In particular, as a metal oxide contained in a channel formation region of the OS transistor, an In-M-Zn oxide containing indium, the element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) or the like is preferably used. For example, transistors containing silicon in a channel formation region (Si transistor) may be used as the transistor M1 to the transistor M10. As the silicon, single crystal silicon, amorphous silicon (referred to as hydrogenated amorphous silicon in some cases), microcrystalline silicon, polycrystalline silicon, or the like can be used, for example. Alternatively, as transistors other than OS transistors and Si transistors, transistors containing Ge or the like in a channel formation region, transistors including a compound semiconductor such as ZnSe, CdS, GaAs, InP, GaN, or SiGe in a channel formation region, transistors including a carbon nanotube in a channel formation region, transistors including an organic semiconductor in a channel formation region, or the like can be used, for example.

The transistor M1, the transistor M3, and the transistor M4 may function as switching elements, for example, unless otherwise specified. That is, voltages in a range where these transistors operate as switching elements may be appropriately input to the gate, the source, and the drain of each of these transistors. However, one embodiment of the present invention is not limited thereto. For example, at least one of these transistors in an on state can operate in a saturation region or a linear region. Alternatively, at least one of the transistor M1, the transistor M3, and the transistor M4 can operate in a subthreshold region in order to reduce the amount of current flowing through these transistors. Alternatively, at least one of the transistor M1, the transistor M3, and the transistor M4 can operate in a linear region, in a saturation region, and in a subthreshold region. Alternatively, at least one of the transistor M1, the transistor M3, and the transistor M4 can operate both in a linear region and in a saturation region, both in a saturation region and in a subthreshold region, or both in a linear region and in a subthreshold region.

In this specification and the like, the saturation region refers to a region where the gate-source voltage is higher than the threshold voltage, and a difference between the gate-source voltage and the threshold voltage is larger than the source-drain voltage. Alternatively, the saturation region refers to a region where a drain current of a transistor is hardly changed even when the source-drain voltage is changed. Alternatively, the saturation region refers to a region where the drain current is proportional to the square of the gate-source voltage. Alternatively, the saturation region includes a region that can be regarded as any region of the above description.

In this specification and the like, the linear region refers to a region where the gate-source voltage is higher than the threshold voltage, and a difference between the gate-source voltage and the threshold voltage is smaller than the source-drain voltage. Alternatively, the linear region refers to a region where the drain current of a transistor behaves so as to be changed linearly because the channel formation region functions as a resistor and the source-drain voltage is changed. Alternatively, the linear region includes a region that can be regarded as any region of the above description.

In this specification and the like, the subthreshold region refers to a region where a gate voltage is lower than the threshold voltage in a graph of gate voltage (Vg)-drain current (Id) characteristics of a transistor. Alternatively, the subthreshold region refers to a region where current flows due to carrier diffusion, which is out of gradual channel approximation (a model in which only a drift current is considered). Alternatively, the subthreshold region refers to a region where a drain current is increased exponentially with respect to an increase in a gate voltage. Alternatively, the subthreshold region includes a region that can be regarded as any region of the above description.

A drain current when the transistor operates in the subthreshold region is referred to as a subthreshold current. The subthreshold current is increased exponentially with respect to the gate voltage, without depending on the drain voltage. The circuit operation using the subthreshold current can reduce the influence of a variation in a drain voltage.

An OS transistor has a drain current per micrometer of channel width of lower than $1\times10^{-20}$ A, lower than $1\times10^{-22}$ A, or lower than $1\times10^{-24}$ A. In addition, in an OS transistor, a drain current per micrometer of channel width of $1.0\times10^{-8}$ A or lower, $1.0\times10^{-12}$ A or lower, or $1.0\times10^{-15}$ A or lower flows with the threshold voltage of the transistor. That is, an OS transistor can have a wide range of the gate voltage where the transistor operates in a subthreshold region. Specifically, when the threshold voltage of an OS transistor is $V_{th}$, a circuit operation using the gate voltage in the voltage range of $V_{th}-1.0$ V to $V_{th}$ inclusive, or $V_{th}-0.5$ V to Vth inclusive, is possible in the subthreshold region.

Meanwhile, a Si transistor has a high off-state current and a narrow range of the gate voltage where the transistor operates in a subthreshold region. In the case of utilizing the subthreshold current, an OS transistor can perform a circuit operation in a wider range of the gate voltage than that of a Si transistor. When an OS transistor operates in a subthreshold region with a low current value, power consumption of the circuit MC can be reduced.

Note that in this specification and the like, an off region of the transistor refers to a region where the gate-source voltage is lower than a voltage in a subthreshold region. When the gate-source voltage of the transistor is in the off region, the transistor is turned off. In this specification and the like, current that flows when the transistor is in an off state is expressed as off-state current or leakage current.

Unless otherwise specified, each of the transistor M2 and the transistor M5 to the transistor M10 may operate in a subthreshold region.

A first terminal of the transistor M1 is electrically connected to a wiring VDE, a second terminal of the transistor M1 is electrically connected to a first terminal of the transistor M2, and a gate of the transistor M1 is electrically connected to a wiring WWLB and a first terminal of the capacitor CG. A first terminal of the transistor M3 is electrically connected to a wiring WDL, and a second terminal of the transistor M3 is electrically connected to a gate of the transistor M2, a second terminal of the capacitor CG, and a first terminal of the capacitor C1. A second terminal of the transistor M2 is electrically connected to a first terminal of the transistor M4, a second terminal of the capacitor C1, a gate of the transistor M5, a first terminal of the transistor M7, and a gate of the transistor M8. A second terminal of the transistor M4 is electrically connected to the wiring VGE, and a gate of the transistor M4 is electrically connected to the wiring WWL. A first terminal of the transistor M5 is electrically connected to the wiring VDE, and a second terminal of the transistor M5 is electrically connected to a first terminal of the transistor M6 and a gate of the transistor M7. A gate of the transistor M6 is electrically connected to a wiring XDL, and a second terminal of the transistor M6 is electrically connected to the wiring VGE. A second terminal of the transistor M7 is electrically connected to the wiring VGE. A first terminal of the transistor M8 is electrically connected to the wiring VDE, and a second terminal of the transistor M8 is electrically connected to a first terminal of the transistor M9 and a gate of the transistor M10. A gate of the transistor M9 is electrically connected to a wiring BDL, and a second terminal of the transistor M9 is electrically connected to the wiring VGE. A first terminal of the transistor M10 is electrically connected to a wiring OL, and a second terminal of the transistor M10 is electrically connected to the wiring VGE.

The wiring VDE functions as a wiring that supplies a constant voltage, for example. The constant voltage can be a high power supply voltage, for example.

The wiring VGE functions as a wiring that supplies a constant voltage, for example. The constant voltage can be a low power supply voltage, or a ground potential, for example.

The wiring WWL functions as a write signal line for writing the first data to the circuit MC, for example.

The wiring WWLB functions as a wiring for transmitting an inverted signal of a writing signal transmitted to the wiring WWL, for example. Note that the wiring WWLB may be a wiring for supplying a variable potential (e.g., a high-level potential or a low level potential) instead of the inverted signal.

The wiring WDL functions as a write data line for writing a voltage corresponding to the first data to the circuit MC, for example.

The wiring XDL functions as a signal line for inputting a voltage corresponding to the second data to the circuit MC, for example.

Thus, the transistor M6 including the gate electrically connected to the wiring XDL functions as a current source. As described above, since the transistor M6 may operate in the subthreshold region, current in the subthreshold region flows between the first terminal and the second terminal of the transistor M6.

The wiring BDL functions as a signal line for inputting a voltage for adjusting the amount of current corresponding to the arithmetic operation result of the first data and the second data to the circuit MC, for example.

Thus, the transistor M9 including the gate electrically connected to the wiring BDL functions as a current source. As described above, since the transistor M9 may operate in the subthreshold region, current in the subthreshold region flows between the first terminal and the second terminal of the transistor M9.

Note that for the amount of current flowing through the transistor M9, for example, a variable, a constant, or the like used in an arithmetic operation according to a function system included in a circuit ACTV described later can be used.

The wiring OL functions as a wiring for outputting current corresponding to the product of the first data and the second data, for example.

Operation Example

Next, an operation example of the circuit MC in FIG. 16A is described. Note that in this operation example, a potential supplied from the wiring VDE is a high power supply potential, and a potential supplied from the wiring VGE is a ground potential (VGND).

<<Writing Operation>>

First, an operation example of writing the first data to the circuit MC is described.

A high-level potential is input to the wiring WWL. Thus, the high-level potential is input to gates of the transistor M3 and the transistor M4, so that the transistor M3 and the transistor M4 are turned on.

At this time, electrical continuity is established between the wiring VGE and the second terminal of the capacitor C1 (the second terminal of the transistor M2) through the transistor M4, so that the potential of the second terminal of the capacitor C1 (the second terminal of the transistor M2) becomes VGND.

At this time, electrical continuity is established also between the wiring WDL and the first terminal of the capacitor C1 (the second terminal of the capacitor CG, the gate of the transistor M2, and the like) through the transistor M3. Here, by transmitting a signal corresponding to the first data to the wiring WDL (hereinafter referred to as voltage VW), the voltage VW corresponding to the first data is written to the first terminal of the capacitor C1 (the second terminal of the capacitor CG, the gate of the transistor M2, and the like).

An inverted signal of a signal transmitted to the wiring WWL is input to the wiring WWLB. Specifically, a low-level potential is input to the wiring WWLB. Thus, the low-level potential is applied to the gate of the transistor M1 (the first terminal of the capacitor CG). Thus, the transistor M1 is turned off.

After the voltage $V_W$ is written to the first terminal of the capacitor C1 (the second terminal of the capacitor CG, the gate of the transistor M2, and the like), a low-level potential is input to the wiring WWL. Thus, the low-level potential is input to the gates of the transistor M3 and the transistor M4, so that the transistor M3 and the transistor M4 are turned off. Accordingly, the first terminal of the capacitor C1 is brought into a floating state, whereby the voltage $V_W$-$V_{GND}$ between the first terminal and the second terminal of the capacitor C1 is retained.

Strictly, when the potential supplied to the gate of the transistor M3 changes from a high-level potential to a low-level potential, the voltage $V_W$ written to the first terminal of the capacitor C1 decreases in some cases due to parasitic capacitance between the gate and the second terminal of the transistor M3. Note that in this specification, the voltage decreases from the voltage $V_W$ due to the parasitic capacitance between the gate and the second terminal of the transistor M3 can also be referred to as a voltage corresponding to the first data, for convenience. In the circuit MC in FIG. 16A, the capacitor CG is provided to prevent the decrease in the voltage $V_W$. When the potential supplied to the gate of the transistor M3 changes from a high-level potential to a low-level potential, that is, when the potential supplied from the wiring WWL changes from a high-level potential to a low-level potential, the potential of the wiring WWLB changes from a low-level potential to a high-level potential since the inverted signal of the signal transmitted to the wiring WWL is input to the wiring WWLB. At this time, the potential of the first terminal of the capacitor CG increases from the low-level potential to the high-level potential, whereby the potential of the second terminal of the capacitor CG (the first terminal of the capacitor C1, the gate of the transistor M2, and the like) ideally increases by a potential difference between the high-level potential and the low-level potential by capacitive coupling of the capacitor CG. Here, the increased potential difference is the same as the potential difference in which the voltage $V_W$ decreases due to the parasitic capacitance between the gate and the second terminal of the transistor M3, whereby the decrease in the voltage $V_W$ when the transistor M3 is turned off can be prevented. Note that the structure of the capacitor CG in which the potential difference increased by the capacitive coupling of the capacitor CG is the same as the potential difference decreased by the parasitic capacitance between the gate and the second terminal of the transistor M3 will be described later.

At this time, instead of the inverted signal of the signal transmitted to the wiring WWL, a low-level potential may be supplied to the wiring WWLB to turn off the transistor M1. Thus, in the circuit MC, the first data can be retained and the supply of a high power supply potential to the first terminal of the transistor M2 can be stopped at the same time.

<<Multiplication Operation>>

Next, a multiplication operation example of the first data and the second data in the circuit MC is described.

Since the transistor M1 is turned on when a high-level potential is input to the wiring WWLB, a high power supply potential is input to the first terminal of the transistor M2, and current corresponding to the voltage between the gate and the second terminal of the transistor M2 flows between the first terminal and the second terminal of the transistor M2. Here, the amount of current flowing between the first terminal and the second terminal of the transistor M2 is $I_W$. Note that in the case where the transistor M2 operates in the subthreshold region, $I_W$ is the amount of current within a current range in the subthreshold region.

The current flowing between the first terminal and the second terminal of the transistor M2 flows to the wiring VGE through the transistor M7. Here, the transistor M7 also operates in the subthreshold region, and current having the amount of current $I_W$ flows between the first terminal and the second terminal of the transistor M7. At this time, the amount of current $I_W$ can be expressed by the following formula.

[Formula 1]

$$I_W = I_0 \exp(J V_{M7gs}) \tag{1.1}$$

Note that $V_{M7gs}$ is a voltage between the gate and the second terminal of the transistor M7. $I_0$ is a value of current flowing when $V_{M7gs}$ is 0 and can be determined by the threshold voltage, the temperature, the device structure, and the like of the transistor M7. J is a correction coefficient determined by the temperature, the device structure, and the like.

$V_X$ is input to the wiring XDL as a voltage corresponding to the second data. At this time, the voltage between the gate and the second terminal of the transistor M6 becomes $V_X - V_{GND}$, and current corresponding to $V_X - V_{GND}$ flows between the first terminal and the second terminal of the transistor M6. Here, the amount of current flowing between the first terminal and the second terminal of the transistor M6 is $I_X$. Note that in the case where the transistor M6 operates in the subthreshold region, $I_X$ is the amount of current within a current range in the subthreshold region.

The current flowing between the first terminal and the second terminal of the transistor M6 flows from the wiring VDE to the first terminal of the transistor M6 through the transistor M5. Here, the transistor M5 also operates in the subthreshold region, and current having the amount of current $I_X$ flows between the first terminal and the second terminal of the transistor M5. At this time, the amount of current $I_X$ can be expressed by the following formula.

[Formula 2]

$$I_X = I_0 \exp(J V_{M5gs}) \tag{1.2}$$

Note that $V_{M5gs}$ is a voltage between the gate and the second terminal of the transistor M5. $I_0$ is a value of current flowing when $V_{M5gs}$ is 0 and can be determined by the threshold voltage, the temperature, the device structure, and the like of the transistor M5. J is a correction coefficient determined by the temperature, the device structure, and the like. Note that $I_0$ and J used in Formula (1.2) are equal to $I_0$ and J used in Formula (1.1).

$V_B$ is input to the wiring BDL as a voltage for adjusting an output current. At this time, the voltage between the gate and the second terminal of the transistor M9 becomes $V_B - V_{GND}$, and current corresponding to $V_B - V_{GND}$ flows between the first terminal and the second terminal of the transistor M9. Here, the amount of current flowing between the first terminal and the second terminal of the transistor M9 is $I_B$. Note that in the case where the transistor M9 operates in the subthreshold region, $I_B$ is the amount of current within a current range in the subthreshold region.

The current flowing between the first terminal and the second terminal of the transistor M9 flows from the wiring VDE to the first terminal of the transistor M9 through the transistor M8. Here, the transistor M8 also operates in the subthreshold region, and current having the amount of current $I_B$ flows between the first terminal and the second terminal of the transistor M8. At this time, the amount of current $I_B$ can be expressed by the following formula.

[Formula 3]

$$I_B = I_0 \exp(J V_{M8gs}) \tag{1.3}$$

Note that $V_{M8gs}$ is a voltage between the gate and the second terminal of the transistor M8. $I_0$ is a value of current flowing when $V_{M5gs}$ is 0 and can be determined by the threshold voltage, the temperature, the device structure, and the like of the transistor M8. J is a correction coefficient determined by the temperature, the device structure, and the like. Note that $I_0$ and J used in Formula (1.3) are equal to $I_0$ and J used in Formula (1.1) and Formula (1.2).

Current flowing between the first terminal and the second terminal of the transistor M10 is determined in accordance with a voltage between the gate and the second terminal of the transistor M10. When the amount of current flowing between the first terminal and the second terminal of the transistor M10 is $I_Y$, the amount of current $I_Y$ can be expressed by the following formula.

[Formula 4]

$$I_Y = I_0 \exp(J V_{M10gs}) \tag{1.4}$$

Note that $V_{M10gs}$ is a voltage between the gate and the second terminal of the transistor M10. $I_0$ is a value of current flowing when $V_{M10gs}$ is 0 and can be determined by the threshold voltage, the temperature, the device structure, and the like of the transistor M10. J is a correction coefficient determined by the temperature, the device structure, and the like. Note that $I_0$ and J used in Formula (1.4) are equal to $I_0$ and J used in Formula (1.1) to Formula (1.3), respectively.

Here, a closed circuit in which the wiring VGE, the second terminal of the transistor M7, the gate of the transistor M7, the second terminal of the transistor M5, the gate of transistor M5, the gate of the transistor M8, the second terminal of the transistor M8, the gate of the transistor M10, the second terminal of the transistor M10, and the wiring VGE are provided in this order is considered. In the closed circuit, the following formula holds according to Kirchhoff s second law (voltage side).

[Formula 5]

$$V_{M5gs} + V_{M7gs} = V_{M8gs} + V_{M10gs} \tag{1.5}$$

The term of each voltage in Formula (1.5) is rewritten using Formula (1.1) to Formula (1.4), so that the following formula is obtained.

[Formula 6]

$$I_Y = \frac{I_W I_X}{I_B} \tag{1.6}$$

That is, the current $I_Y$ flowing between the first terminal and the second terminal of the transistor M10 can be expressed by the product of $I_W$ and $I_X$. Thus, measuring the amount of current $I_Y$ flowing from the wiring OL can calculate a value corresponding to the product of $I_W$ and $I_X$.

Note that the structure of the multiplication cell included in the semiconductor device of one embodiment of the present invention is not limited to the circuit MC illustrated in FIG. 16A. The multiplication cell included in the semiconductor device of one embodiment of the present invention can have a structure in which the circuit MC illustrated in FIG. 16A is changed depending on the situation.

The transistor M1 to the transistor M10 illustrated in FIG. 16A are each an n-channel transistor having a structure including gates over and under a channel, and the transistor M1 to the transistor M10 each include a first gate and a second gate. Note that in this specification and the like, for convenience, the first gate is referred to as a gate (referred to as a front gate in some cases) and the second gate is referred to as a back gate so that they are distinguished from each other, for example; however, the first gate and the second gate can be interchanged with each other. Therefore, in this specification and the like, the term "gate" can be replaced with the term "back gate". Similarly, the term "back gate" can be replaced with the term "gate". As a specific example, a connection structure in which "a gate is electrically connected to a first wiring and a back gate is electrically connected to a second wiring" can be replaced with a connection structure in which "a back gate is electrically connected to a first wiring and a gate is electrically connected to a second wiring".

The semiconductor device of one embodiment of the present invention does not depend on the connection structure of a back gate of a transistor. For the transistor M1 to the transistor M10 illustrated in FIG. 16A, the back gate is illustrated but the connection structure of the back gate is not illustrated; a target to which the back gate is electrically connected can be determined at the design stage. For example, in a transistor including a back gate, a gate and the back gate may be electrically connected to each other to increase the on-state current of the transistor. Alternatively, for example, in a transistor including a back gate, a wiring electrically connected to an external circuit or the like may be provided and a fixed potential or a variable potential may be supplied to the back gate of the transistor by the external circuit or the like to change the threshold voltage of the transistor or to reduce the off-state current of the transistor.

<Structure Examples of Semiconductor Device>

Here, structure examples of a semiconductor device for which the circuit MC illustrated in FIG. 16A can be used is described.

Figure 17A:
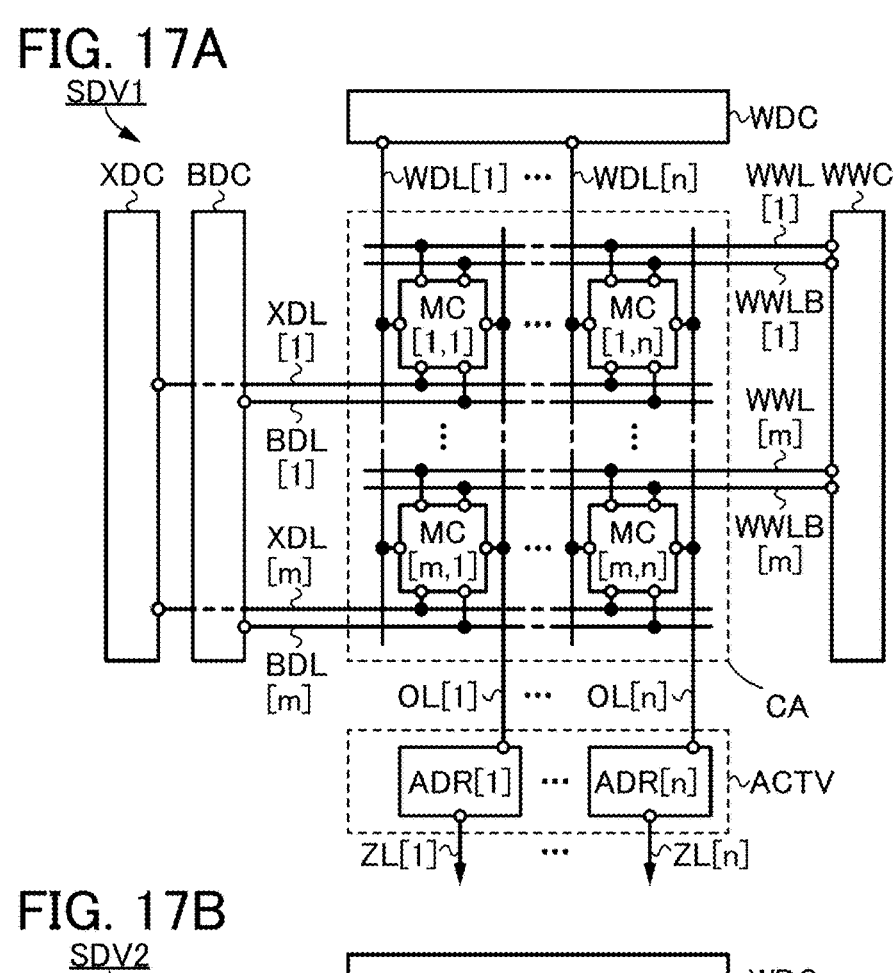
FIG. 17A and FIG. 17B are diagrams illustrating structure examples of semiconductor devices.

FIG. 17A is a circuit diagram illustrating a structure example of the semiconductor device for which the circuit MC in FIG. 16A can be used. A semiconductor device SDV1 illustrated in FIG. 17A includes a circuit WDC, a circuit XDC, a circuit BDC, a circuit WWC, a cell array CA, and the circuit ACTV, for example. The circuit ACTV includes a circuit ADR[1] to a circuit ADR[n], for example.

The cell array CA includes a plurality of circuits MC in FIG. 16A, for example. Specifically, in the cell array CA, the plurality of circuits MC are arranged in a matrix of m rows and n columns (m is an integer greater than or equal to 1 and n is an integer greater than or equal to 1). In the cell array CA, a circuit MC[1,1], a circuit MC[m,1], a circuit MC[1,n], and a circuit MC[m,n] are illustrated as the circuits MC in FIG. 17A, for example.

The circuit MC[1,1] is electrically connected to the wiring WDL[1], a wiring WWL[ ], a wiring WWLB[ ], a wiring XDL[ ], a wiring BDL[ ], and a wiring OL[1]. The circuit MC[m,1] is electrically connected to the wiring WDL[1], a wiring WWL[m], a wiring WWLB[m], a wiring XDL[m], a wiring BDL[m], and the wiring OL[1]. The circuit MC[1,n] is electrically connected to a wiring WDL[n], the wiring WWL[ ], the wiring WWLB[ ], the wiring XDL[ ], the wiring BDL[ ], and a wiring OL[n]. The circuit MC[m,n] is electrically connected to the wiring WDL[n], the wiring WWL[m], the wiring WWLB[m], the wiring XDL[m], the wiring BDL[m], and the wiring OL[n].

That is, when i is an integer greater than or equal to 1 and less than or equal to m and j is an integer greater than or equal to 1 and less than or equal to n, it can be said that the circuit MC[i,j] (not illustrated in FIG. 17A) is electrically connected to a wiring WDL[ ], a wiring WWL[i], a wiring WWLB[i], a wiring XDL[j], a wiring BDL[j], and a wiring OL[j].

Note that the wiring WDL[1] corresponds to the wiring WDL illustrated in FIG. 16A. The wiring WWL[j] corresponds to the wiring WWL illustrated in FIG. 16A, and the wiring WWLB[j] corresponds to the wiring WWLB illustrated in FIG. 16A. The wiring XDL[j] corresponds to the wiring XDL illustrated in FIG. 16A, and the wiring BDL[j] corresponds to the wiring BDL illustrated in FIG. 16A. The wiring OL[j] corresponds to the wiring OL illustrated in FIG. 16A.

The circuit WDC is electrically connected to the wiring WDL[1] to the wiring WDL[n]. The circuit XDC is electrically connected to the wiring XDL[1] to the wiring XDL[m]. The circuit BDC is electrically connected to the wiring BDL[1] to the wiring BDL[m]. The circuit WWC is electrically connected to the wiring WWL[1] to the wiring WWL[m] and the wiring WWLB[1] to the wiring WWLB[m]. The circuit ADR[1] to the circuit ADR[n] are electrically connected to the wiring OL[1] to the wiring OL[n], respectively, and a wiring ZL[1] to a wiring ZL[n], respectively.

The circuit WDC functions as a driver circuit for supplying a voltage, to the wiring WDL[1] to the wiring WDL[n], corresponding to the first data to be written to the circuits MC included in the cell array CA, for example.

The circuit XDC functions as a driver circuit for supplying a voltage, to the wiring XDL[1] to the wiring XDL[m], corresponding to the second data to be input to the circuits MC included in the cell array CA, for example.

For example, the circuit BDC functions as a driver circuit for supplying a voltage to be input to the circuits MC included in the cell array CA, to the wiring BDL[1] to the wiring BDL[m], for adjusting the amount of current flowing through the wiring OL corresponding to the arithmetic result.

The circuit WWC has a function of selecting the circuit MC to which the first data is written for the wiring WWL[1] to the wiring WWL[m] when the first data is written to the circuit MC included in the cell array CA, for example. Specifically, for example, when the first data is written to a circuit MC[i,1] to a circuit MC[i,n] in the i-th row of the cell array CA, the circuit WWC supplies a high-level potential to the wiring WWL[i] and supplies a low-level potential to the wiring WWL[1] to the wiring WWL[m] except the wiring WWL[i], thereby selecting the circuit MC[i,1] to the circuit MC[i,n] to which the first data is to be written.

The circuit WWC has a function of transmitting, to the wiring WWLB[i], an inverted signal of a selection signal transmitted to the wiring WWL[i], for example. The circuit WWC may transmit a different signal to the wiring WWLB[i] instead of the inverted signal. For example, when a low-level potential is input to the wiring WWL[i], the circuit WWC may have a function of inputting a low-level potential also to the wiring WWLB[i]. Thus, in the circuit MC in FIG. 16A, the first data can be retained and the supply of a high power supply potential to the first terminal of the transistor M2 can be stopped at the same time.

When the j-th column of the cell array CA is focused on, the sum of the amounts of current $I_Y$ output from a circuit MC[1,j] to a circuit MC[m,j] flows to the wiring OL. Here, current flowing through the transistor M2 in the circuit MC[i,j] is $I_W[i,j]$, current flowing through the transistor M6 in the circuit MC[i,j] is $I_X[i]$, and the amount of current flowing from the wiring OL to the circuit MC[i,j] is $I_Y[i,j]$. In addition, when the amount of current flowing through the transistor M9 in each of the circuit MC[1,j] to the circuit MC[m,j] is $I_B$, the amount of current $I_S[j]$ flowing through the wiring OL can be expressed by the following formula.

[Formula 7]

$$I_S[j] = \sum_{i=1}^{m} I_Y[i,j] = \frac{1}{I_B} \sum_{i=1}^{m} I_W[i,j] I_X[i] \tag{1.7}$$

The circuit ADR[j] has a function of outputting a voltage corresponding to the amount of current flowing from the wiring OL[j] to the circuit ADR[j], a function of performing an arithmetic operation according to a function system preliminarily defined using the voltage, and a function of outputting a result of the arithmetic operation of the function to the wiring ZL[j], for example.

Figure 17B:
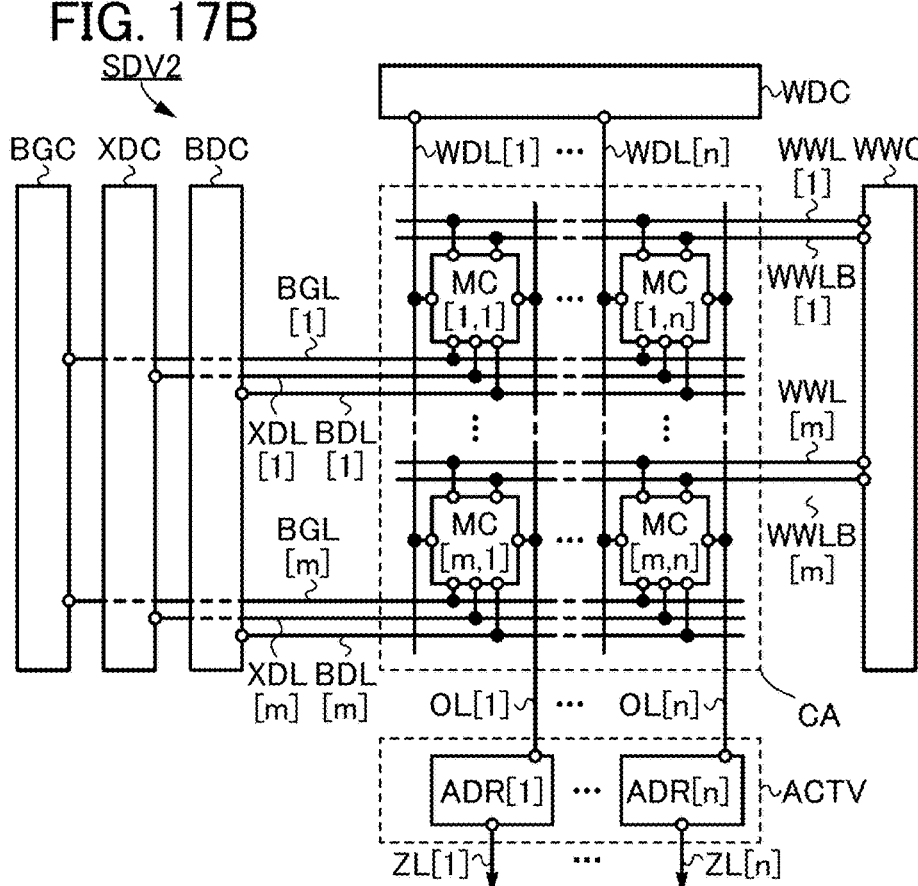

Note that as a semiconductor device SDV2 illustrated in FIG. 17B, a circuit BGC may be provided. The circuit BGC is electrically connected to a wiring BGL[1] to a wiring BGL[m]. The circuit BGC has a function of inputting a desired constant voltage to each of the wiring BGL[1] to the wiring BGL[m], for example. That is, the circuit BGC functions as a circuit for supplying a constant voltage to back gates of the transistors included in the circuit MC[1,1] to the circuit MC [m,n].

As described above, with the use of the circuit MC illustrated in FIG. 16A, a voltage corresponding to the first data can be written to the circuit MC. The circuit MC can output the current $I_Y$ corresponding to the product of the first data and the second data to the wiring OL. With the use of the semiconductor device SDV1 in FIG. 17A or the semiconductor device SDV2 in FIG. 17B, product-sum operation of a plurality of pieces of first data and a plurality of pieces of second data can be performed.

Note that this embodiment can be combined with any of the other embodiments in this specification as appropriate.

Embodiment 4

In this embodiment, an operation example of the case where the accelerator described as the semiconductor device 100 executes part of arithmetic operation of a program executed by the CPU 110 described in the above embodiment is described.

Figure 18:
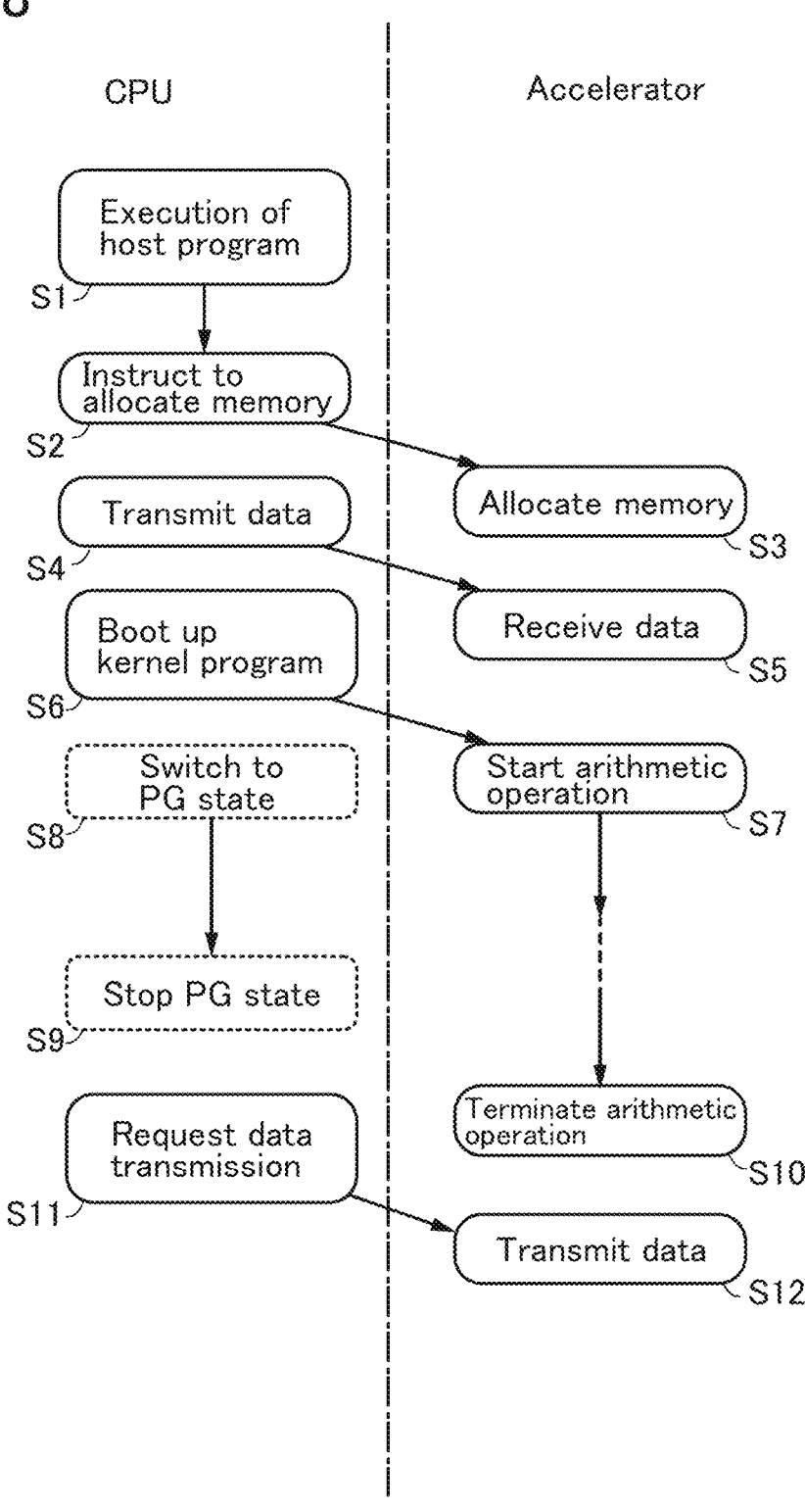
FIG. 18 is a diagram showing a structure example of arithmetic processing system.

FIG. 18 shows an operation example of the case where the accelerator executes part of arithmetic operation of a program executed by the CPU. The accelerator can select the digital calculator 101 or the analog calculator 102 depending on the kind of arithmetic operation.

A host program is executed by the CPU (Execution of the host program; Step S1).

In the case where the CPU confirms an instruction to allocate, to a memory circuit portion, a region for data needed in performing an arithmetic operation using the accelerator (Instruct to allocate memory; Step S2), the CPU allocates the region for the data to the memory circuit portion (Allocate memory; Step S3).

Next, the CPU transmits weight data that is data to be input from the main memory or an external storage device to the memory circuit portion (Transmit data; Step S4). The above-described memory circuit portion receives the weight data and stores the weight data in the region allocated in Step S3 (Receive data; Step S5).

In the case where the CPU confirms an instruction to boot up a kernel program (Boot up kernel program; Step S6), the accelerator starts execution of the kernel program (Start arithmetic operation; Step S7).

Immediately after the accelerator starts the execution of the kernel program, the CPU may be switched from the state of performing arithmetic operation to a PG (power gating) state (Switch to PG state; Step S8). In that case, just before the accelerator terminates the execution of the kernel program, the CPU is switched from the PG state to a state of performing arithmetic operation (Stop PG state; Step S9). By bringing the CPU into the PG state during the period from Step S8 to Step S9, the power consumption and heat generation of the arithmetic processing system as a whole can be inhibited.

When the accelerator terminates the execution of the kernel program, the output data is stored in a storage portion in the accelerator, which retains arithmetic operation results (Terminate arithmetic operation; Step S10).

After the execution of the kernel program is terminated, in the case where the CPU confirms an instruction to transmit the output data stored in the storage portion to the main memory or the external storage device (Request data transmission; Step S11), the above-described output data is transmitted to the main memory or the external storage device and stored in the main memory or the external storage device (Transmit data; Step S12).

By repeating the operations from Step S1 to Step S12 described above, part of the arithmetic operation executed by the CPU can be executed by the accelerator while the power consumption and heat generation of the CPU and the accelerator are inhibited. The semiconductor device of one embodiment of the present invention has a non-von Neumann architecture and can perform arithmetic processing with extremely low power consumption as compared with a von Neumann architecture, in which power consumption increases with increasing processing speed.

This embodiment can be combined with the description of the other embodiments as appropriate.

Embodiment 5

In this embodiment, an example of a CPU including a CPU core capable of power gating is described.

Figure 19:
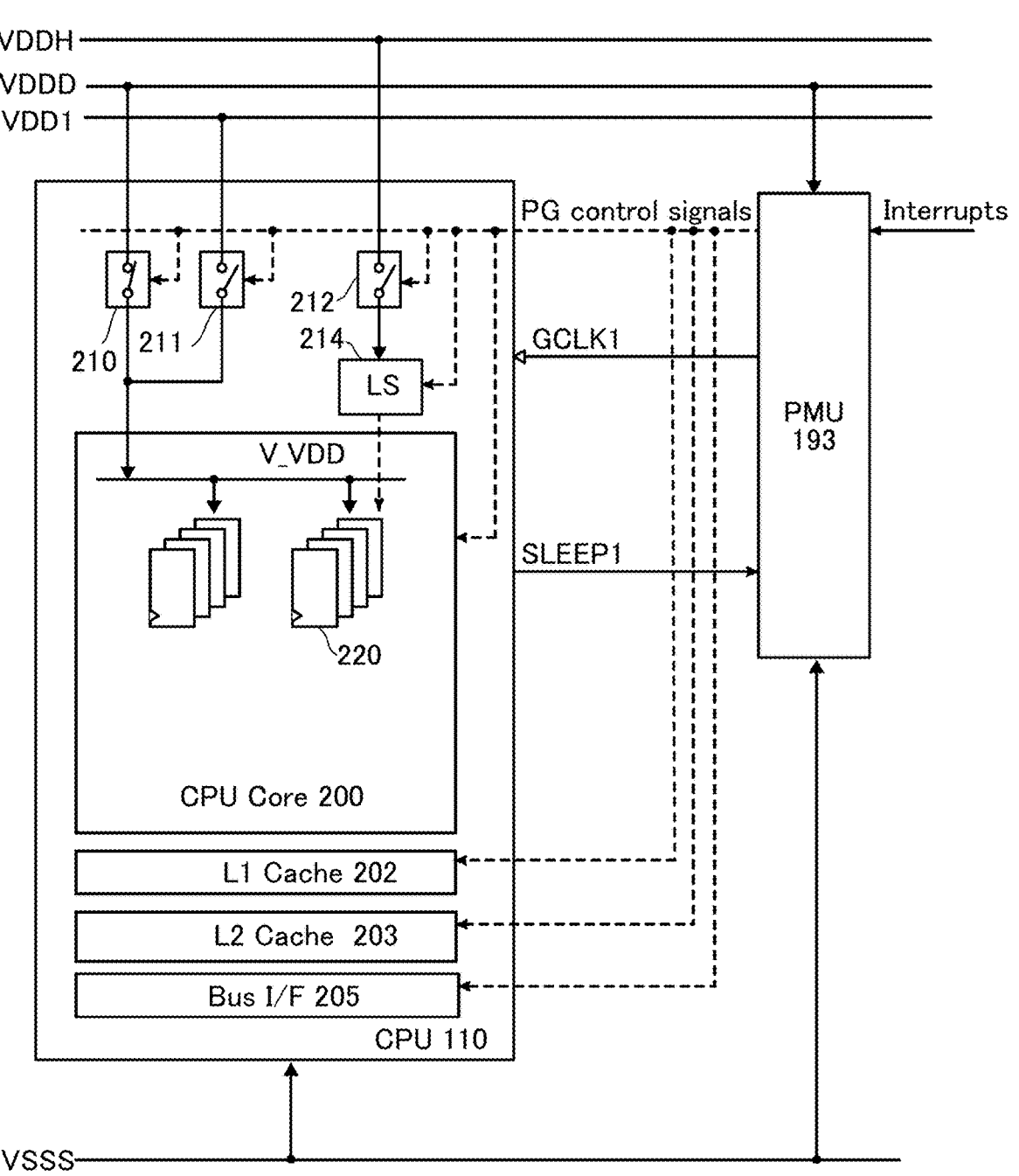
FIG. 19 is a diagram illustrating a structure example of a CPU.

FIG. 19 illustrates a structure example of the CPU 110. The CPU 110 includes the CPU core 200, an L1 (level 1) cache memory device (L1 Cache) 202, an L2 cache memory device (L2 Cache) 203, a bus interface portion (Bus I/F) 205, power switches 210 to 212, and a level shifter (LS) 214. The CPU core 200 includes a flip-flop 220.

Through the bus interface portion 205, the CPU core 200, the L1 cache memory device 202, and the L2 cache memory device 203 are mutually connected to one another.

A PMU 193 generates a clock signal GCLK1 and various PG (power gating) control signals in response to signals such as an interrupt signal (Interrupts) input from the outside and a signal SLEEP1 issued from the CPU 110. The clock signal GCLK1 and the PG control signal are input to the CPU 110. The PG control signal controls the power switches 210 to 212 and the flip-flop 220.

The power switches 210 and 211 control supply of voltages VDDD and VDD1 to a virtual power supply line V_VDD (hereinafter referred to as a V_VDD line), respectively. The power switch 212 controls supply of a voltage VDDH to the level shifter (LS) 214. A voltage VSSS is input to the CPU 110 and the PMU 193 without through the power switches. The voltage VDDD is input to the PMU 193 without through the power switches.

The voltages VDDD and VDD1 are drive voltages for a CMOS circuit. The voltage VDD1 is lower than the voltage VDDD and is a drive voltage in a sleep state. The voltage VDDH is a drive voltage for an OS transistor and is higher than the voltage VDDD.

The L1 cache memory device 202, the L2 cache memory device 203, and the bus interface portion 205 each include at least a power domain capable of power gating. The power domain capable of power gating is provided with one or a plurality of power switches. These power switches are controlled by the PG control signal.

The flip-flop 220 is used for a register. The flip-flop 220 is provided with a backup circuit. The flip-flop 220 is described below.

Figure 20A:
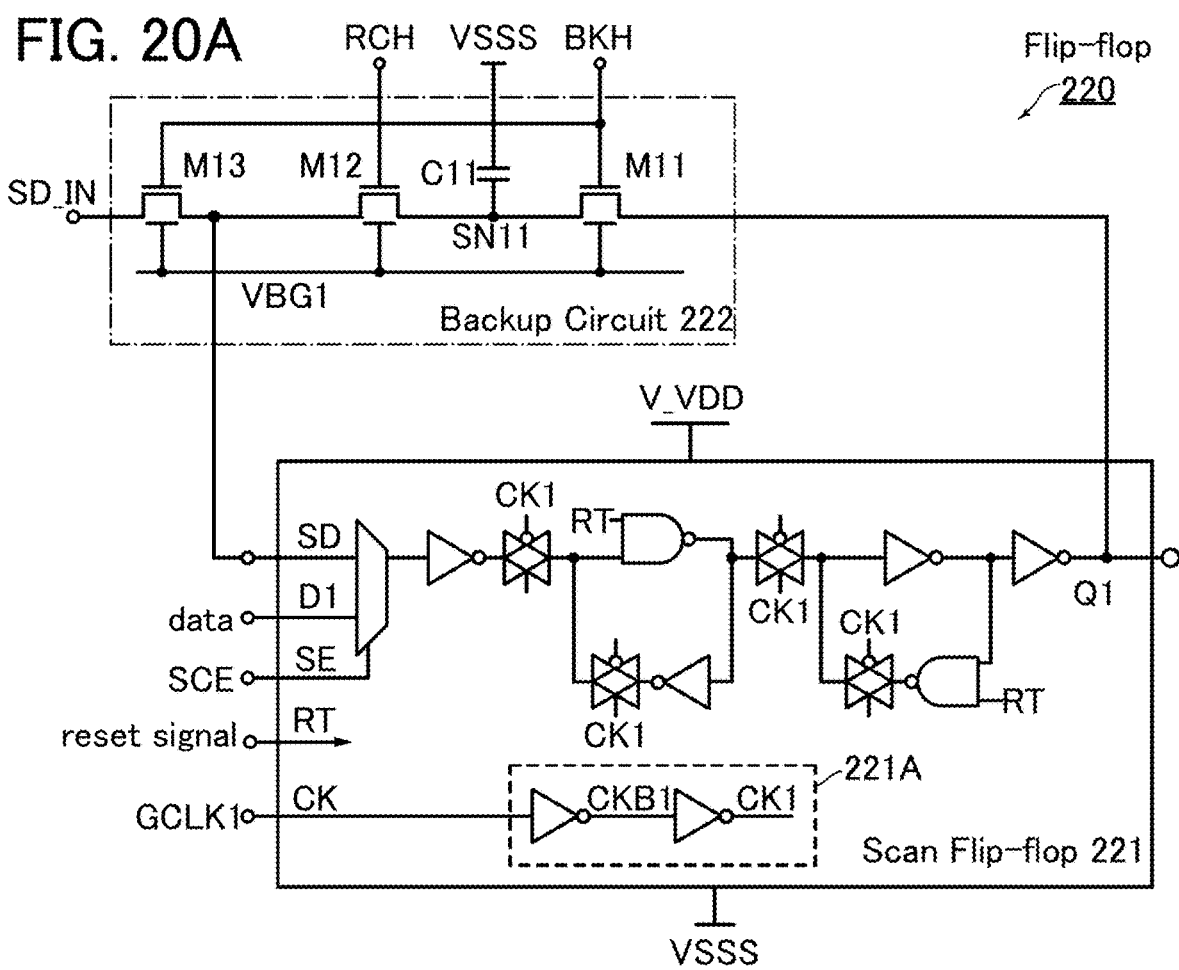
FIG. 20A and FIG. 20B are diagrams illustrating a structure example of a CPU.

FIG. 20A illustrates a circuit structure example of the flip-flop 220. The flip-flop 220 includes a scan flip-flop 221 and a backup circuit 222.

The scan flip-flop 221 includes nodes D1, Q1, SD, SE, RT, and CK and a clock buffer circuit 221A.

The node D1 is a data input node, the node Q1 is a data output node, and the node SD is a scan test data input node. The node SE is a signal SCE input node. The node CK is a clock signal GCLK1 input node. The clock signal GCLK1 is input to the clock buffer circuit 221A. Respective analog switches in the scan flip-flop 221 are connected to nodes CK1 and CKB1 of the clock buffer circuit 221A. The node RT is a reset signal input node.

The signal SCE is a scan enable signal, which is generated in the PMU 193. The PMU 193 generates signals BK and RC. The level shifter 214 level-shifts the signals BK and RC to generate signals BKH and RCH. The signal BK is a backup signal and the signal RC is a recovery signal.

The circuit structure of the scan flip-flop 221 is not limited to that in FIG. 20. A flip-flop prepared in a standard circuit library can be applied.

The backup circuit 222 includes nodes SD_IN and SN11, transistors M11 to M13, and a capacitor C11.

The node SD_IN is a scan test data input node and is connected to the node Q1 of the scan flip-flop 221. The node SN11 is a retention node of the backup circuit 222. The capacitor C11 is a storage capacitor for retaining the voltage of the node SN11.

The transistor M11 controls continuity between the node Q1 and the node SN11. The transistor M12 controls continuity between the node SN11 and the node SD. The transistor M13 controls continuity between the node SD_IN and the node SD. The on/off of the transistors M11 and M13 is controlled by the signal BKH, and the on/off of the transistor M12 is controlled by the signal RCH.

The transistors M11 to M13 are OS transistors like the transistors 61 to 63 included in the above-described memory circuit 21. The transistors M11 to M13 have back gates in the illustrated structure. The back gates of the transistors M11 to M13 are connected to a power supply line for supplying a voltage VBG1.

At least the transistors M11 and M12 are preferably OS transistors. Because of extremely low off-state current, which is a feature of the OS transistor, a decrease in the voltage of the node SN11 can be suppressed and almost no power is consumed to retain data; therefore, the backup circuit 222 has a nonvolatile characteristic. Data is rewritten by charging and discharging of the capacitor C11; hence, there is theoretically no limitation on rewrite cycles of the backup circuit 222, and data can be written and read out with low energy.

Figure 20B:
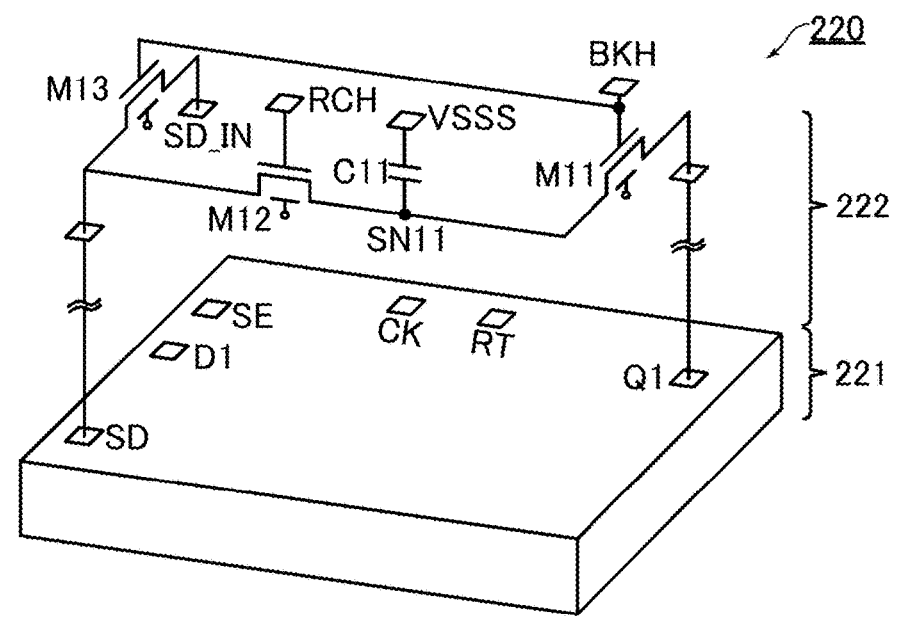

All of the transistors in the backup circuit 222 are extremely preferably OS transistors. As illustrated in FIG. 20B, the backup circuit 222 can be stacked on the scan flip-flop 221 configured with a silicon CMOS circuit.

The number of elements in the backup circuit 222 is much smaller than the number of elements in the scan flip-flop 221; thus, there is no need to change the circuit structure and layout of the scan flip-flop 221 in order to stack the backup circuit 222. That is, the backup circuit 222 is a backup circuit that has very broad utility. In addition, the backup circuit 222 can be provided in a region where the scan flip-flop 221 is formed; thus, even when the backup circuit 222 is incorporated, the area overhead of the flip-flop 220 can be zero. Thus, the backup circuit 222 is provided in the flip-flop 220, whereby power gating of the CPU core 200 is enabled. The power gating of the CPU core 200 is enabled with high efficiency owing to little energy necessary for the power gating.

When the backup circuit 222 is provided, parasitic capacitance due to the transistor M11 is added to the node Q1. However, the parasitic capacitance is lower than parasitic capacitance due to a logic circuit connected to the node Q1; thus, there is no influence of the parasitic capacitance on the operation of the scan flip-flop 221. That is, even when the backup circuit 222 is provided, the performance of the flip-flop 220 does not substantially decrease.

The CPU core 200 can be set to a clock gating state, a power gating state, or a resting state as a low power consumption state. The PMU 193 selects the low power consumption mode of the CPU core 200 on the basis of the interrupt signal, the signal SLEEP1, and the like. For example, in the case of transition from a normal operation state to a clock gating state, the PMU 193 stops generation of the clock signal GCLK1.

For example, in the case of transition from a normal operation state to a resting state, the PMU 193 performs voltage and/or frequency scaling. For example, when the voltage scaling is performed, the PMU 193 turns off the power switch 210 and turns on the power switch 211 to input the voltage VDD1 to the CPU core 200. The voltage VDD1 is a voltage at which data in the scan flip-flop 221 is not lost. When the frequency scaling is performed, the PMU 193 reduces the frequency of the clock signal GCLK1.

In the case where the CPU core 200 transitions from a normal operation state to a power gating state, data in the scan flip-flop 221 is backed up to the backup circuit 222. When the CPU core 200 is returned from the power gating state to the normal operation state, recovery operation of writing back data in the backup circuit 222 to the scan flip-flop 221 is performed.

The backup circuit 222 using an OS transistor is extremely suitable for normally-off computing because both dynamic power consumption and static power consumption are low. Note that the CPU 110 including the CPU core 200 including the backup circuit 222 using an OS transistor can be referred to as NoffCPU (registered trademark). The NoffCPU includes a nonvolatile memory, and power supply to the NoffCPU can be stopped during the time when the NoffCPU does not need to operate. Even when the flip-flop 220 is mounted, a decrease in the performance and an increase in the dynamic power of the CPU core 200 can be made hardly to occur.

Note that the CPU core 200 may include a plurality of power domains capable of power gating. In the plurality of power domains, one or a plurality of power switches for controlling voltage input are provided. In addition, the CPU core 200 may include one or a plurality of power domains where power gating is not performed. For example, the power domain where power gating is not performed may be provided with a power gating control circuit for controlling the flip-flop 220 and the power switches 210 to 212.

Note that the application of the flip-flop 220 is not limited to the CPU 110. In the CPU 110, the flip-flop 220 can be used as the register provided in a power domain capable of power gating.

This embodiment can be combined with the description of the other embodiments as appropriate.

Embodiment 6

This embodiment describes structure examples of the semiconductor device described in the above embodiments and structure examples of transistors that can be used in the semiconductor device described in the above embodiments.

<Structure Example of Semiconductor Device>

Figure 21:
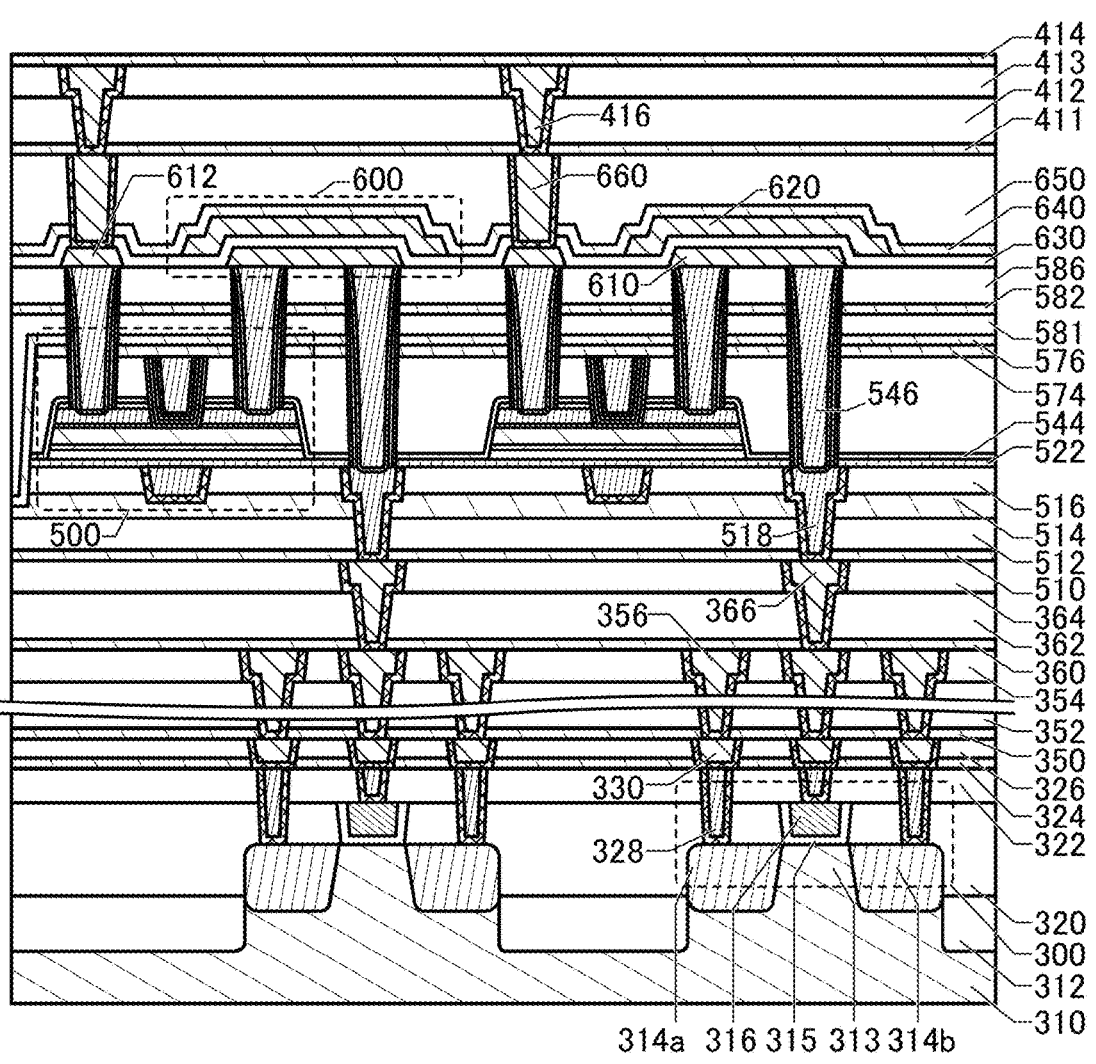
FIG. 21 is a schematic cross-sectional view illustrating a structure example of a semiconductor device.
Figure 22A:
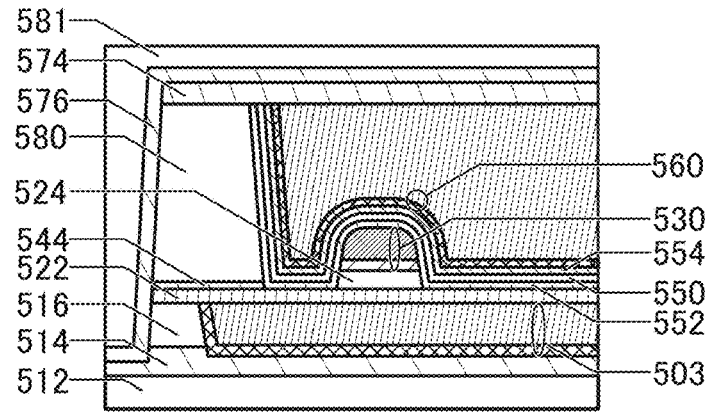
FIG. 22A to FIG. 22C are schematic cross-sectional views illustrating a structure example of a transistor.
Figure 22B:
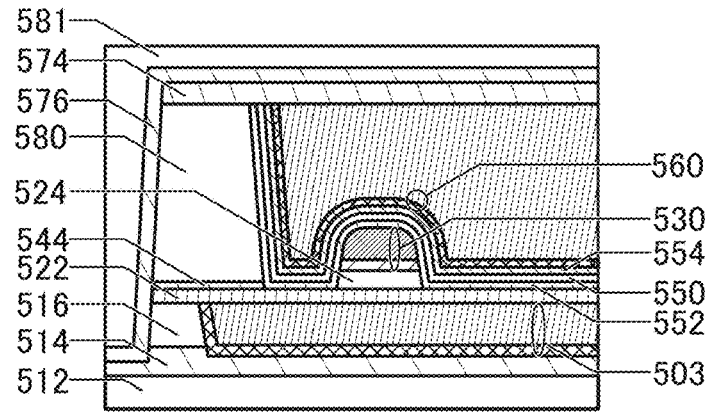
Figure 22C:
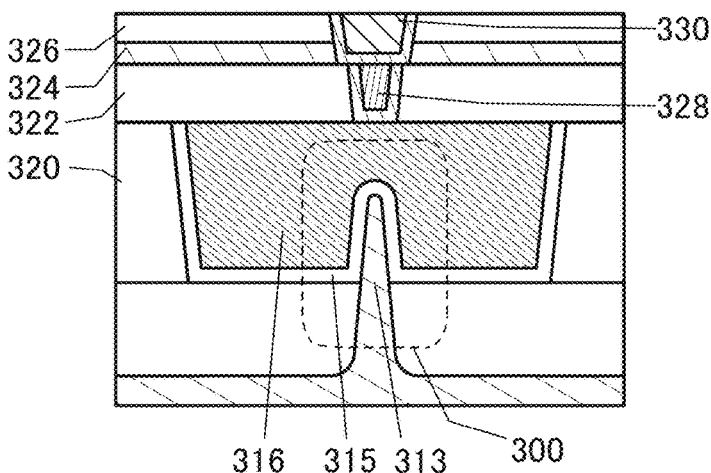

FIG. 21 illustrates an example of the semiconductor device described in the above embodiment, and the semiconductor device includes a transistor 300, a transistor 500, and a capacitor 600. FIG. 22A is a cross-sectional view of the transistor 500 in the channel length direction, FIG. 22B is a cross-sectional view of the transistor 500 in the channel width direction, and FIG. 22C is a cross-sectional view of the transistor 300 in the channel width direction.

The transistor 500 is a transistor containing a metal oxide in a channel formation region (an OS transistor). The transistor 500 has features that the off-state current is low and that the field-effect mobility hardly changes even at high temperatures. The transistor 500 is used as transistors included in the analog calculator 102, the oxide semiconductor memory 103, the oxide semiconductor memory 104, and the like described in the above embodiments, whereby a semiconductor device whose operating performance hardly deteriorates even at high temperatures can be obtained. In particular, when the transistor 500 is used as the transistors included in the oxide semiconductor memory 103 and the oxide semiconductor memory 104, written potentials can be retained for a long time by utilizing the feature of a low off-state current.

The transistor 500 is provided above the transistor 300, for example, and the capacitor 600 is provided above the transistor 300 and the transistor 500, for example. Note that the capacitor 600 can be the capacitor or the like included in the oxide semiconductor memory 103, the oxide semiconductor memory 104, or the like described in the above embodiment. Note that depending on a circuit structure, the capacitor 600 illustrated in FIG. 21 is not necessarily provided.

The transistor 300 is provided on a substrate 310 and includes an element isolation layer 312, a conductor 316, an insulator 315, a semiconductor region 313 that is part of the substrate 310, and a low-resistance region 314a and a low-resistance region 314b functioning as a source region and a drain region. Note that the transistor 300 can be used as, for example, the transistor and the like included in the digital calculator 101 and the like described in the above embodiments. Note that FIG. 21 illustrates a structure in which a gate of the transistor 300 is electrically connected to one of a source and a drain of the transistor 500 through a pair of electrodes of the capacitor 600; however, depending on the structures of the digital calculator 101 and the like, it is possible to employ a structure in which one of a source and a drain of the transistor 300 is electrically connected to one of the source and the drain of the transistor 500 through the pair of electrodes of the capacitor 600, a structure in which one of the source and the drain of the transistor 300 is electrically connected to a gate of the transistor 500 through the pair of electrodes of the capacitor 600, or a structure in which each terminal of the transistor 300 is not electrically connected to each terminal of the transistor 500 or each terminal of the capacitor 600.

With such a structure, an element layer including an OS can be formed over an element layer containing Si as illustrated in FIG. 2A, FIG. 2B, FIG. 3A, and FIG. 3B.

A semiconductor substrate (e.g., a single crystal substrate or a silicon substrate) is preferably used as the substrate 310.

In the transistor 300, a top surface and a side surface in the channel width direction of the semiconductor region 313 are covered with the conductor 316 with the insulator 315 therebetween, as illustrated in FIG. 22C. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 may be either a p-channel transistor or an n-channel transistor.

A region of the semiconductor region 313 where a channel is formed, a region in the vicinity thereof, the low-resistance region 314*a* and the low-resistance region 314*b* functioning as a source region and a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), GaN (gallium nitride), or the like. A structure using silicon whose effective mass is controlled by applying stress to the crystal lattice and changing the lattice spacing may be employed. Alternatively, the transistor 300 may be an HEMT (High Electron Mobility Transistor) with GaAs and GaAlAs, or the like.

The low-resistance region 314*a* and the low-resistance region 314*b* contain an element that imparts n-type conductivity, such as arsenic or phosphorus, or an element that imparts p-type conductivity, such as boron, in addition to the semiconductor material used in the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material containing at least one of titanium nitride, tantalum nitride, and the like for the conductor. Moreover, in order to ensure both conductivity and embeddability, it is preferable to use stacked layers of metal materials containing at least one of tungsten, aluminum, and the like for the conductor, and it is particularly preferable to use tungsten in terms of heat resistance.

The element isolation layer 312 is provided to separate a plurality of transistors on the substrate 310 from each other. The element isolation layer can be formed by, for example, a LOCOS (LOCal Oxidation of Silicon) method, an STI (Shallow Trench Isolation) method, a mesa isolation method, or the like.

Figure 23:
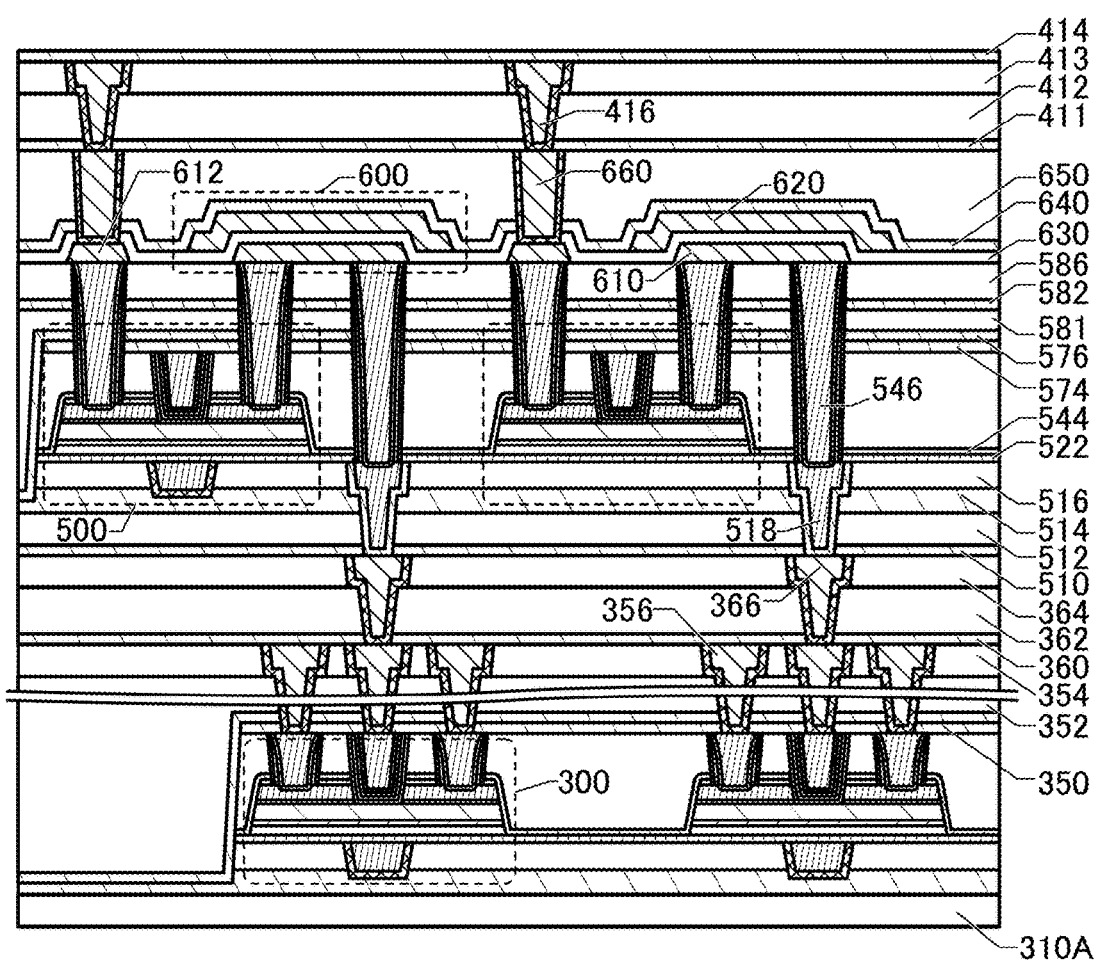
FIG. 23 is a schematic cross-sectional view illustrating a structure example of a semiconductor device.

Note that the transistor 300 illustrated in FIG. 21 is an example and the structure is not limited thereto; an appropriate transistor is used in accordance with a circuit structure or a driving method. For example, the transistor 300 may have a planar structure instead of a FIN-type structure illustrated in FIG. 22C. For example, when a semiconductor device is configured as a single-polarity circuit using only OS transistors, the transistor 300 has a structure similar to that of the transistor 500 using an oxide semiconductor, as illustrated in FIG. 23. Note that the details of the transistor 500 will be described later. In this specification and the like, a single-polarity circuit refers to a circuit including only either n-channel transistors or p-channel transistors.

Note that in FIG. 23, the transistor 300 is provided over a substrate 310A; in this case, a semiconductor substrate may be used as the substrate 310A, as in the case of the substrate 310 in the semiconductor device in FIG. 21. In FIG. 23, in the case where a semiconductor substrate is used as the substrate 310A as in the case of the substrate 310 in the semiconductor device in FIG. 21, the transistor 300 or the like illustrated in FIG. 21 may be formed over the semiconductor substrate. As the substrate 310A, for example, an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper.

With such a structure, an element layer including a second OS can be formed over an element layer including a first OS as illustrated in FIG. 2B, FIG. 3B, FIG. 5B, and FIG. 16B.

In the transistor 300 illustrated in FIG. 21, an insulator 320, an insulator 322, an insulator 324, and an insulator 326 are stacked in this order from the substrate 310 side.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for planarizing a level difference caused by the transistor 300 or the like covered with the insulator 320 and the insulator 322. For example, a top surface of the insulator 322 may be planarized by planarization treatment using a chemical mechanical polishing (CMP) method or the like to improve planarity.

As the insulator 324, it is preferable to use a film having a barrier property that prevents diffusion of impurities such as hydrogen from the substrate 310 or the transistor 300 into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for the interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material containing at least one of tungsten, molybdenum, and the like which has both heat resistance and conductivity, and it is preferable to use tungsten. Alternatively, a low-resistance conductive material containing at least one of aluminum, copper, and the like is preferably used. The use of a low-resistance conductive material can reduce wiring resistance.

A wiring layer may be provided over the insulator 326 and the conductor 330. For example, in FIG. 21, an insulator 350, an insulator 352, and an insulator 354 are provided to be stacked in this order above the insulator 326 and the conductor 330. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against impurities including at least one of water, hydrogen, and the like. The insulator 352 and the insulator 354 are preferably formed using an insulator having a relatively low dielectric constant to reduce the parasitic capacitance generated between wirings, like the insulator 326. Furthermore, the conductor 356 preferably includes a conductor having a barrier property against impurities including at least one of water, hydrogen, and the like. In particular, the conductor having a barrier property against hydrogen is formed in an opening portion included in the insulator 350 having a barrier property against hydrogen. With this structure, the transistor 300 and the transistor 500 can be separated by the barrier layer, so that diffusion of hydrogen from the transistor 300 into the transistor 500 can be inhibited.

Note that for the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is kept. In that case, a structure is preferable in which a tantalum nitride layer having a barrier property against hydrogen is in contact with the insulator 350 having a barrier property against hydrogen.

An insulator 360, an insulator 362, and an insulator 364 are stacked in this order over the insulator 354 and the conductor 356.

Like the insulator 324 or the like, the insulator 360 is preferably formed using an insulator having a barrier property against impurities including at least one of water, hydrogen, and the like. Thus, the insulator 360 can be formed using any of the materials usable for the insulator 324 or the like, for example.

The insulator 362 and the insulator 364 have functions of an interlayer insulating film and a planarization film. Like the insulator 324, the insulator 362 and the insulator 364 are preferably formed using an insulator having a barrier property against impurities including at least one of water, hydrogen, and the like. Thus, the insulator 362 and/or the insulator 364 can be formed using any of the materials usable for the insulator 324.

An opening portion is provided in regions of the insulator 360, the insulator 362, and the insulator 364 that overlap with part of the conductor 356, and the conductor 366 is provided to fill the opening portion. The conductor 366 is also formed over the insulator 362. The conductor 366 has a function of a plug or a wiring connected to the transistor 300, for example. Note that the conductor 366 can be provided using a material similar to those for the conductor 328 and the conductor 330.

An insulator 510, an insulator 512, an insulator 514, and an insulator 516 are stacked in this order over the insulator 364 and the conductor 366. A substance with a barrier property against oxygen or hydrogen is preferably used for any of the insulator 510, the insulator 512, the insulator 514, and the insulator 516.

For example, as the insulator 510 and the insulator 514, it is preferable to use a film having a barrier property that prevents diffusion of impurities such as hydrogen from the substrate 310, a region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents passage of oxygen and impurities such as hydrogen and moisture that would cause a change in the electrical characteristics of the transistor. Accordingly, aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

For the insulator 512 and the insulator 516, a material similar to that for the insulator 320 can be used, for example. Furthermore, when a material with a relatively low permittivity is used for these insulators, parasitic capacitance generated between wirings can be reduced. A silicon oxide film, a silicon oxynitride film, or the like can be used for the insulator 512 and the insulator 516, for example.

A conductor 518, a conductor included in the transistor 500 (e.g., a conductor 503 illustrated in FIG. 22A and FIG. 22B), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, a region of the conductor 518 that is in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, diffusion of hydrogen from the transistor 300 into the transistor 500 can be inhibited.

The transistor 500 is provided above the insulator 516.

As illustrated in FIG. 22A and FIG. 22B, the transistor 500 includes the insulator 516 over the insulator 514, the conductor 503 (a conductor 503a and a conductor 503b) provided to be embedded in the insulator 514 or the insulator 516, an insulator 522 over the insulator 516 and the conductor 503, an insulator 524 over the insulator 522, an oxide 530a over the insulator 524, an oxide 530b over the oxide 530a, a conductor 542a over the oxide 530b, an insulator 571a over the conductor 542a, a conductor 542b over the oxide 530b, an insulator 571b over the conductor 542b, an insulator 552 over the oxide 530b, an insulator 550 over the insulator 552, an insulator 554 over the insulator 550, a conductor 560 (a conductor 560a and a conductor 560b) that is over the insulator 554 and overlaps with part of the oxide 530b, and an insulator 544 provided over the insulator 522, the insulator 524, the oxide 530a, the oxide 530b, the conductor 542a, the conductor 542b, the insulator 571a, and insulator 571b. Here, as illustrated in FIG. 22A and FIG. 22B, the insulator 552 is in contact with a top surface of the insulator 522, a side surface of the insulator 524, a side surface of the oxide 530a, a side surface and a top surface of the oxide 530b, a side surface of the conductor 542, a side surface of the insulator 571, a side surface of the insulator 544, a side surface of an insulator 580, and a bottom surface of the insulator 550. A top surface of the conductor 560 is placed to be substantially level with an upper portion of the insulator 554, an upper portion of the insulator 550, an upper portion of the insulator 552, and a top surface of the insulator 580. An insulator 574 is in contact with part of at least one of the top surface of the conductor 560, the upper portion of the insulator 552, the upper portion of the insulator 550, the upper portion of the insulator 554, and the top surface of the insulator 580.

An opening reaching the oxide 530b is provided in the insulator 580 and the insulator 544. The insulator 552, the insulator 550, the insulator 554, and the conductor 560 are provided in the opening. The conductor 560, the insulator 552, the insulator 550, and the insulator 554 are provided between the conductor 542a and the conductor 542b and between the insulator 571a and the insulator 571b in the channel length direction of the transistor 500. The insulator 554 includes a region in contact with a side surface of the conductor 560 and a region in contact with a bottom surface of the conductor 560.

The oxide 530 preferably includes the oxide 530a provided over the insulator 524 and the oxide 530b provided over the oxide 530a. Including the oxide 530a under the oxide 530b makes it possible to inhibit diffusion of impurities into the oxide 530b from components formed below the oxide 530a.

Although a structure in which two layers, the oxide 530a and the oxide 530b, are stacked as the oxide 530 in the transistor 500 is described, the present invention is not limited thereto. For example, the transistor 500 can include a single-layer structure of the oxide 530b or a stacked-layer structure of three or more layers. Alternatively, the oxide 530a and the oxide 530b can each have a stacked-layer structure.

The conductor 560 functions as a first gate (also referred to as a top gate) electrode, and the conductor 503 functions as a second gate (also referred to as a back gate) electrode. The insulator 552, the insulator 550, and the insulator 554 function as a first gate insulator, and the insulator 522 and the insulator 524 function as a second gate insulator. Note that the gate insulator is also referred to as a gate insulating layer or a gate insulating film in some cases. The conductor 542a functions as one of a source and a drain, and the conductor 542b functions as the other of the source and the drain. At least part of a region of the oxide 530 that overlaps with the conductor 560 functions as a channel formation region.

Figure 24A:
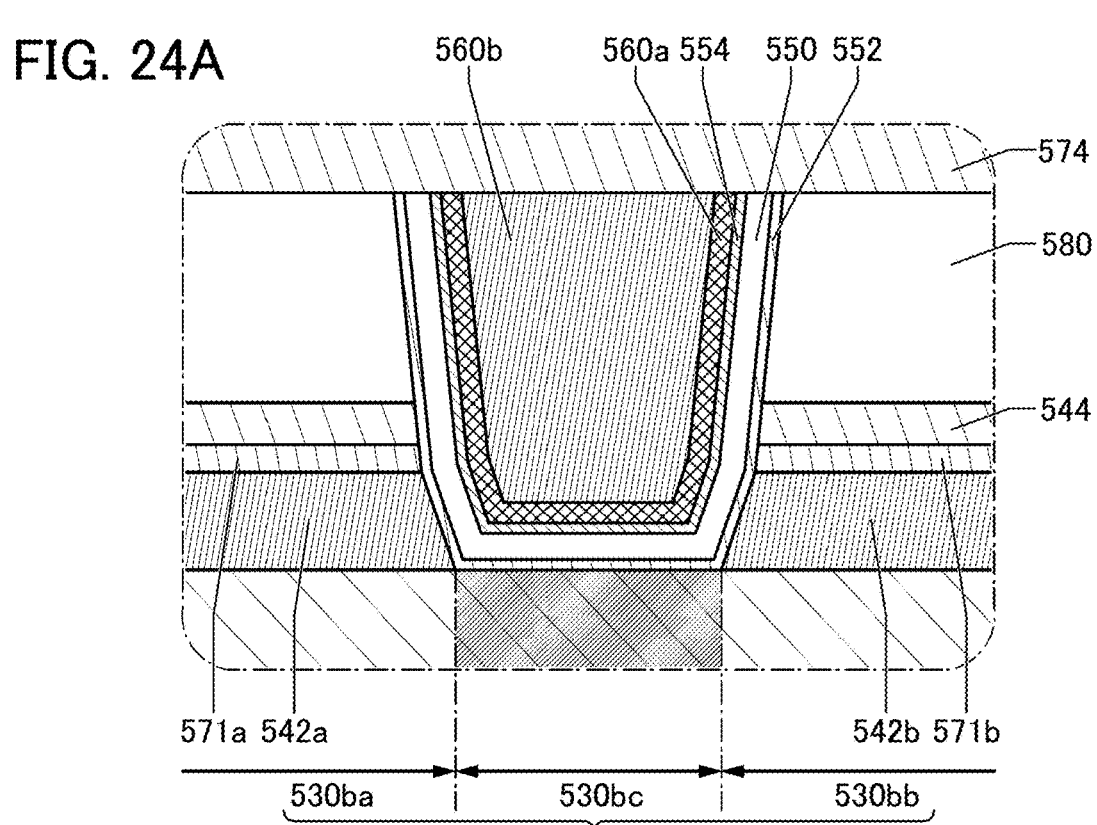
FIG. 24A and FIG. 24B are schematic cross-sectional views illustrating structure examples of a transistor.

Here, FIG. 24A is an enlarged view of the vicinity of the channel formation region in FIG. 22A. Supply of oxygen to the oxide 530b forms the channel formation region in a region between the conductor 542a and the conductor 542b. As illustrated in FIG. 24A, the oxide 530b includes a region 530bc functioning as the channel formation region of the transistor 500 and a region 530ba and a region 530bb that are provided to sandwich the region 530bc and function as a source region and a drain region. At least part of the region 530bc overlaps with the conductor 560. In other words, the region 530bc is provided between the conductor 542a and the conductor 542b. The region 530ba is provided to overlap with the conductor 542a, and the region 530bb is provided to overlap with the conductor 542b.

The region 530bc functioning as the channel formation region has a smaller amount of oxygen vacancies (an oxygen vacancy in a metal oxide is sometimes referred to as $V_O$ in this specification and the like) or a lower impurity concentration than the region 530ba and the region 530bb to be a high-resistance region having a low carrier concentration. Thus, the region 530bc can be regarded as being i-type (intrinsic) or substantially i-type.

A transistor using a metal oxide is likely to change its electrical characteristics when impurities or oxygen vacancies ($V_O$) exist in a region of the metal oxide where a channel is formed, which might degrade the reliability. In some cases, hydrogen in the vicinity of an oxygen vacancy ($V_O$) forms a defect that is an oxygen vacancy ($V_O$) into which hydrogen enters (hereinafter sometimes referred to as $V_OH$), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and VoH are preferably reduced as much as possible in the region of the oxide semiconductor where a channel is formed.

The region 530*ba* and the region 530*bb* functioning as the source region and the drain region are each a low-resistance region with an increased carrier concentration because they include a large amount of oxygen vacancies (Vo) or have a high concentration of an impurity containing at least one of hydrogen, nitrogen, a metal element, and the like. In other words, the region 530*ba* and the region 530*bb* are each an n-type region having a higher carrier concentration and a lower resistance than the region 530*bc*.

The carrier concentration in the region 530*bc* functioning as the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration in the region 530*bc* functioning as the channel formation region is not particularly limited and can be, for example, $1\times10^{-9}$ cm$^{-3}$.

Between the region 530*bc* and the region 530*ba* or the region 530*bb*, a region having a carrier concentration that is lower than or substantially equal to the carrier concentrations in the region 530*ba* and the region 530*bb* and higher than or substantially equal to the carrier concentration in the region 530*bc* may be formed. That is, the region functions as a junction region between the region 530*bc* and the region 530*ba* or the region 530*bb*. The hydrogen concentration in the junction region is lower than or substantially equal to the hydrogen concentrations in the region 530*ba* and the region 530*bb* and higher than or substantially equal to the hydrogen concentration in the region 530*bc* in some cases. The amount of oxygen vacancies in the junction region is smaller than or substantially equal to the amounts of oxygen vacancies in the region 530*ba* and the region 530*bb* and larger than or substantially equal to the amount of oxygen vacancies in the region 530*bc* in some cases.

Although FIG. 24A illustrates an example in which the region 530*ba*, the region 530*bb*, and the region 530*bc* are formed in the oxide 530*b*, the present invention is not limited thereto. For example, the above regions may be formed not only in the oxide 530*b* but also in the oxide 530*a*.

In the oxide 530, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 500, a metal oxide functioning as a semiconductor (such a metal oxide is hereinafter also referred to as an oxide semiconductor) is preferably used for the oxide 530 (the oxide 530*a* and the oxide 530*b*) including the channel formation region.

The metal oxide functioning as a semiconductor preferably has a band gap of 2 eV or more, further preferably 2.5 eV or more. With the use of a metal oxide having such a wide band gap, the off-state current of the transistor can be reduced.

As the oxide 530, it is preferable to use, for example, a metal oxide such as an In-M-Zn oxide containing indium, the element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 530.

Here, the atomic ratio of In to the element M in the metal oxide used as the oxide 530*b* is preferably greater than the atomic ratio of In to the element M in the metal oxide used as the oxide 530*a*.

The oxide 530*a* is provided under the oxide 530*b* in the above manner, whereby impurities and oxygen can be inhibited from diffusing into the oxide 530*b* from components formed below the oxide 530*a*.

When the oxide 530*a* and the oxide 530*b* contain a common element (as the main component) besides oxygen, the density of defect states at an interface between the oxide 530*a* and the oxide 530*b* can be made low. Since the density of defect states at the interface between the oxide 530*a* and the oxide 530*b* can be made low, the influence of interface scattering on carrier conduction is small, and a high on-state current can be obtained.

The oxide 530*b* preferably has crystallinity. It is particularly preferable to use a CAAC-OS (c-axis aligned crystalline oxide semiconductor) as the oxide 530*b*.

The CAAC-OS is a metal oxide having a dense structure with high crystallinity and small amounts of impurities and defects (e.g., oxygen vacancies (Vo). In particular, after the formation of a metal oxide, heat treatment is performed at a temperature at which the metal oxide does not become a polycrystal (e.g., 400° C. to 600° C.), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and has high reliability.

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters (hereinafter sometimes referred to as VoH), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and VoH are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As a countermeasure to the above, an insulator containing oxygen that is released by heating (hereinafter sometimes referred to as excess oxygen) is provided in the vicinity of the oxide semiconductor and heat treatment is performed, so that oxygen can be supplied from the insulator to the oxide semiconductor to reduce oxygen vacancies and VoH. However, supply of an excess amount of oxygen to the source region or the drain region might cause a decrease in the on-state current or field-effect mobility of the transistor 500. Furthermore, a variation of oxygen supplied to the source region or the drain region in the substrate plane leads to a variation in characteristics of the semiconductor device including the transistor.

Therefore, the region 530bc functioning as the channel formation region in the oxide semiconductor is preferably an i-type or substantially i-type region with a reduced carrier concentration, whereas the region 530ba and the region 530bb functioning as the source region and the drain region are preferably n-type regions with high carrier concentrations. That is, it is preferable that oxygen vacancies and VoH in the region 530bc of the oxide semiconductor be reduced and the region 530ba and the region 530bb not be supplied with an excess amount of oxygen.

Thus, in this embodiment, microwave treatment is performed in an oxygen-containing atmosphere in a state where the conductor 542a and the conductor 542b are provided over the oxide 530b so that oxygen vacancies and VoH in the region 530bc can be reduced. Here, the microwave treatment refers to, for example, treatment using an apparatus including a power source that generates high-density plasma with the use of a microwave.

The microwave treatment in an oxygen-containing atmosphere converts an oxygen gas into plasma using a high-frequency wave such as a microwave or RF and activates the oxygen plasma. At this time, the region 530bc can also be irradiated with the high-frequency wave such as a microwave or RF. By the effect of the plasma, a microwave, or the like, VoH in the region 530bc can be cut; thus, hydrogen H can be removed from the region 530bc and an oxygen vacancy Vo can be filled with oxygen. That is, the reaction "VoH→H+Vo" occurs in the region 530bc, so that the hydrogen concentration in the region 530bc can be reduced. As a result, oxygen vacancies and VoH in the region 530bc can be reduced to lower the carrier concentration.

In the microwave treatment in an oxygen-containing atmosphere, the high-frequency wave such as the microwave or RF, the oxygen plasma, or the like is blocked by the conductor 542a and the conductor 542b and does not affect the region 530ba nor the region 530bb. In addition, the effect of the oxygen plasma can be reduced by the insulator 571 and the insulator 580 that are provided to cover the oxide 530b and the conductor 542. Hence, a reduction in VoH and supply of an excess amount of oxygen do not occur in the region 530ba and the region 530bb in the microwave treatment, preventing a decrease in carrier concentration.

Microwave treatment is preferably performed in an oxygen-containing atmosphere after formation of an insulating film to be the insulator 552 or after formation of an insulating film to be the insulator 550. By performing the microwave treatment in an oxygen-containing atmosphere through the insulator 552 or the insulator 550 in such a manner, oxygen can be efficiently supplied into the region 530bc. In addition, the insulator 552 is provided to be in contact with the side surface of the conductor 542 and a surface of the region 530bc, thereby preventing oxygen more than necessary from being supplied to the region 530bc and preventing the side surface of the conductor 542 from being oxidized. Furthermore, the side surface of the conductor 542 can be inhibited from being oxidized when an insulating film to be the insulator 550 is formed.

The oxygen supplied into the region 530bc has any of a variety of forms such as an oxygen atom, an oxygen molecule, and an oxygen radical (an 0 radical, an atom or a molecule having an unpaired electron, or an ion). Note that the oxygen supplied into the region 530bc preferably has any one or more of the above forms, and is particularly preferably an oxygen radical. Furthermore, the film quality of the insulator 552 and the insulator 550 can be improved, leading to higher reliability of the transistor 500.

In the above manner, oxygen vacancies and VoH can be selectively removed from the region 530bc in the oxide semiconductor, whereby the region 530bc can be an i-type or substantially i-type region. Furthermore, supply of an excess amount of oxygen to the region 530ba and the region 530bb functioning as the source region and the drain region can be inhibited and the n-type conductivity can be maintained. As a result, a change in the electrical characteristics of the transistor 500 can be inhibited, and thus a variation in the electrical characteristics of the transistors 500 in the substrate plane can be reduced.

With the above structure, a semiconductor device with a small variation in transistor characteristics can be provided. A semiconductor device with favorable reliability can also be provided. A semiconductor device having favorable electrical characteristics can be provided.

As illustrated in FIG. 22B, a curved surface may be provided between a side surface of the oxide 530b and the top surface of the oxide 530b in a cross-sectional view of the transistor 500 in the channel width direction. In other words, an end portion of the side surface and an end portion of the top surface may be curved (hereinafter also referred to as rounded).

The radius of curvature of the curved surface is preferably greater than 0 nm and less than the thickness of the oxide 530b in a region overlapping with the conductor 542, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 530b with the insulator 552, the insulator 550, the insulator 554, and the conductor 560.

The oxide 530 preferably has a stacked-layer structure of a plurality of oxide layers with different chemical compositions. Specifically, the atomic ratio of the element M to a metal element that is a main component of the metal oxide used as the oxide 530a is preferably greater than the atomic ratio of the element M to a metal element that is a main component of the metal oxide used as the oxide 530b. Moreover, the atomic ratio of the element M to In in the metal oxide used as the oxide 530a is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530a.

The oxide 530b is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 530b by the source electrode or the drain electrode. This can reduce oxygen extraction from the oxide 530b even when heat treatment is performed; thus, the transistor 500 is stable with respect to high temperatures in a manufacturing process (what is called thermal budget).

Here, the conduction band minimum gradually changes at a junction portion of the oxide 530a and the oxide 530b. In other words, the conduction band minimum at the junction portion of the oxide 530a and the oxide 530b continuously changes or is continuously connected. To achieve this, the density of defect states in a mixed layer formed at the interface between the oxide 530a and the oxide 530b is preferably made low.

Specifically, when the oxide 530a and the oxide 530b contain a common element as a main component besides oxygen, a mixed layer with a low density of defect states can be formed. For example, in the case where the oxide 530b is an In-M-Zn oxide, an In-M-Zn oxide, an M-Zn oxide, an oxide of the element M, an In—Zn oxide, an indium oxide, or the like may be used as the oxide 530a.

Specifically, as the oxide 530a, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 530b, a metal oxide with a composition of In:M:Zn=1:1:1 [atomic ratio] or in the neighborhood thereof, or a composition of In:M:Zn=4:2:3 [atomic ratio] or in the neighborhood thereof is used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

As illustrated in FIG. 22A or the like, the insulator 552 formed using aluminum oxide or the like is provided in contact with the top and side surfaces of the oxide 530, whereby indium contained in the oxide 530 is unevenly distributed, in some cases, at the interface between the oxide 530 and the insulator 552 and in its vicinity. Accordingly, the vicinity of the surface of the oxide 530 comes to have an atomic ratio close to that of an indium oxide or that of an In—Zn oxide. Such an increase in the atomic ratio of indium in the vicinity of the surface of the oxide 530, especially the vicinity of the surface of the oxide 530b, can increase the field-effect mobility of the transistor 500.

When the oxide 530a and the oxide 530b have the above structure, the density of defect states at the interface between the oxide 530a and the oxide 530b can be made low. Thus, the influence of interface scattering on carrier conduction is small, and the transistor 500 can have a high on-state current and excellent frequency characteristics.

At least one of the insulator 512, the insulator 514, the insulator 544, the insulator 571, the insulator 574, an insulator 576, and an insulator 581 preferably functions as a barrier insulating film, which inhibits diffusion of impurities such as water and hydrogen from the substrate side or above the transistor 500 into the transistor 500. Thus, for at least one of the insulator 512, the insulator 514, the insulator 544, the insulator 571, the insulator 574, the insulator 576, and the insulator 581, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (an insulating material through which the impurities are less likely to pass). Alternatively, it is preferable to use an insulating material having a function of inhibiting diffusion of oxygen (e.g., at least one of oxygen atoms, oxygen molecules, and the like) (an insulating material through which the oxygen is less likely to pass).

Note that in this specification, a barrier insulating film refers to an insulating film having a barrier property. A barrier property in this specification means a function of inhibiting diffusion of a targeted substance (also referred to as having low permeability). In addition, a barrier property in this specification means a function of capturing and fixing (also referred to as gettering) a targeted substance.

An insulator having a function of inhibiting diffusion of oxygen and impurities such as water and hydrogen is preferably used as the insulator 512, the insulator 514, the insulator 544, the insulator 571, the insulator 574, the insulator 576, and the insulator 581; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 512, the insulator 544, and the insulator 576. For example, aluminum oxide or magnesium oxide, which has a function of capturing or fixing hydrogen well, is preferably used for the insulator 514, the insulator 571, the insulator 574, and the insulator 581. In this case, impurities such as water and hydrogen can be inhibited from diffusing to the transistor 500 side from the substrate side through the insulator 512 and the insulator 514. Impurities such as water and hydrogen can be inhibited from diffusing to the transistor 500 side from an interlayer insulating film and the like which are provided outside the insulator 581. Alternatively, oxygen contained in the insulator 524 and the like can be inhibited from diffusing to the substrate side through the insulator 512 and the insulator 514. Alternatively, oxygen contained in the insulator 580 and the like can be inhibited from diffusing to above the transistor 500 through the insulator 574 and the like. In this manner, it is preferable that the transistor 500 be surrounded by the insulator 512, the insulator 514, the insulator 571, the insulator 544, the insulator 574, the insulator 576, and the insulator 581, which have a function of inhibiting diffusion of oxygen and impurities such as water and hydrogen.

Here, an oxide having an amorphous structure is preferably used for the insulator 512, the insulator 514, the insulator 544, the insulator 571, the insulator 574, the insulator 576, and the insulator 581. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 500 or provided around the transistor 500, hydrogen contained in the transistor 500 or hydrogen present around the transistor 500 can be captured or fixed. In particular, hydrogen contained in the channel formation region of the transistor 500 is preferably captured or fixed. The metal oxide having an amorphous structure is used as the component of the transistor 500 or provided around the transistor 500, whereby the transistor 500 and a semiconductor device, which have favorable characteristics and high reliability, can be manufactured.

Although each of the insulator 512, the insulator 514, the insulator 544, the insulator 571, the insulator 574, the insulator 576, and the insulator 581 preferably has an amorphous structure, a region having a polycrystalline structure may be partly formed. Alternatively, each of the insulator 512, the insulator 514, the insulator 544, the insulator 571, the insulator 574, the insulator 576, and the insulator 581 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 512, the insulator 514, the insulator 544, the insulator 571, the insulator 574, the insulator 576, and the insulator 581 can be deposited by a sputtering method, for example. Since a sputtering method does not need to use a molecule containing hydrogen as a deposition gas, the hydrogen concentrations in the insulator 512, the insulator 514, the insulator 544, the insulator 571, the insulator 574, the insulator 576, and the insulator 581 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like may be used as appropriate.

The resistivities of the insulator 512, the insulator 544, and the insulator 576 are preferably low in some cases. For example, by setting the resistivities of the insulator 512, the insulator 544, and the insulator 576 to approximately $1\times10^{13}$ $\Omega$cm, the insulator 512, the insulator 544, and the insulator 576 can sometimes reduce charge up of the conductor 503, the conductor 542, the conductor 560, or the like in treatment using plasma or the like in the manufacturing process of a semiconductor device. The resistivities of the insulator 512, the insulator 544, and the insulator 576 are preferably higher than or equal to $1\times10^{10}$ $\Omega$cm and lower than or equal to $1\times10^{15}$ $\Omega$cm.

The insulator 516, the insulator 574, the insulator 580, and the insulator 581 each preferably have a lower permittivity than the insulator 514. When a material with a low permittivity is used for an interlayer film, parasitic capacitance generated between wirings can be reduced. For the insulator 516, the insulator 580, and the insulator 581, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The insulator 581 is preferably an insulator functioning as an interlayer film, a planarization film, or the like, for example.

The conductor 503 is provided to overlap with the oxide 530 and the conductor 560. Here, the conductor 503 is preferably provided to be embedded in an opening formed in the insulator 516. Part of the conductor 503 is embedded in the insulator 514 in some cases.

The conductor 503 includes the conductor 503a and the conductor 503b. The conductor 503a is provided in contact with a bottom surface and a sidewall of the opening. The conductor 503b is provided to be embedded in a recessed portion formed in the conductor 503a. Here, the upper portion of the conductor 503b is substantially level with the upper portion of the conductor 503a and the upper portion of the insulator 516.

Here, for the conductor 503a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 503a is formed using a conductive material having a function of inhibiting diffusion of hydrogen, impurities such as hydrogen contained in the conductor 503b can be prevented from diffusing into the oxide 530 through the insulator 524 and the like. When the conductor 503a is formed using a conductive material having a function of inhibiting diffusion of oxygen, the conductivity of the conductor 503b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, a single layer or a stacked layer of the above conductive material is used as the conductor 503a. For example, titanium nitride is used for the conductor 503a.

Moreover, the conductor 503b is preferably formed using a conductive material containing tungsten, copper, or aluminum as its main component. For example, tungsten is used for the conductor 503b.

The conductor 503 sometimes functions as a second gate electrode. In that case, by changing a potential applied to the conductor 503 not in conjunction with but independently of a potential applied to the conductor 560, the threshold voltage ($V_{th}$) of the transistor 500 can be controlled. In particular, Vth of the transistor 500 can be higher in the case where a negative potential is applied to the conductor 503, and the off-state current can be reduced. Thus, drain current at the time when a potential applied to the conductor 560 is 0 V can be lower in the case where a negative potential is applied to the conductor 503 than in the case where the negative potential is not applied to the conductor 503.

The electric resistivity of the conductor 503 is designed in consideration of the potential applied to the conductor 503, and the thickness of the conductor 503 is determined in accordance with the electric resistivity. The thickness of the insulator 516 is substantially equal to that of the conductor 503. The conductor 503 and the insulator 516 are preferably as thin as possible in the allowable range of the design of the conductor 503. When the thickness of the insulator 516 is reduced, the absolute amount of impurities such as hydrogen contained in the insulator 516 can be reduced, reducing the amount of the impurities to be diffused into the oxide 530.

When seen from above, the conductor 503 is preferably provided to be larger than a region of the oxide 530 that does not overlap with the conductor 542a or the conductor 542b. As illustrated in FIG. 22B, it is particularly preferable that the conductor 503 extend to a region outside end portions of the oxide 530a and the oxide 530b in the channel width direction. That is, the conductor 503 and the conductor 560 preferably overlap with each other with the insulators therebetween on the outer side of the side surface of the oxide 530 in the channel width direction. With this structure, the channel formation region of the oxide 530 can be electrically surrounded by the electric field of the conductor 560 functioning as a first gate electrode and the electric field of the conductor 503 functioning as the second gate electrode. In this specification, a transistor structure in which a channel formation region is electrically surrounded by electric fields of a first gate and a second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

Furthermore, as illustrated in FIG. 22B, the conductor 503 is extended to function as a wiring as well. However, without limitation to this structure, a structure in which a conductor functioning as a wiring is provided below the conductor 503 may be employed. In addition, the conductor 503 is not necessarily provided in each transistor. For example, the conductor 503 may be shared by a plurality of transistors.

Although the transistor 500 having a structure in which the conductor 503 is a stack of the conductor 503a and the conductor 503b is illustrated, the present invention is not limited thereto. For example, the conductor 503 may be provided to have a single-layer structure or a stacked-layer structure of three or more layers.

The insulator 522 and the insulator 524 function as a gate insulator.

It is preferable that the insulator 522 have a function of inhibiting diffusion of hydrogen (e.g., at least one of a hydrogen atom, a hydrogen molecule, and the like). In addition, it is preferable that the insulator 522 have a function of inhibiting diffusion of oxygen (e.g., at least one of an oxygen atom, an oxygen molecule, and the like). For example, the insulator 522 preferably has a function of inhibiting diffusion of one or both of hydrogen and oxygen more than the insulator 524.

As the insulator 522, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 to the substrate side and diffusion of impurities such as hydrogen from the periphery of the transistor 500 into the oxide 530. Thus, providing the insulator 522 can inhibit diffusion of impurities such as hydrogen into the transistor 500 and inhibit generation of oxygen vacancies in the oxide 530. Moreover, the conductor 503 can be inhibited from reacting with oxygen contained in the insulator 524 and the oxide 530.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used for the insulator 522.

For example, a single layer or stacked layers of an insulator containing what is called a high-k material such as aluminum oxide, hafnium oxide, tantalum oxide, or zirconium oxide may be used for the insulator 522. As miniaturization and high integration of transistors progress, a problem such as leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate ($SrTiO_3$), or $(Ba,Sr)TiO_3$ (BST) may be used for the insulator 522.

Silicon oxide or silicon oxynitride, for example, can be used as appropriate for the insulator 524 that is in contact with the oxide 530.

In a manufacturing process of the transistor 500, heat treatment is preferably performed with a surface of the oxide 530 exposed. For example, the heat treatment is performed at a temperature higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 530 to reduce oxygen vacancies (Vo). The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment in a nitrogen gas or inert gas atmosphere. Alternatively, the heat treatment may be performed in a nitrogen gas or inert gas atmosphere successively after heat treatment is performed in an atmosphere containing an oxidizing gas at 10 ppm or more, 1% or more, or 10% or more.

Note that oxygen adding treatment performed on the oxide 530 can promote a reaction in which oxygen vacancies in the oxide 530 are repaired with supplied oxygen, i.e., a reaction of "Vo+O→null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of VoH.

Note that the insulator 522 and the insulator 524 may each have a stacked-layer structure of two or more layers. In that case, without limitation to a stacked-layer structure formed of the same material, a stacked-layer structure formed of different materials may be employed. The insulator 524 may be formed into an island shape so as to overlap with the oxide 530a. In this case, the insulator 544 is in contact with the side surface of the insulator 524 and the top surface of the insulator 522.

The conductor 542a and the conductor 542b are provided in contact with the top surface of the oxide 530b. The conductor 542a and the conductor 542b function as a source electrode and a drain electrode of the transistor 500.

For the conductor 542 (the conductor 542a and the conductor 542b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. For another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 530b or the like diffuses into the conductor 542a or the conductor 542b in some cases. In particular, when a nitride containing tantalum is used for the conductor 542a and the conductor 542b, hydrogen contained in the oxide 530b or the like is likely to diffuse into the conductor 542a or the conductor 542b, and the diffused hydrogen is bonded to nitrogen contained in the conductor 542a or the conductor 542b in some cases. That is, hydrogen contained in the oxide 530b or the like is absorbed by the conductor 542a or the conductor 542b in some cases.

No curved surface is preferably formed between the side surface of the conductor 542 and a top surface of the conductor 542. When no curved surface is formed in the conductor 542, the conductor 542 can have a large cross-sectional area in the channel width direction. Accordingly, the conductivity of the conductor 542 is increased, so that the on-state current of the transistor 500 can be increased.

The insulator 571a is provided in contact with a top surface of the conductor 542a, and the insulator 571b is provided in contact with a top surface of the conductor 542b. The insulator 571 preferably functions as at least a barrier insulating film against oxygen. Thus, the insulator 571 preferably has a function of inhibiting oxygen diffusion. For example, the insulator 571 preferably has a function of inhibiting diffusion of oxygen more than the insulator 580. For example, a nitride containing silicon such as silicon nitride may be used for the insulator 571. The insulator 571 preferably has a function of capturing impurities such as hydrogen. In that case, for the insulator 571, a metal oxide having an amorphous structure, for example, an insulator such as aluminum oxide or magnesium oxide, may be used. It is particularly preferable to use aluminum oxide having an amorphous structure or amorphous aluminum oxide for the insulator 571 because hydrogen can be captured or fixed more effectively in some cases. Accordingly, the transistor 500 and a semiconductor device, which have favorable characteristics and high reliability, can be manufactured.

The insulator 544 is provided to cover the insulator 524, the oxide 530a, the oxide 530b, the conductor 542, and the insulator 571. The insulator 544 preferably has a function of capturing and fixing hydrogen. In that case, the insulator 544 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 544.

When the above insulator 571 and the insulator 544 are provided, the conductor 542 can be surrounded by the insulators having a barrier property against oxygen. That is, oxygen contained in the insulator 524 and the insulator 580 can be prevented from diffusing into the conductor 542. As a result, the conductor 542 can be inhibited from being directly oxidized by oxygen contained in the insulator 524 and the insulator 580, so that an increase in resistivity and a reduction in on-state current can be inhibited.

The insulator 552 functions as part of the gate insulator. As the insulator 552, a barrier insulating film against oxygen is preferably used. As the insulator 552, an insulator that can be used as the insulator 574 described above may be used. An insulator containing an oxide of one or both of aluminum and hafnium is preferably used as the insulator 552. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 552. In this case, the insulator 552 is an insulator containing at least oxygen and aluminum.

As illustrated in FIG. 22B, the insulator 552 is provided in contact with the top surface and the side surface of the oxide 530b, the side surface of the oxide 530a, the side surface of the insulator 524, and the top surface of the insulator 522. That is, the regions of the oxide 530a, the oxide 530b, and the insulator 524 that overlap with the conductor 560 are covered with the insulator 552 in the cross section in the channel width direction. With this structure, the insulator 552 having a barrier property against oxygen can prevent release of oxygen from the oxide 530a and the oxide 530b at the time of heat treatment or the like. This can inhibit formation of oxygen vacancies (Vo) in the oxide 530a and the oxide 530b. Therefore, oxygen vacancies (Vo) and VoH formed in the region 530bc can be reduced. Thus, the transistor 500 can have favorable electrical characteristics and higher reliability.

Even when an excess amount of oxygen is contained in the insulator 580, the insulator 550, and the like, oxygen can be inhibited from being excessively supplied to the oxide 530a and the oxide 530b. Thus, the region 530ba and the region 530bb are prevented from being excessively oxidized by oxygen through the region 530bc; a reduction in on-state current or field-effect mobility of the transistor 500 can be inhibited.

As illustrated in FIG. 22A, the insulator 552 is provided in contact with the side surfaces of the conductor 542, the insulator 571, the insulator 544, and the insulator 580. This can inhibit formation of an oxide film on the side surface of the conductor 542 by oxidization of the side surface. Accordingly, a reduction in on-state current or field-effect mobility of the transistor 500 can be inhibited.

Furthermore, the insulator 552 needs to be provided in an opening formed in the insulator 580 and the like, together with the insulator 554, the insulator 550, and the conductor 560. The thickness of the insulator 552 is preferably small for miniaturization of the transistor 500. The thickness of the insulator 552 is preferably greater than or equal to 0.1 nm, greater than or equal to 0.5 nm, or greater than or equal to 1.0 nm, and less than or equal to 1.0 nm, less than or equal to 3.0 nm, or less than or equal to 5.0 nm. Note that the above-described lower limits and upper limits can be combined with each other. In that case, at least part of the insulator 552 includes a region having the above-described thickness. The thickness of the insulator 552 is preferably smaller than that of the insulator 550. In that case, at least part of the insulator 552 includes a region having a thickness smaller than that of the insulator 550.

To form the insulator 552 having a small thickness as described above, an ALD method is preferably used for deposition. Examples of an ALD method include a thermal ALD method, in which a precursor and a reactant react with each other only by thermal energy, and a PEALD (Plasma Enhanced ALD) method, in which a reactant excited by plasma is used. The use of plasma in a PEALD method is sometimes preferable because deposition at a lower temperature is possible.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition. Therefore, the insulator 552 can be formed on the side surface of the opening formed in the insulator 580 and the like to have a small thickness as described above and to have favorable coverage.

Note that some of precursors usable in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS) or X-ray photo-electron spectroscopy (XPS).

The insulator 550 functions as part of the gate insulator. The insulator 550 is preferably provided in contact with a top surface of the insulator 552. The insulator 550 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. The insulator 550 in this case is an insulator containing at least oxygen and silicon.

As in the insulator 524, the concentration of impurities such as water and hydrogen in the insulator 550 is preferably reduced. The thickness of the insulator 550 is preferably greater than or equal to 1 nm or greater than or equal to 0.5 nm and less than or equal to 15.0 nm or less than or equal to 20 nm. Note that the above-described lower limits and upper limits can be combined with each other. In that case, at least part of the insulator 550 includes a region having the above-described thickness.

Although FIG. 22A, FIG. 22B, and the like illustrate a single-layer structure of the insulator 550, the present invention is not limited to this structure, and a stacked-layer structure of two or more layers may be employed. For example, as illustrated in FIG. 24B, the insulator 550 may have a stacked-layer structure including two layers of an insulator 550a and an insulator 550b over the insulator 550a.

Figure 24B:
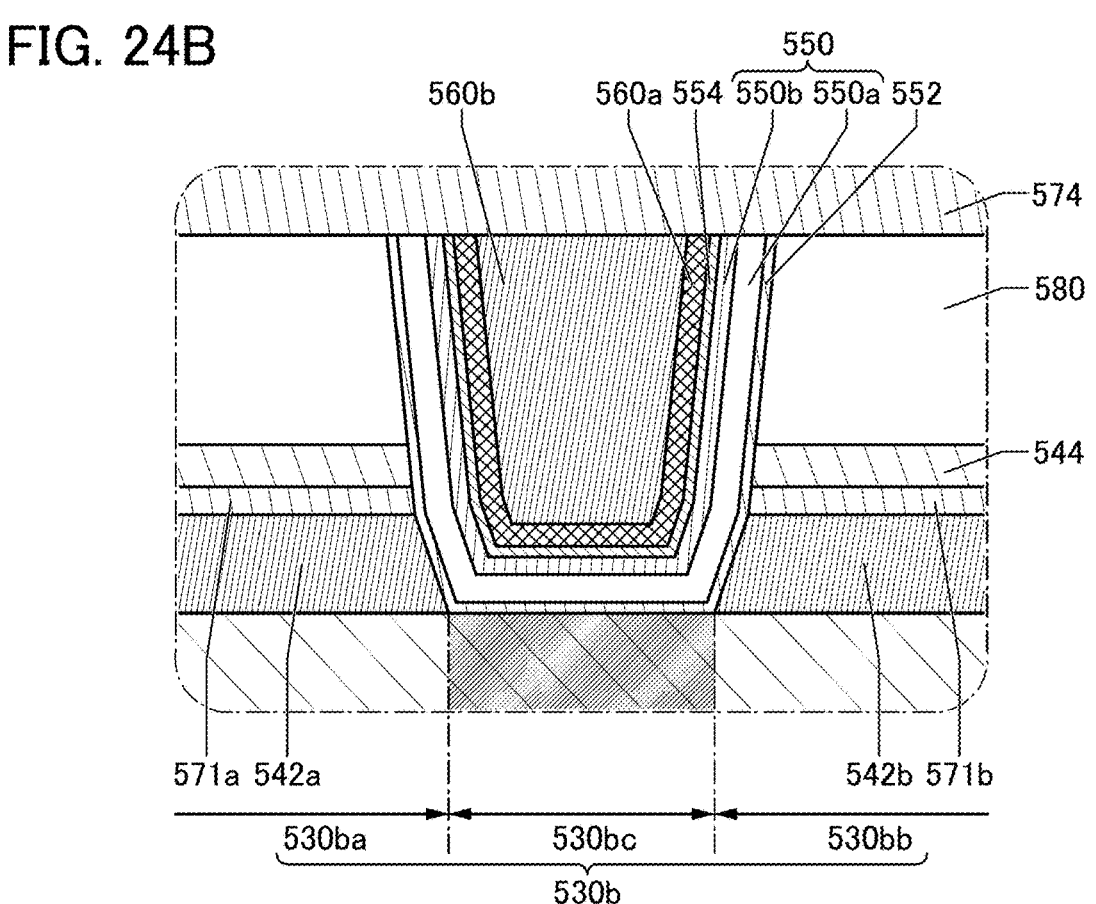

In the case where the insulator 550 has a stacked-layer structure of two layers as illustrated in FIG. 24B, it is preferable that the insulator 550a in a lower layer be formed using an insulator that is likely to transmit oxygen and the insulator 550b in an upper layer be formed using an insulator having a function of inhibiting oxygen diffusion. With such a structure, oxygen contained in the insulator 550a can be inhibited from diffusing into the conductor 560. That is, a reduction in the amount of oxygen supplied to the oxide 530 can be inhibited. In addition, oxidation of the conductor 560 due to oxygen contained in the insulator 550a can be inhibited. For example, it is preferable that the insulator 550a be provided using any of the above-described materials that can be used for the insulator 550 and the insulator 550b be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 550b. In this case, the insulator 550b is an insulator containing at least oxygen and hafnium. The thickness of the insulator 550b is preferably greater than or equal to 0.5 nm or greater than or equal to 1.0 nm, and less than or equal to 3.0 nm or less than or equal to 5.0 nm. Note that the above-described lower limits and upper limits can be combined with each other. In that case, at least part of the insulator 550b includes a region having the above-described thickness.

In the case where silicon oxide, silicon oxynitride, or the like is used for the insulator 550a, the insulator 550b may be formed using an insulating material that is a high-k material having a high dielectric constant. The gate insulator having a stacked-layer structure of the insulator 550a and the insulator 550b can be thermally stable and can have a high dielectric constant. Thus, a gate potential that is applied during the operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 550 can be increased.

The insulator 554 functions as part of a gate insulator. As the insulator 554, a barrier insulating film against hydrogen is preferably used. This can prevent diffusion of impurities such as hydrogen contained in the conductor 560 into the insulator 550 and the oxide 530b. As the insulator 554, an insulator that can be used as the insulator 576 described above may be used. For example, silicon nitride deposited by a PEALD method may be used as the insulator 554. In this case, the insulator 554 is an insulator containing at least nitrogen and silicon.

Furthermore, the insulator 554 may have a barrier property against oxygen. Thus, diffusion of oxygen contained in the insulator 550 into the conductor 560 can be inhibited.

Furthermore, the insulator 554 needs to be provided in an opening formed in the insulator 580 and the like, together with the insulator 552, the insulator 550, and the conductor 560. The thickness of the insulator 554 is preferably small for miniaturization of the transistor 500. The thickness of the insulator 554 is preferably greater than or equal to 0.1 nm, greater than or equal to 0.5 nm, or greater than or equal to 1.0 nm, and less than or equal to 3.0 nm or less than or equal to 5.0 nm. Note that the above-described lower limits and upper limits can be combined with each other. In that case, at least part of the insulator 554 includes a region having the above-described thickness. The thickness of the insulator 554 is preferably smaller than that of the insulator 550. In that case, at least part of the insulator 554 includes a region having a thickness smaller than that of the insulator 550.

The conductor 560 functions as the first gate electrode of the transistor 500. The conductor 560 preferably includes the conductor 560a and the conductor 560b provided over the conductor 560a. For example, the conductor 560a is preferably provided to cover a bottom surface and a side surface of the conductor 560b. As illustrated in FIG. 22A and FIG. 22B, the upper portion of the conductor 560 is substantially level with the upper portion of the insulator 550. Note that although the conductor 560 has a two-layer structure of the conductor 560a and the conductor 560b in FIG. 22A and FIG. 22B, the conductor 560 can have a single-layer structure or a stacked-layer structure of three or more layers.

For the conductor 560a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 560a has a function of inhibiting diffusion of oxygen, the conductivity of the conductor 560b can be inhibited from being lowered because of oxidation due to oxygen contained in the insulator 550. As the conductive material having a function of inhibiting diffusion of oxygen, for example, titanium, titanium nitride, tantalum, tantalum nitride, ruthenium, or ruthenium oxide is preferably used.

Furthermore, the conductor 560 also functions as a wiring and thus is preferably a conductor having high conductivity. For example, a conductive material containing tungsten, copper, or aluminum as its main component can be used for the conductor 560b. The conductor 560b can have a stacked-layer structure. Specifically, for example, the conductor 560b can contain titanium or titanium nitride and the above conductive material.

In the transistor 500, the conductor 560 is formed in a self-aligned manner to fill the opening formed in the insulator 580 and the like. The formation of the conductor 560 in this manner allows the conductor 560 to be placed properly in a region between the conductor 542a and the conductor 542b without alignment.

As illustrated in FIG. 22B, in the channel width direction of the transistor 500, with reference to a bottom surface of the insulator 522, the level of the bottom surface of the conductor 560 in a region where the conductor 560 and the oxide 530*b* do not overlap with each other is preferably lower than the level of a bottom surface of the oxide 530*b*. When the conductor 560 functioning as the gate electrode covers the side surface and the top surface of the channel formation region of the oxide 530*b* with the insulator 550 and the like therebetween, the electric field of the conductor 560 can easily act on the entire channel formation region of the oxide 530*b*. Thus, the on-state current of the transistor 500 can be increased and the frequency characteristics of the transistor 500 can be improved. The difference between the level of the bottom surface of the conductor 560 in a region where the oxide 530*a* and the oxide 530*b* do not overlap with the conductor 560 and the level of the bottom surface of the oxide 530*b*, with reference to the bottom surface of the insulator 522, is preferably greater than or equal to 0 nm, greater than or equal to 3 nm, or greater than or equal to 5 nm, and less than or equal to 20 nm, less than or equal to 50 nm, or less than or equal to 100 nm. Note that the above-described lower limits and upper limits can be combined with each other.

The insulator 580 is provided over the insulator 544, and the opening is formed in a region where the insulator 550 and the conductor 560 are to be provided. In addition, the top surface of the insulator 580 may be planarized.

The insulator 580 functioning as an interlayer film preferably has a low permittivity. When a material with a low permittivity is used for an interlayer film, parasitic capacitance generated between wirings can be reduced. The insulator 580 is preferably provided using a material similar to that for the insulator 516, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The concentration of impurities such as water and hydrogen in the insulator 580 is preferably reduced. An oxide containing silicon, such as silicon oxide or silicon oxynitride, is used as appropriate for the insulator 580, for example.

The insulator 574 preferably functions as a barrier insulating film that inhibits impurities such as water and hydrogen from diffusing into the insulator 580 from above and preferably has a function of capturing impurities such as hydrogen. The insulator 574 preferably functions as a barrier insulating film that inhibits passage of oxygen. For the insulator 574, a metal oxide having an amorphous structure, for example, an insulator such as aluminum oxide, can be used. In this case, the insulator 574 is an insulator containing at least oxygen and aluminum. The insulator 574, which has a function of capturing impurities such as hydrogen, is provided in contact with the insulator 580 in a region sandwiched between the insulator 512 and the insulator 581, whereby impurities such as hydrogen contained in the insulator 580 and the like can be captured and the amount of hydrogen in the region can be constant. It is particularly preferable to use aluminum oxide having an amorphous structure for the insulator 574, in which case hydrogen can sometimes be captured or fixed more effectively. Accordingly, the transistor 500 and a semiconductor device, which have favorable characteristics and high reliability, can be manufactured.

The insulator 576 functions as a barrier insulating film that inhibits impurities such as water and hydrogen from diffusing into the insulator 580 from above. The insulator 576 is provided over the insulator 574. The insulator 576 is preferably formed using a nitride containing silicon such as silicon nitride or silicon nitride oxide. For example, silicon nitride deposited by a sputtering method is used for the insulator 576. When the insulator 576 is deposited by a sputtering method, a high-density silicon nitride film can be formed. To obtain the insulator 576, silicon nitride deposited by a PEALD method or a CVD method may be stacked over silicon nitride deposited by a sputtering method.

One of a first terminal and a second terminal of the transistor 500 is electrically connected to a conductor 540*a* serving as a plug, and the other of the first terminal and the second terminal of the transistor 500 is electrically connected to a conductor 540*b*. Note that in this specification and the like, the conductor 540*a* and the conductor 540*b* are collectively referred to as the conductor 540.

The conductor 540*a* is provided in a region overlapping with the conductor 542*a*, for example. Specifically, an opening portion is formed in the insulator 571, the insulator 544, the insulator 580, the insulator 574, the insulator 576, and the insulator 581 illustrated in FIG. 22A and in an insulator 582 and an insulator 586 illustrated in FIG. 21 in the region overlapping with the conductor 542*a*, and the conductor 540*a* is provided inside the opening portion. The conductor 540*b* is provided in a region overlapping with the conductor 542*b*, for example. Specifically, an opening portion is formed in the insulator 571, the insulator 544, the insulator 580, the insulator 574, the insulator 576, and the insulator 581 illustrated in FIG. 22A and in the insulator 582 and the insulator 586 illustrated in FIG. 21 in the region overlapping with the conductor 542*b*, and the conductor 540*b* is provided inside the opening portion. Note that the insulator 582 and the insulator 586 will be described later.

As illustrated in FIG. 22A, an insulator 541*a* as an insulator having an impurity barrier property may be provided between the conductor 540*a* and the side surface of the opening portion in the region overlapping with the conductor 542*a*. Similarly, an insulator 541*b* as an insulator having an impurity barrier property may be provided between the conductor 540*b* and the side surface of the opening portion in the region overlapping with the conductor 542*b*. Note that in this specification and the like, the insulator 541*a* and the insulator 541*b* are collectively referred to as the insulator 541.

For the conductor 540*a* and the conductor 540*b*, a conductive material containing tungsten, copper, or aluminum as its main component is preferably used. The conductor 540*a* and the conductor 540*b* may each have a stacked-layer structure.

In the case where the conductor 540 has a stacked-layer structure, a conductive material having a function of inhibiting passage of impurities such as water and hydrogen is preferably used for a first conductor provided in the vicinity of the insulator 574, the insulator 576, the insulator 581, the insulator 580, the insulator 544, and the insulator 571. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 576 can be inhibited from entering the oxide 530 through the conductor 540*a* and the conductor 540*b*.

For the insulator 541*a* and the insulator 541*b*, a barrier insulating film that can be used for the insulator 544 or the like may be used. For the insulator 541*a* and the insulator 541*b*, for example, an insulator such as silicon nitride, aluminum oxide, or silicon nitride oxide may be used. Since the insulator 541a and the insulator 541b are provided in contact with the insulator 574, the insulator 576, and the insulator 571, impurities such as water and hydrogen contained in the insulator 580 or the like can be inhibited from entering the oxide 530 through the conductor 540a and the conductor 540b. In particular, silicon nitride is suitable because of its high blocking property against hydrogen. Furthermore, oxygen contained in the insulator 580 can be prevented from being absorbed by the conductor 540a and the conductor 540b.

When the insulator 541a and the insulator 541b each have a stacked-layer structure as illustrated in FIG. 22A, a first insulator in contact with an inner wall of the opening in the insulator 580 and the like and a second insulator inside the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. Such a structure can inhibit oxidation of the conductor 540 and reduce entry of hydrogen into the conductor 540.

Although the first insulator of the insulator 541 and the second conductor of the insulator 541 are stacked in the transistor 500, the present invention is not limited thereto. For example, the insulator 541 may have a single-layer structure or a stacked-layer structure of three or more layers. Although the first conductor of the conductor 540 and the second conductor of the conductor 540 are stacked in the transistor 500, the present invention is not limited thereto. For example, the conductor 540 may have a single-layer structure or a stacked-layer structure of three or more layers.

As illustrated in FIG. 21, a conductor 610, a conductor 612, and the like serving as wirings may be provided in contact with an upper portion of the conductor 540a and an upper portion of the conductor 540b. For the conductor 610 and the conductor 612, a conductive material containing tungsten, copper, or aluminum as its main component is preferably used. The conductors can each have a stacked-layer structure. Specifically, the conductors may each be a stack of titanium or a titanium nitride and any of the above conductive materials, for example. Note that the conductors may each be formed to be embedded in an opening provided in an insulator.

The structure of the transistor included in the semiconductor device of one embodiment of the present invention is not limited to that of the transistor 500 illustrated in FIG. 21, FIG. 22A, FIG. 22B, and FIG. 23. The structure of the transistor included in the semiconductor device of one embodiment of the present invention may be changed in accordance with circumstances.

Figure 25:
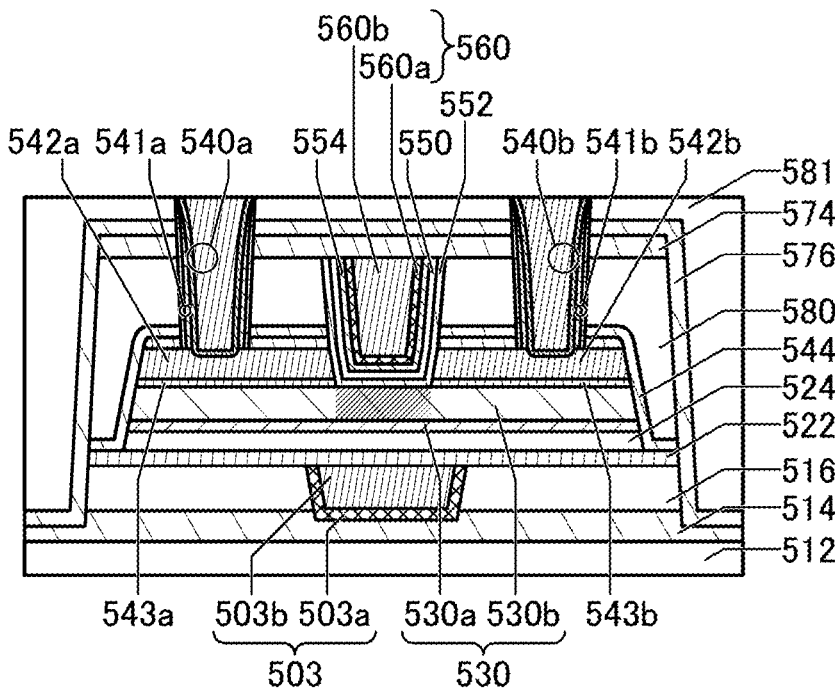
FIG. 25 is a schematic cross-sectional view illustrating a structure example of a transistor.

For example, the transistor 500 illustrated in FIG. 21, FIG. 22A, FIG. 22B, and FIG. 23 may have a structure illustrated in FIG. 25. The transistor in FIG. 25 is different from the transistor 500 illustrated in FIG. 21, FIG. 22A, FIG. 22B, and FIG. 23 in including an oxide 543a and an oxide 543b. Note that in this specification and the like, the oxide 543a and the oxide 543b are collectively referred to as an oxide 543. The cross section in the channel width direction of the transistor in FIG. 25 can have a structure similar to the cross section of the transistor 500 illustrated in FIG. 22B.

The oxide 543a is provided between the oxide 530b and the conductor 542a, and the oxide 543b is provided between the oxide 530b and the conductor 542b. Here, the oxide 543a is preferably in contact with the top surface of the oxide 530b and a bottom surface of the conductor 542a. The oxide 543b is preferably in contact with the top surface of the oxide 530b and the bottom surface of the conductor 542b.

The oxide 543 preferably has a function of inhibiting passage of oxygen. The oxide 543 having a function of inhibiting passage of oxygen is preferably provided between the oxide 530b and the conductor 542 functioning as the source electrode or the drain electrode, in which case the electric resistance between the conductor 542 and the oxide 530b can be reduced. Such a structure can improve the electrical characteristics, the field-effect mobility, and the reliability of the transistor 500 in some cases.

A metal oxide containing the element M may be used as the oxide 543. In particular, aluminum, gallium, yttrium, or tin is preferably used as the element M. The concentration of the element M in the oxide 543 is preferably higher than that in the oxide 530b. Furthermore, gallium oxide may be used as the oxide 543. A metal oxide such as an In-M-Zn oxide may be used as the oxide 543. Specifically, the atomic ratio of the element M to In in the metal oxide used as the oxide is preferably greater than the atomic ratio of the element M to In in the metal oxide used as the oxide 530b. The thickness of the oxide 543 is preferably greater than or equal to 0.5 nm or greater than or equal to 1 nm, and less than or equal to 2 nm, less than or equal to 3 nm, or less than or equal to 5 nm. Note that the above-described lower limits and upper limits can be combined with each other. The oxide 543 preferably has crystallinity. In the case where the oxide 543 has crystallinity, release of oxygen from the oxide 530 can be suitably inhibited. When the oxide 543 has a hexagonal crystal structure, for example, release of oxygen from the oxide 530 can sometimes be inhibited.

The insulator 582 is provided over the insulator 581, and the insulator 586 is provided over the insulator 582.

A substance having a barrier property against at least one of oxygen and hydrogen is preferably used for the insulator 582. Thus, a material similar to that for the insulator 514 can be used for the insulator 582. For the insulator 582, a metal oxide such as aluminum oxide, hafnium oxide, or tantalum oxide is preferably used, for example.

For the insulator 586, a material similar to that for the insulator 320 can be used. Furthermore, when a material with a relatively low permittivity is used for these insulators, parasitic capacitance generated between wirings can be reduced. A silicon oxide film, a silicon oxynitride film, or the like can be used for the insulator 586, for example.

Next, the capacitor 600 and peripheral wirings or plugs included in the semiconductor device illustrated in FIG. 21 and FIG. 23 are described. Note that the capacitor 600 and the wiring and/or the plug are provided above the transistor 500 illustrated in FIG. 21 and FIG. 23.

The capacitor 600 includes the conductor 610, a conductor 620, and an insulator 630, for example.

The conductor 610 is provided over one of the conductor 540a and the conductor 540b, a conductor 546, and the insulator 586. The conductor 610 has a function of one of a pair of electrodes of the capacitor 600.

The conductor 612 is provided over the other of the conductor 540a and the conductor 540b and the insulator 586. The conductor 612 has a function of a plug, a wiring, a terminal, or the like that electrically connects the transistor 500 to upper wirings, circuit components, and the like. Specifically, the conductor 612 can be the wiring WDL in the semiconductor device SDV1 described in Embodiment 3, for example.

Note that the conductor 612 and the conductor 610 may be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 21; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 630 is provided over the insulator 586 and the conductor 610. The insulator 630 functions as a dielectric sandwiched between the pair of electrodes of the capacitor 600.

As the insulator 630, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide can be used. The insulator 630 can be provided to have a stacked-layer structure or a single-layer structure using any of the above materials.

For another example, the insulator 630 may have a stacked-layer structure using a material with high dielectric strength, such as silicon oxynitride, and a high-permittivity (high-k) material. In the capacitor 600 having such a structure, a sufficient capacitance can be ensured owing to the high-permittivity (high-k) insulator, and the dielectric strength can be increased owing to the insulator with high dielectric strength; hence, the electrostatic breakdown of the capacitor 600 can be inhibited.

Examples of an insulator that is the high-permittivity (high-k) material (a material having a high dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Alternatively, for example, a single layer or stacked layers of an insulator containing a high-k material such as aluminum oxide, hafnium oxide, tantalum oxide, zirconium oxide, lead zirconate titanate (PZT), strontium titanate (SrTiO₃), or (Ba,Sr)TiO₃ (BST) may be used as the insulator 630. For the insulator 630, a compound containing hafnium and zirconium, for example, an oxide containing zirconium and hafnium, may be used. As miniaturization and high integration of semiconductor devices progress, a problem such as leakage current from a transistor and a capacitor might arise because of a thinner gate insulator and a thinner dielectric used in the capacitor. When a high-k material is used for an insulator functioning as the gate insulator and the dielectric used in the capacitor, a gate potential during the operation of the transistor can be lowered and the capacitance of the capacitor can be ensured while the physical thicknesses of the gate insulator and the dielectric are maintained.

Alternatively, a material having ferroelectricity may be used for the insulator 630. Examples of a material having ferroelectricity include a mixed crystal of hafnium oxide and zirconium oxide (also referred to as "HZO") and a material in which an element X (the element X is silicon (Si), aluminum (Al), gadolinium (Gd), yttrium (Y), lanthanum (La), strontium (Sr), or the like) is added to hafnium oxide. Alternatively, a piezoelectric ceramic having a perovskite structure may be used for the insulator 630. For example, lead zirconate titanate (PZT), strontium bismuth tantalate (SBT), bismuth ferrite (BFO), or barium titanate may be used.

The conductor 620 is provided to overlap with the conductor 610 with the insulator 630 therebetween. The conductor 610 has a function of one of the pair of electrodes of the capacitor 600. The conductor 620 can be the wiring WWLB in the semiconductor device SDV1 described in Embodiment 3, for example.

For the conductor 620, a conductive material such as a metal material, an alloy material, or a metal oxide material can be used. It is preferable to use a high-melting-point material containing at least one of tungsten, molybdenum, and the like which has both heat resistance and conductivity, and it is particularly preferable to use tungsten. In the case where the conductor 620 is formed concurrently with another component such as a conductor, at least one of Cu (copper), Al (aluminum), and the like, which are low-resistance metal materials, is used. For example, the conductor 620 can be formed using a material that can be used for the conductor 610. The conductor 620 may have a stacked-layer structure of two or more layers instead of a single-layer structure.

An insulator 640 is provided over the conductor 620 and the insulator 630. The insulator 640 is preferably formed using a film having a barrier property that prevents impurities such as hydrogen from diffusing into the region where the transistor 500 is provided, for example. Thus, a material similar to that for the insulator 324 can be used.

An insulator 650 is provided over the insulator 640. The insulator 650 can be provided using a material similar to that for the insulator 320. The insulator 650 may function as a planarization film that covers an uneven shape thereunder. Thus, the insulator 650 can be formed using any of the materials that can be used for the insulator 324, for example.

Although the capacitor 600 illustrated in FIG. 21 and FIG. 23 is a planar capacitor, the shape of the capacitor is not limited thereto. For example, the capacitor 600 may be a cylindrical capacitor instead of a planar capacitor.

A wiring layer may be provided above the capacitor 600. For example, in FIG. 21, an insulator 411, an insulator 412, an insulator 413, and an insulator 414 are provided in this order above the insulator 650. In addition, a conductor 416 serving as a plug or a wiring is provided in the insulator 411, the insulator 412, and the insulator 413. The conductor 416 can be provided, for example, in a region overlapping with a conductor 660 to be described later.

In addition, in the insulator 630, the insulator 640, and the insulator 650, an opening portion is provided in a region overlapping with the conductor 612, and the conductor 660 is provided to fill the opening portion. The conductor 660 serves as a plug or a wiring that is electrically connected to the conductor 416 included in the above-described wiring layer.

Like the insulator 324 or the like, the insulator 411 and the insulator 414 are each preferably formed using an insulator having a barrier property against impurities including at least one of water, hydrogen, and the like, for example.

Thus, the insulator 411 and the insulator 414 can be formed using any of the materials that can be used for the insulator 324 or the like, for example.

Like the insulator 326, the insulator 412 and the insulator 413 are each preferably formed using, for example, an insulator having a relatively low dielectric constant to reduce the parasitic capacitance generated between wirings.

The conductor 612 and the conductor 416 can be provided using materials similar to those for the conductor 328 and the conductor 330, for example.

When a semiconductor device using a transistor including an oxide semiconductor has the structure described in this embodiment, a change in electrical characteristics of the transistor can be inhibited and the reliability can be improved. Alternatively, a semiconductor device using a transistor including an oxide semiconductor can be miniaturized or highly integrated.

Note that this embodiment can be combined with any of the other embodiments in this specification as appropriate.

Embodiment 7

Described in this embodiment is a metal oxide (hereinafter also referred to as an oxide semiconductor) that can be used in an OS transistor described in the above embodiment.

The metal oxide preferably contains at least indium or zinc. In particular, indium and zinc are preferably contained. In addition to them, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of crystal structures of an oxide semiconductor is described with reference to A. FIG. 26A is a diagram showing classification of crystal structures of an oxide semiconductor, typically IGZO (a metal oxide containing In, Ga, and Zn).

As shown in FIG. 26A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite). Note that the term "Crystalline" excludes single crystal, poly crystal, and completely amorphous (excluding single crystal and poly crystal). The term "Crystal" includes single crystal and poly crystal.

Note that the structures in the thick frame in FIG. 26A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 26B shows an XRD spectrum, which is obtained using GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 26B and obtained by GIXD measurement is hereinafter simply referred to as an XRD spectrum. The CAAC-IGZO film in FIG. 26B has a composition in the vicinity of In:Ga:Zn=4:2:3 [atomic ratio]. The CAAC-IGZO film in FIG. 26B has a thickness of 500 nm.

As shown in FIG. 26B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 26B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction method (NBED) (such a pattern is also referred to as a nanobeam electron diffraction pattern). FIG. 26C shows a diffraction pattern of a CAAC-IGZO film. FIG. 26C shows a diffraction pattern obtained with the NBED method in which an electron beam is incident in the direction parallel to the substrate. The CAAC-IGZO film in FIG. 26C has a composition in the vicinity of In:Ga:Zn=4:2:3 [atomic ratio]. In the nanobeam electron diffraction method, electron diffraction is performed with a probe diameter of 1 nm.

As shown in FIG. 26C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 26A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region with a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which layers containing indium (In) and oxygen (hereinafter In layers) and layers containing the element M, zinc (Zn), and oxygen (hereinafter (M,Zn) layers) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable.

Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for an OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has a higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. As another example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current (Ion), high field-effect mobility (1), and an excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When at least one of silicon and carbon, which are Group 14 elements, is contained in the oxide semiconductor, defect states are formed in the oxide semiconductor. Thus, the concentration of at least one of silicon and carbon in the oxide semiconductor and the concentration of at least one of silicon and carbon in the vicinity of an interface with the oxide semiconductor (the concentration obtained by secondary ion mass spectrometry (SIMS)) are each set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is set lower than or equal to $1 \times 10^{18}$ atoms/cm$^3$, preferably lower than or equal to $2 \times 10^{16}$ atoms/cm$^3$.

When the oxide semiconductor contains nitrogen, the oxide semiconductor easily becomes n-type because of generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be combined with any of the other embodiments in this specification as appropriate.

Embodiment 8

In this embodiment, examples of a semiconductor wafer where the semiconductor device or the like described in the above embodiment is formed and electronic components incorporating the semiconductor device are described.
<Semiconductor Wafer>

First, an example of a semiconductor wafer where a semiconductor device or the like is formed is described with reference to FIG. 27A.

A semiconductor wafer 4800 illustrated in FIG. 27A includes a wafer 4801 and a plurality of circuit portions 4802 provided on a top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on a surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated with dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

With the dicing step, a chip 4800a as illustrated in FIG. 27B can be cut out from the semiconductor wafer 4800. The chip 4800a includes a wafer 4801a, the circuit portion 4802, and a spacing 4803a. Note that it is preferable to make the spacing 4803a as small as possible. In this case, the width of the spacing 4803 between adjacent circuit portions 4802 is substantially the same as a cutting allowance of the scribe line SCL1 or a cutting allowance of the scribe line SCL2.

Note that the shape of an element substrate of one embodiment of the present invention is not limited to the shape of the semiconductor wafer 4800 illustrated in FIG. 27A. The element substrate may be a rectangular semiconductor wafer, for example. The shape of the element substrate can be changed as appropriate, depending on a manufacturing process of an element and an apparatus for manufacturing the element.
<Electronic Component>

FIG. 27C is a perspective view of an electronic component 4700 and a substrate (a mounting board 4704) on which the electronic component 4700 is mounted. The electronic component 4700 illustrated in FIG. 27C includes the chip 4800a in a mold 4711. Note that the chip 4800a may have a structure in which the circuit portions 4802 are stacked as illustrated in FIG. 27C. To illustrate the inside of the electronic component 4700, some portions are omitted in FIG. 27C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, whereby the mounting board 4704 is completed.

FIG. 27D is a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor device 4710 include the semiconductor device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings have a single-layer structure or a layered structure. Moreover, the interposer 4731 has a function of electrically connecting an integrated circuit provided on the interposer 4731 to an electrode provided on the package substrate 4732. Accordingly, the interposer is sometimes referred to as a redistribution substrate or an intermediate substrate. A through electrode is provided in the interposer 4731 and used to electrically connect an integrated circuit and the package substrate 4732 in some cases. In the case of using a silicon interposer, a TSV (Through Silicon Via) can also be used as the through electrode.

A silicon interposer is preferably used as the interposer 4731. The silicon interposer can be manufactured at lower cost than an integrated circuit because it is not necessary to provide an active element. Meanwhile, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In a SiP, an MCM, or the like using a silicon interposer, a decrease in reliability due to a difference in expansion coefficient between an integrated circuit and the interposer is less likely to occur. Furthermore, a surface of a silicon interposer has high planarity; hence, a poor connection between the silicon interposer and an integrated circuit provided thereon is less likely to occur. It is particularly preferable to use a silicon interposer for a 2.5D package (2.5D mounting) in which a plurality of integrated circuits are arranged side by side on the interposer.

A heat sink (a radiator plate) may be provided to overlap the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on a bottom portion of the package substrate 4732. FIG. 27D illustrates an example in which the electrode 4733 is formed of a solder ball. The solder balls are provided in a matrix on the bottom portion of the package substrate 4732, whereby BGA (Ball Grid Array) mounting can be achieved. Alternatively, the electrode 4733 may be formed of a conductive pin. When the conductive pins are provided in a matrix on the bottom portion of the package substrate 4732, PGA (Pin Grid Array) mounting can be achieved.

The electronic component 4730 can be mounted on another substrate by any of various mounting methods other than BGA and PGA. For example, a mounting method such as an SPGA (Staggered Pin Grid Array), an LGA (Land Grid Array), a QFP (Quad Flat Package), a QFJ (Quad Flat J-leaded package), or a QFN (Quad Flat Non-leaded package) can be employed.

Note that this embodiment can be combined with any of the other embodiments in this specification as appropriate.

Embodiment 9

Figure 28:
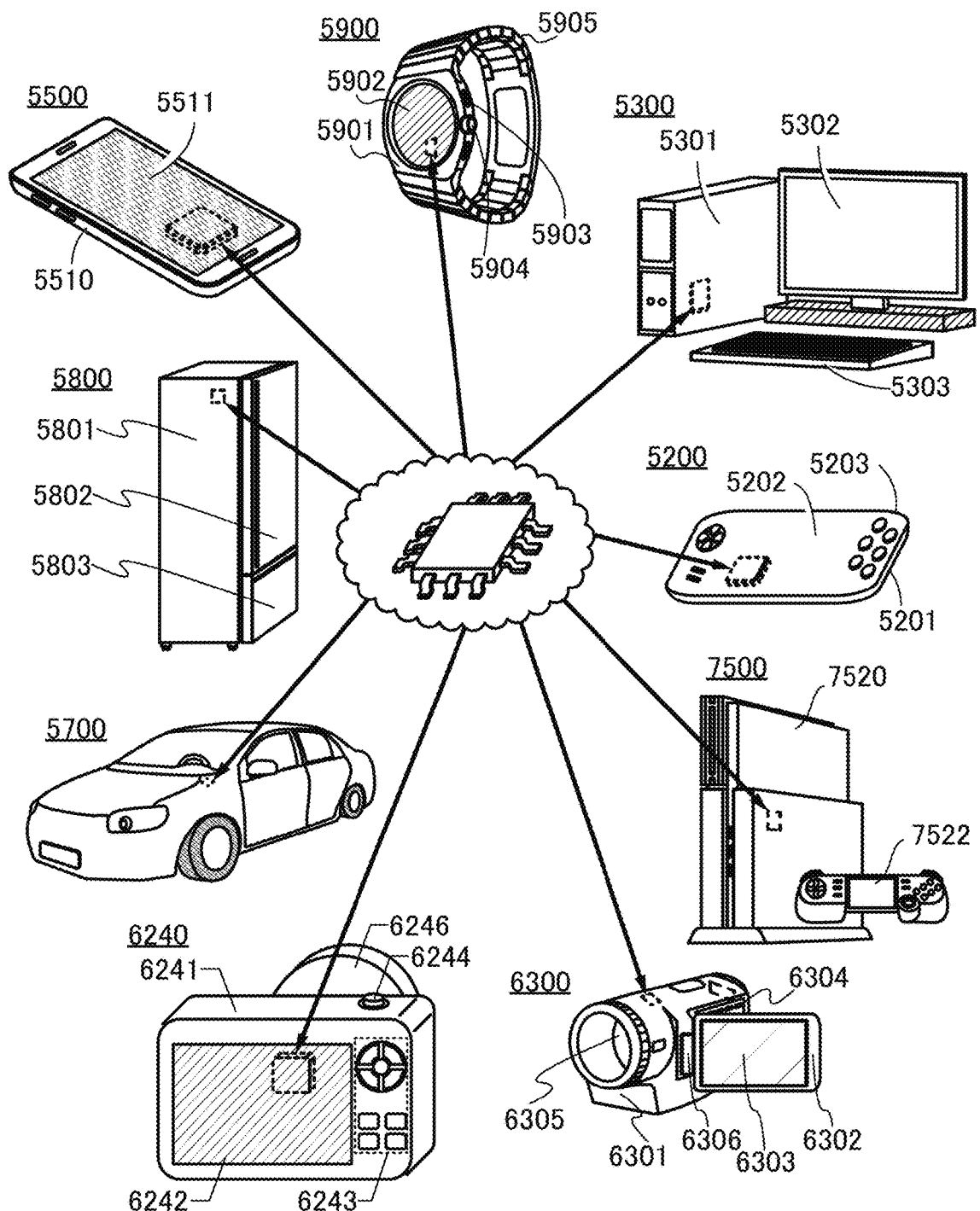
FIG. 28 is a perspective view illustrating examples of electronic devices.

In this embodiment, examples of electronic devices each including the semiconductor device described in the above embodiment are described. FIG. 28 illustrates electronic devices each including the electronic component 4700 including the semiconductor device.

[Mobile Phone]

An information terminal 5500 illustrated in FIG. 28 is a mobile phone (a smartphone), which is a type of portable information terminal. The information terminal 5500 includes a housing 5510 and a display portion 5511, and as input interfaces, a touch panel is provided in the display portion 5511 and a button is provided in the housing 5510.

The information terminal 5500 can execute an application utilizing artificial intelligence with the use of the semiconductor device described in the above embodiment. Examples of the application utilizing artificial intelligence include an application for interpreting a conversation and displaying its content on the display portion 5511; an application for recognizing letters, diagrams, and the like input to the touch panel of the display portion 5511 by a user and displaying them on the display portion 5511; and an application for biometric authentication using at least one of fingerprints, voice prints, and the like.

[Wearable Terminal]

FIG. 28 illustrates a watch-type information terminal 5900 as an example of a wearable terminal. The information terminal 5900 includes a housing 5901, a display portion 5902, an operation button 5903, an operator 5904, a band 5905, and the like.

The wearable terminal can execute an application utilizing artificial intelligence with the use of the semiconductor device described in the above embodiment, like the information terminal 5500. Examples of the application utilizing artificial intelligence include an application for managing the health condition of the user of the wearable terminal and a navigation system that selects the optimal route and navigates the user in accordance with the input of the destination.

[Information Terminal]

FIG. 28 illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the semiconductor device described in the above embodiment, like the information terminal 5500 described above. Examples of the application utilizing artificial intelligence include design-support software, text correction software, and software for automatic menu generation. Furthermore, with the use of the desktop information terminal 5300, novel artificial intelligence can be developed.

Note that although FIG. 28 illustrates the smartphone, the desktop information terminal, and the wearable terminal as examples of electronic devices, one embodiment of the present invention can also be applied to information terminals other than smartphones, desktop information terminals, and wearable terminals. Examples of information terminals other than smartphones, desktop information terminals, and wearable terminals include a PDA (Personal Digital Assistant), a laptop information terminal, and a workstation.

[Household Appliance]

FIG. 28 illustrates an electric refrigerator-freezer 5800 as an example of a household appliance. The electric refrigerator-freezer 5800 includes a housing 5801, a refrigerator door 5802, a freezer door 5803, and the like.

When the semiconductor device described in the above embodiment is used in the electric refrigerator-freezer 5800, the electric refrigerator-freezer 5800 including artificial intelligence can be achieved. Utilizing the artificial intelligence enables the electric refrigerator-freezer 5800 to have at least one of a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described as a household appliance in this example, other examples of the household appliance include a vacuum cleaner, a microwave oven, an electric oven, a rice cooker, a water heater, an IH (Induction Heating) cooker, a water server, a heating-cooling combination appliance such as an air conditioner, a washing machine, a drying machine, and an audio visual appliance.

[Game Machines]

FIG. 28 illustrates a portable game machine 5200 as an example of a game machine. The portable game machine 5200 includes a housing 5201, a display portion 5202, a button 5203, and the like.

FIG. 28 illustrates a stationary game machine 7500 as another example of a game machine. The stationary game machine 7500 includes a main body 7520 and a controller 7522. The controller 7522 can be connected to the main body 7520 with or without a wire. Although not illustrated in FIG. 28, the controller 7522 can include a display portion that displays a game image, and at least one input interface besides a button, such as a touch panel, a stick, a rotating knob, or a sliding knob, for example. The shape of the controller 7522 is not limited to that illustrated in FIG. 28, and the shape of the controller 7522 may be changed variously in accordance with the genres of games. For example, in a shooting game such as an FPS (First Person Shooter) game, a gun-shaped controller having a trigger button can be used. As another example, in a music game or the like, a controller having a shape of a music instrument, audio equipment, or the like can be used. Furthermore, the stationary game machine may include a camera, a depth sensor, a microphone, and the like so that the game player can play a game using a gesture and/or a voice instead of a controller.

Videos displayed on the game machine can be output with a display device such as a television device, a personal computer display, a game display, and a head-mounted display.

When the semiconductor device described in the above embodiment is used in the portable game machine 5200, the portable game machine 5200 with low power consumption can be achieved. Furthermore, heat generation from a circuit can be reduced owing to low power consumption; thus, the influence of heat generation on the circuit itself, the peripheral circuit, and the module can be reduced.

Furthermore, when the semiconductor device described in the above embodiment is used in the portable game machine 5200, the portable game machine 5200 including artificial intelligence can be achieved.

In general, the progress of a game, the actions and words of game characters, and expressions of a phenomenon and the like in the game are programed in the game; however, the use of artificial intelligence in the portable game machine 5200 enables expressions not limited by the game program. For example, it becomes possible to change expressions such as questions posed by the player, the progress of the game, time, and actions and words of game characters.

When a game requiring a plurality of players is played on the portable game machine 5200, the artificial intelligence can create a virtual game player; thus, the game can be played alone with the game player created by the artificial intelligence as an opponent.

Although FIG. 28 illustrates the portable game machine as an example of a game machine, the electronic device of one embodiment of the present invention is not limited thereto. Examples of the electronic device of one embodiment of the present invention include a home stationary game machine, an arcade game machine installed in entertainment facilities (e.g., a game center and an amusement park), and a throwing machine for batting practice installed in sports facilities.

[Moving Vehicle]

The semiconductor device described in the above embodiment can be used in an automobile, which is a moving vehicle, and around the driver's seat in an automobile.

FIG. 28 illustrates an automobile 5700 as an example of a moving vehicle.

An instrument panel that can display at least one of a speedometer, a tachometer, a mileage, a fuel meter, a gearshift state, air-conditioning setting, and the like is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an image capturing device (not illustrated) provided for the automobile 5700, thereby providing a high level of safety. That is, displaying an image taken by the image capturing device provided on the exterior of the automobile 5700 can compensate for blind areas and enhance safety.

Since the semiconductor device described in the above embodiment can be used as the components of artificial intelligence, the semiconductor device can be used for an automatic driving system of the automobile 5700, for example. The semiconductor device can also be used for a system for navigation, risk prediction, or the like. The display device may display navigation information, risk prediction information, or the like.

Note that although an automobile is described above as an example of the moving vehicle, the moving vehicle is not limited to an automobile. Other examples of the moving vehicle include a train, a monorail train, a ship, and a flying object (a helicopter, an unmanned aircraft (a drone), an airplane, and a rocket), and these moving vehicles can include a system utilizing artificial intelligence when equipped with the semiconductor device of one embodiment of the present invention.

[Camera]

The semiconductor device described in the above embodiment can be used in a camera.

FIG. 28 illustrates a digital camera 6240 as an example of an image capturing device. The digital camera 6240 includes a housing 6241, a display portion 6242, operation buttons 6243, a shutter button 6244, and the like, and a detachable lens 6246 is attached to the digital camera 6240. Here, the lens 6246 of the digital camera 6240 is detachable from the housing 6241 for replacement; alternatively, the lens 6246 may be incorporated into the housing 6241. Moreover, the digital camera 6240 can be additionally equipped with at least one of a stroboscope, a viewfinder, and the like.

When the semiconductor device described in the above embodiment is used in the digital camera 6240, the digital camera 6240 with low power consumption can be achieved. Furthermore, heat generation from a circuit can be reduced owing to low power consumption; thus, the influence of heat generation on the circuit itself, the peripheral circuit, and the module can be reduced.

Furthermore, when the semiconductor device described in the above embodiment is used in the digital camera 6240, the digital camera 6240 including artificial intelligence can be achieved. Utilizing the artificial intelligence enables the digital camera 6240 to have a function of automatically recognizing a subject such as a face or an object, adjustment of a focus on the subject, a function of automatically using a flash in accordance with environments, a function of toning a taken image, and the like.

[Video Camera]

The semiconductor device described in the above embodiment can be used in a video camera.

FIG. 28 illustrates a video camera 6300 as an example of an image capturing device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Videos displayed on the display portion 6303 may be switched in accordance with the angle at the joint 6306 between the first housing 6301 and the second housing 6302.

When a video taken by the video camera 6300 is recorded, the video needs to be encoded based on a data recording format. With the use of artificial intelligence, the video camera 6300 can perform the pattern recognition by artificial intelligence during encoding. By the pattern recognition, difference data on a person, an animal, an object, and the like included in continuously taken image data is calculated, so that the data can be compressed.

[Expansion Device for PC]

The semiconductor device described in the above embodiment can be used in a calculator such as a PC (Personal Computer) and an expansion device for an information terminal.

Figure 29A:
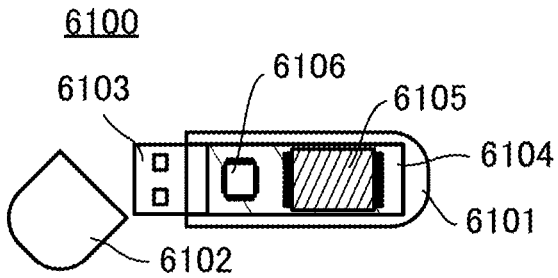
FIG. 29A to FIG. 29C are perspective views illustrating examples of electronic devices.

FIG. 29A illustrates, as an example of the expansion device, a portable expansion device 6100 that includes a chip capable of arithmetic processing and is externally attached to a PC. The expansion device 6100 can perform arithmetic processing using the chip when connected to a PC with a USB (Universal Serial Bus), for example. FIG. 29A illustrates the portable expansion device 6100; however, the expansion device of one embodiment of the present invention is not limited thereto and may be a relatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device or the like described in the above embodiment. For example, a chip 6105 (e.g., the semiconductor device described in the above embodiment, the electronic component 4700, or a memory chip) and a controller chip 6106 are attached to the substrate 6104. The USB connector 6103 functions as an interface for connection to an external device.

The use of the expansion device 6100 for a PC and the like can increase the arithmetic processing capability of the PC. Thus, a PC with insufficient processing capability can perform an arithmetic operation of artificial intelligence, moving image processing, and the like.

[Broadcasting System]

The semiconductor device described in the above embodiment can be used for a broadcasting system.

Figure 29B:
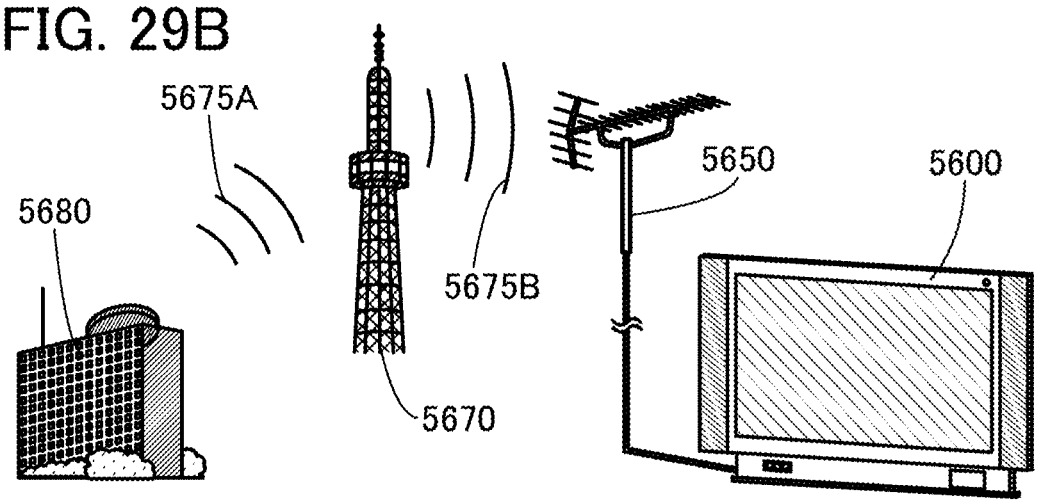

FIG. 29B schematically illustrates data transmission in a broadcasting system. Specifically, FIG. 29B illustrates a path in which a radio wave (a broadcasting signal) transmitted from a broadcast station 5680 reaches a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 29B, a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 29B and may be satellite broadcasting using an artificial satellite, data broadcasting using an optical line, or the like.

The above-described broadcasting system may be a broadcasting system that utilizes artificial intelligence by including the semiconductor device described in the above embodiment. When the broadcast data is transmitted from the broadcast station 5680 to the TV 5600 of each household, the broadcast data is compressed with an encoder. When the antenna 5650 receives the compressed broadcast data, the compressed broadcast data is decompressed with a decoder of the receiving device in the TV 5600. Utilizing the artificial intelligence enables, for example, recognition of a display pattern included in a displayed image in motion compensation prediction, which is one of the compressing methods for the encoder. In-frame prediction utilizing artificial intelligence, for example, can also be performed. For another example, when the broadcast data with low resolution is received and the broadcast data is displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As the application of artificial intelligence in the TV 5600, a recording device with artificial intelligence may be provided in the TV 5600, for example. With such a structure, the artificial intelligence can learn the user's preference, so that TV programs that suit the user's preference can be recorded automatically in the recording device.

[Authentication System]

The semiconductor device described in the above embodiment can be used for an authentication system.

Figure 29C:
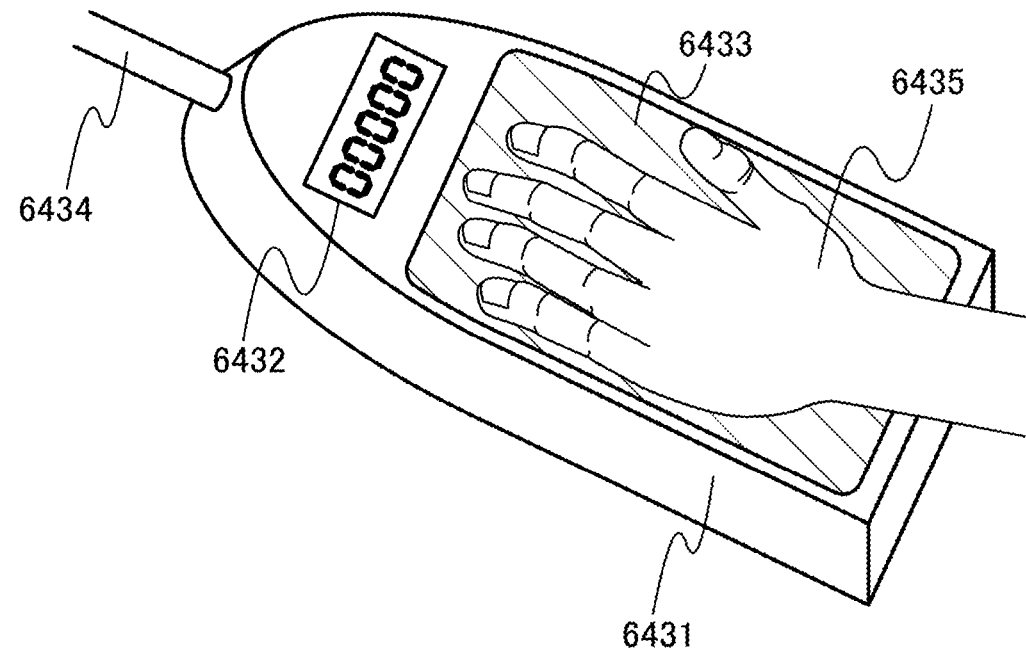

FIG. 29C illustrates a palm print authentication device including a housing 6431, a display portion 6432, a palm print reading portion 6433, and a wiring 6434.

FIG. 29C illustrates a situation in which the palm print authentication device obtains a palm print of a hand 6435. The obtained palm print is subjected to the pattern recognition utilizing artificial intelligence, so that personal authentication of the palm print can be performed. Thus, a system that performs highly secure authentication can be constructed. Without limitation to the palm print authentication device, the authentication system of one embodiment of the present invention may be a device that performs biometric authentication by obtaining biological information of fingerprints, veins, faces, iris, voice prints, genes, physiques, or the like.

Note that this embodiment can be combined with any of the other embodiments in this specification as appropriate.

(Notes on Description of this Specification and the Like)

The description of the above embodiments and each structure in the embodiments are noted below.

One embodiment of the present invention can be constituted by combining, as appropriate, the structure described in each embodiment with the structures described in the other embodiments and Example. In addition, in the case where a plurality of structure examples are described in one embodiment, the structure examples can be combined as appropriate.

Note that content (or part of the content) described in one embodiment can be applied to, combined with, or replaced with another content (or part of the content) described in the embodiment and/or content (or part of the content) described in another embodiment or other embodiments.

Note that in each embodiment, a content described in the embodiment is a content described with reference to a variety of drawings or a content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there is such a case where one circuit is associated with a plurality of functions or a case where a plurality of circuits are associated with one function. Therefore, blocks in the block diagrams are not limited by the components described in this specification, and the description can be changed appropriately depending on the situation.

In drawings, the size, the layer thickness, or the region is shown arbitrarily for description convenience. Therefore, they are not limited to the illustrated scale. Note that the drawings are schematically shown for clarity, and embodiments of the present invention are not limited to shapes, values, or the like shown in the drawings. For example, variation in signal, voltage, or current due to noise or variation in signal, voltage, or current due to difference in timing can be included.

Furthermore, the positional relationship between components illustrated in the drawings and the like is relative. Therefore, when the components are described with reference to drawings, terms for describing the positional relationship, such as "over" and "under", are sometimes used for convenience. The positional relationship of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) are used in the description of the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the terms "electrode" and "wiring" do not functionally limit these components. For example, an "electrode" is used as part of a wiring in some cases, and vice versa. Furthermore, the term "electrode" or "wiring" also includes the case where a plurality of "electrodes" or "wirings" are formed in an integrated manner, for example.

In this specification and the like, voltage and potential can be replaced with each other as appropriate. The voltage refers to a potential difference from a reference potential, and when the reference potential is a ground voltage, for example, the voltage can be rephrased into the potential. The ground potential does not necessarily mean 0 V. Note that potentials are relative, and the potential supplied to a wiring or the like is changed depending on the reference potential, in some cases.

In this specification and the like, a node can be referred to as a terminal, a wiring, an electrode, a conductive layer, a conductor, an impurity region, and the like depending on the circuit structure, the device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electrical signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electrical signal transmission between A and B through a wiring (or an electrode) or the like, not through the above object. In other words, direct connection refers to connection that can be regarded as the same circuit diagram when indicated as an equivalent circuit.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

Note that in this specification and the like, the terms "film", "layer", and the like can be interchanged with each other depending on the case or according to circumstances. For example, the term "conductive layer" can be changed into the term "conductive film" in some cases. As another example, the term "insulating film" can be changed into the term "insulating layer" in some cases.

REFERENCE NUMERALS

A1: input data, A2: input data, C1: capacitor, C11: capacitor, CK1: node, D1: node, GCLK1: clock signal, LBL_N: wiring, LBL_1: wiring, LBL_4: wiring, LBL_6: wiring, M1: transistor, M2: transistor, M3: transistor, M4: transistor, M5: transistor, M6: transistor, M7: transistor, M8: transistor, M9: transistor, M10: transistor, M11: transistor, M12: transistor, M13: transistor, MAC1: output data, MAC2: output data, MC1: circuit, MC2: circuit, MCL1: layer, MCL2: layer, Q1: node, RWL_M: read word line, RWL_1: read word line, SCL1: scribe line, SCL2: scribe line, SDV1: semiconductor device, SDV2: semiconductor device, SLEEP1: signal, SN11: node, T_1: time, T2: time, T6: time, T7: time, W1: data, W2: data, WBL_1: write bit line, WBL_N: write bit line, WWL_M: write word line, WWL_1: write word line, 10: semiconductor device, 10_$n$: semiconductor device, 10_1: semiconductor device, 11: layer, 12: layer, 20: memory circuit portion, 20_N: memory circuit portion, 20_1: memory circuit portion, 20_4: memory circuit portion, 20_6: memory circuit portion, 21: memory circuit, 21_N: memory circuit, 21_P: memory circuit, 21A: memory circuit, 21B: memory circuit, 21C: memory circuit, 22: transistor, 23: semiconductor layer, 24: multiplier circuit, 25: adder circuit, 26: register, 30: arithmetic circuit, N: arithmetic circuit, 30_1: arithmetic circuit, 30_4: arithmetic circuit, 30_6: arithmetic circuit, 40: switching circuit, 40_1: switching circuit, 40_4: switching circuit, 40_6: switching circuit, 50: driver circuit, 60: memory circuit, 61: transistor, 61_N: transistor, 61_P: transistor, 61A: transistor, 61B: transistor, 62: transistor, 62_N: transistor, 62_P: transistor, 62B: transistor, 63: transistor, 63_N: transistor, 63_P: transistor, 64: capacitor, 64_N: capacitor, 64_P: capacitor, 64A: capacitor, 64B: capacitor, 71: controller, 71G: controller, 72:

row decoder, 73: word line driver, 74: column decoder, 75: driver, 76: precharge circuit, 81: input/output buffer, 82: arithmetic control circuit, 90A: input layer, 90B: intermediate layer, 90C: output layer, 91: input process, 92: arithmetic process, 93: arithmetic process, 94: pooling operation process, 95: arithmetic process, 96: pooling operation process, 97: fully connected operation process, 100: semiconductor device, 101: digital calculator, 102: analog calculator, 103: oxide semiconductor memory, 104: oxide semiconductor memory, 105: oxide semiconductor calculator, 106: oxide semiconductor memory, 107: silicon circuit, 110: CPU, 120: bus, 193: PMU, 200: CPU core, 202: cache memory device, 203: cache memory device, 205: bus interface portion, 210: power switch, 211: power switch, 212: power switch, 214: level shifter, 220: flip-flop, 221: scan flip-flop, 221A: clock buffer circuit, 222: backup circuit, 300: transistor, 310: substrate, 310A: substrate, 312: element isolation layer, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 411: insulator, 412: insulator, 413: insulator, 414: insulator, 416: conductor, 500: transistor, 503: conductor, 503a: conductor, 503b: conductor, 510: insulator, 512: insulator, 514: insulator, 516: insulator, 518: conductor, 522: insulator, 524: insulator, 530: oxide, 530a: oxide, 530b: oxide, 530ba: region, 530bb: region, 530bc: region, 540: conductor, 540a: conductor, 540b: conductor, 541: insulator, 541a: insulator, 541b: insulator, 542: conductor, 542a: conductor, 542b: conductor, 543: oxide, 543a: oxide, 543b: oxide, 544: insulator, 546: conductor, 550: insulator, 550a: insulator, 550b: insulator, 552: insulator, 554: insulator, 560: conductor, 560a: conductor, 560b: conductor, 571: insulator, 571a: insulator, 571b: insulator, 574: insulator, 576: insulator, 580: insulator, 581: insulator, 582: insulator, 586: insulator, 600: capacitor, 610: conductor, 612: conductor, 620: conductor, 630: insulator, 640: insulator, 650: insulator, 660: conductor, 4700: electronic component, 4702: printed circuit board, 4704: mounting board, 4710: semiconductor device, 4711: mold, 4712: land, 4713: electrode pad, 4714: wire, 4730: electronic component, 4731: interposer, 4732: package substrate, 4733: electrode, 4735: semiconductor device, 4800: semiconductor wafer, 4800a: chip, 4801: wafer, 4801a: wafer, 4802: circuit portion, 4803: spacing, 4803a: spacing, 5200: portable game machine, 5201: housing, 5202: display portion, 5203: button, 5300: desktop information terminal, 5301: main body, 5302: display, 5303: keyboard, 5500: information terminal, 5510: housing, 5511: display portion, 5600: TV, 5650: antenna, 5670: radio wave tower, 5675A: radio wave, 5675B: radio wave, 5680: broadcast station, 5700: automobile, 5800: electric refrigerator-freezer, 5801: housing, 5802: refrigerator door, 5803: freezer door, 5900: information terminal, 5901: housing, 5902: display portion, 5903: operation button, 5904: operator, 5905: band, 6100: expansion device, 6101: housing, 6102: cap, 6103: USB connector, 6104: substrate, 6105: chip, 6106: controller chip, 6240: digital camera, 6241: housing, 6242: display portion, 6243: operation button, 6244: shutter button, 6246: lens, 6300: video camera, 6301: housing, 6302: housing, 6303: display portion, 6304: operation key, 6305: lens, 6306: joint, 6431: housing, 6432: display portion, 6433: palm print reading portion, 6434: wiring, 6435: hand, 7500: stationary game machine, 7520: main body, 7522: controller

The invention claimed is:

1. A semiconductor device comprising a digital calculator, an analog calculator, a first memory circuit, and a second memory circuit, wherein the analog calculator, the first memory circuit, and the second memory circuit each comprise a transistor comprising an oxide semiconductor in a channel formation region, wherein the first memory circuit is configured to supply first weight data as digital data to the digital calculator, wherein the digital calculator is configured to perform product-sum operation using the first weight data, wherein the second memory circuit is configured to supply second weight data as analog data to the analog calculator, wherein the analog calculator is configured to perform product-sum operation using the second weight data, and wherein an amount of current flowing between a source and a drain of at least one of the transistors each comprising the oxide semiconductor in the channel formation region in the analog calculator and the second memory circuit is an amount of current flowing when the transistor operates in a subthreshold region.

2. The semiconductor device according to claim 1, wherein the digital calculator is brought into a non-operation state during operation of the analog calculator, and wherein the analog calculator is brought into a non-operation state during operation of the digital calculator.

3. The semiconductor device according to claim 1, wherein the digital calculator performs convolutional operation.

4. The semiconductor device according to claim 1, wherein the analog calculator performs fully connected operation.

5. The semiconductor device according to claim 1, wherein the digital calculator comprises a transistor containing silicon in a channel formation region.

6. The semiconductor device according to claim 5, wherein the digital calculator is provided in a first layer, wherein the analog calculator, the first memory circuit, and the second memory circuit are provided in a second layer, and wherein the second layer is provided over the first layer.

7. The semiconductor device according to claim 6, wherein the first memory circuit is provided to overlap with the digital calculator.

* * * * *